United States Patent [19]
Matsubara et al.

[11] Patent Number: 6,130,836
[45] Date of Patent: *Oct. 10, 2000

[54] SEMICONDUCTOR IC DEVICE HAVING A CONTROL REGISTER FOR DESIGNATING MEMORY BLOCKS FOR ERASURE

[75] Inventors: Kiyoshi Matsubara, Higashimurayama; Naoki Yashiki, Kodaira; Shiro Baba; Takashi Ito, both of Kokubunji; Hirofumi Mukai, Musashino; Masanao Sato, Tokyo; Masaaki Terasawa, Akishima; Kenichi Kuroda, Tachikawa; Kazuyoshi Shiba, Kodaira, all of Japan

[73] Assignees: Hitachi, Ltd.; Hitachi VSLI Engineering Corp., both of Tokyo, Japan

[*] Notice: This patent is subject to a terminal disclaimer.

[21] Appl. No.: 09/414,170

[22] Filed: Oct. 8, 1999

Related U.S. Application Data

[63] Continuation of application No. 08/788,198, Jan. 24, 1997, Pat. No. 6,026,020, which is a continuation of application No. 08/473,114, Jun. 7, 1995, Pat. No. 5,768,194, which is a continuation of application No. 08/031,877, Mar. 16, 1993, abandoned.

[30] Foreign Application Priority Data

| Mar. 17, 1992 | [JP] | Japan | 4-091919 |
| Mar. 19, 1992 | [JP] | Japan | 4-093908 |

[51] Int. Cl.$^7$ .................................................. G11C 16/04
[52] U.S. Cl. ......................... 365/185.03; 365/185.18; 365/185.33
[58] Field of Search ..................... 365/185.03, 185.18, 365/185.33, 185.01

[56] References Cited

U.S. PATENT DOCUMENTS

| 4,402,065 | 8/1983 | Taylor | 365/189 |
| 4,698,750 | 10/1987 | Wilkie et al. | 365/218 |
| 4,701,886 | 10/1987 | Sakakibara | 371/21.1 |
| 4,783,764 | 11/1988 | Tsuchiya et al. | 365/174 |
| 4,785,425 | 11/1988 | Lavelle | 365/52 |

(List continued on next page.)

FOREIGN PATENT DOCUMENTS

| 0183232 | 6/1986 | European Pat. Off. |
| 0214451 | 3/1987 | European Pat. Off. |
| 0373672 | 6/1990 | European Pat. Off. |

(List continued on next page.)

OTHER PUBLICATIONS

EDN Electrical Design News, vol. 28, No. 21, Oct. 13, 1983, pp. 177–188.

(List continued on next page.)

*Primary Examiner*—David Nelms
*Assistant Examiner*—Hoai V. Ho
*Attorney, Agent, or Firm*—Antonelli, Terry, Stout & Kraus, LLP

[57] ABSTRACT

A semiconductor integrated circuit device having a processing unit and a memory which stores data to be processed by the processing unit and which provides data to the processing unit through the data bus in response to accessing instructions from the processing unit through the address bus. The memory has a plurality of memory blocks each of which has a plurality of electrically programmable nonvolatile memory cells arranged in rows and columns in which each nonvolatile memory cell is coupled to one of a plurality of word lines and one of a plurality of data lines of the memory. The memory blocks formed can be facilitated with different memory capacities, including through controlling the number of rows or columns of memory cells associated therewith. Sources of all of the memory cells within each memory block are connected to a single source line which is fed by a predetermined voltage from a corresponding one of plural source voltage control circuits, for flash erasing the memory cells in that memory block in an erasing operation. The device also features a control register which, under the control of the processing unit, designates one or more of the memory blocks to be simultaneously erased.

14 Claims, 64 Drawing Sheets

U.S. PATENT DOCUMENTS

| | | | |
|---|---|---|---|
| 4,794,588 | 12/1988 | Thompson | 364/900 |
| 4,796,235 | 1/1989 | Sparks et al. | 365/228 |
| 4,807,114 | 2/1989 | Itoh | 364/200 |
| 4,887,234 | 12/1989 | Iijima | 364/900 |
| 4,953,129 | 8/1990 | Kobayashi et al. | 365/203 |
| 4,974,208 | 11/1990 | Nakamura et al. | 365/189.01 |
| 4,975,878 | 12/1990 | Boddu et al. | 365/195 |
| 5,065,364 | 11/1991 | Atwood et al. | 365/218 |
| 5,070,473 | 12/1991 | Takano et al. | 395/725 |
| 5,088,023 | 2/1992 | Nakamura et al. | 395/430 |
| 5,097,445 | 3/1992 | Yamauchi | 365/195 |
| 5,109,359 | 4/1992 | Sakakibara et al. | 365/189.07 |
| 5,175,840 | 12/1992 | Sawase et al. | 395/425 |
| 5,185,718 | 2/1993 | Rinerson et al. | 365/185 |
| 5,199,001 | 3/1993 | Tzeng | 365/185.33 |
| 5,200,600 | 4/1993 | Shinagawa | 235/492 |
| 5,222,046 | 6/1993 | Kreifels et al. | 365/185 |
| 5,255,237 | 10/1993 | Kodama | 365/185.19 |
| 5,255,244 | 10/1993 | Dey | 365/233 |
| 5,283,758 | 2/1994 | Nakayama et al. | 365/185 |
| 5,297,096 | 3/1994 | Terada et al. | 365/218 |
| 5,305,276 | 4/1994 | Uenoyama | 365/230.01 |
| 5,305,284 | 4/1994 | Iwase | 365/238.5 |
| 5,321,845 | 6/1994 | Sawase et al. | 395/800 |
| 5,329,492 | 7/1994 | Mochizuki | 365/230.03 |
| 5,369,647 | 11/1994 | Kreifels et al. | 371/25.1 |
| 5,377,145 | 12/1994 | Kynett et al. | 365/189.05 |
| 5,390,146 | 2/1995 | Atwood et al. | 365/185.02 |
| 5,402,383 | 3/1995 | Akaogi | 365/218 |
| 5,418,752 | 5/1995 | Harari et al. | 365/218 |
| 5,444,664 | 8/1995 | Kuroda et al. | 365/226 |
| 5,566,125 | 10/1996 | Fazio et al. | 365/45 |
| 5,581,503 | 12/1996 | Matsubara et al. | 365/185.33 |
| 5,602,738 | 2/1997 | Sasaki | 364/431.12 |
| 5,615,159 | 3/1997 | Roohparvar | 365/201 |

FOREIGN PATENT DOCUMENTS

| | | |
|---|---|---|
| 0392895 | 10/1990 | European Pat. Off. . |
| 0447856 | 9/1991 | European Pat. Off. . |
| 0489204 | 6/1992 | European Pat. Off. . |
| 59-29448 | 2/1984 | Japan . |
| 62-117633 | 6/1987 | Japan . |
| 63-206852 | 8/1988 | Japan . |
| 1-161469 | 6/1989 | Japan . |
| 1-273296 | 11/1989 | Japan . |
| 1-298600 | 12/1989 | Japan . |
| 2-89555 | 7/1990 | Japan . |
| 2-241060 | 9/1990 | Japan . |
| 2-289997 | 11/1990 | Japan . |
| 2-310786 | 12/1990 | Japan . |
| 3-014272 | 1/1991 | Japan . |
| 3-078195 | 4/1991 | Japan . |
| 3-187263 | 8/1991 | Japan . |
| 3-229955 | 10/1991 | Japan . |
| 3-250495 | 11/1991 | Japan . |

OTHER PUBLICATIONS

Patent Abstracts of Japan, vol. 14, No. 542, Sep. 4, 1990, p. 1137.

Electronic Engineering, vol. 63, No. 775, Jul. 1991, p. 49.

IBM Technical Disclosure Bulletin, vol. 32, No. 10B, "Method of Reducing DRAM Power Dissipation with Segmented Bitlines," pp. 141, 142.

Hitachi IC Memory Data Book 1, Sep. 1981, p. 872.

(ERASING)

(WRITING)

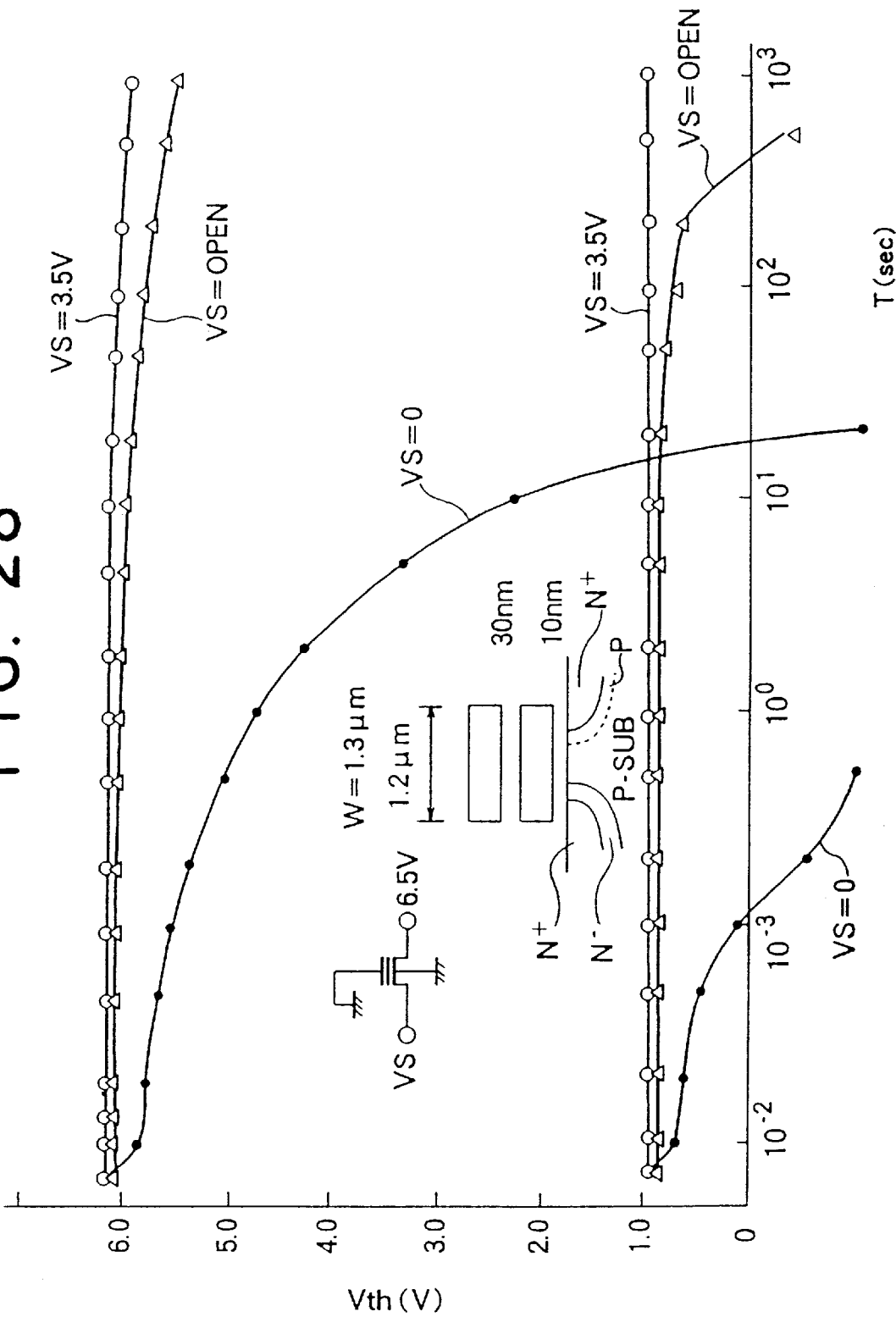

| SELECTED BLOCK FOR WRITING | TRANSFER MOS TRANSISTOR | SOURCE POTENTIAL OF EACH BLOCK | |
| --- | --- | --- | --- |
| | | (MBa) Vsa | (MBb) Vsb |
| MBa | ON | GND | Vddi |
| MBb | OFF | GND/Vddi | GND |

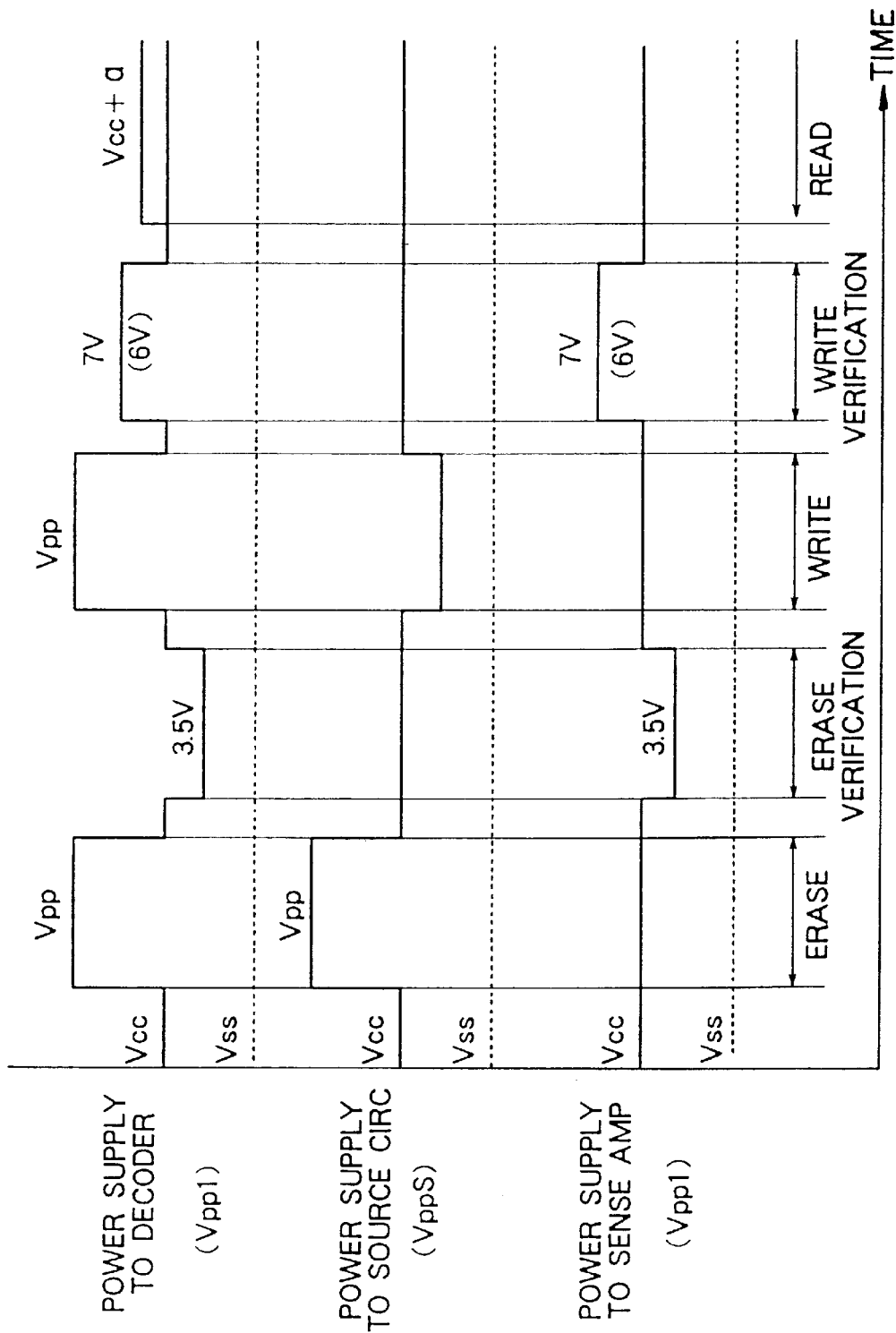

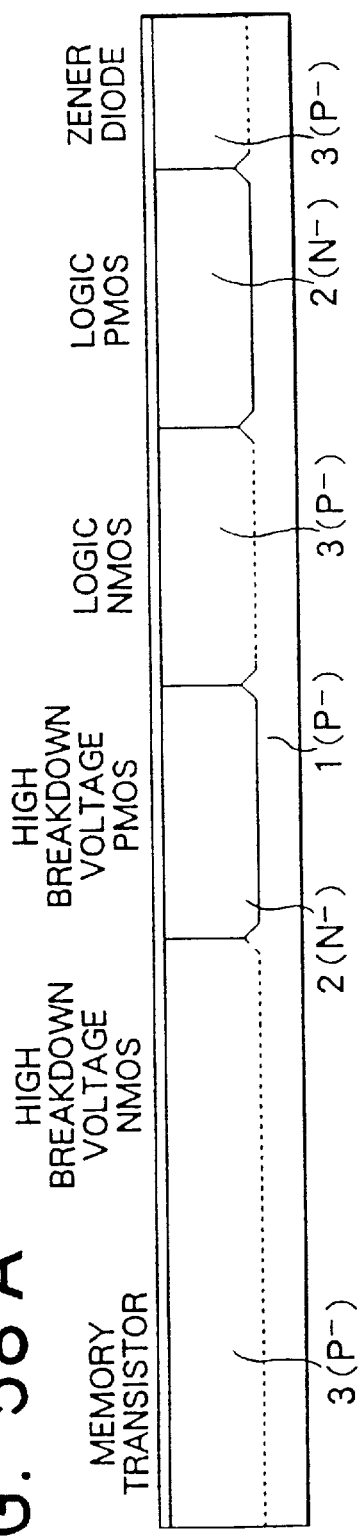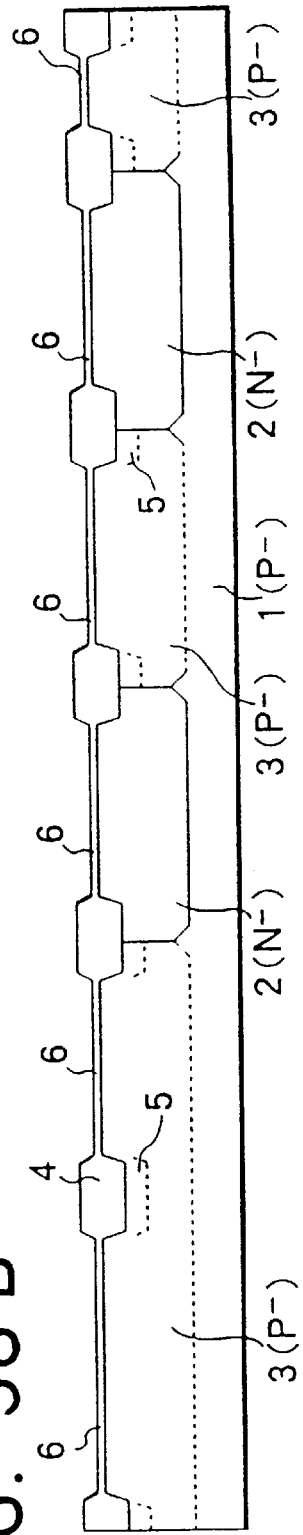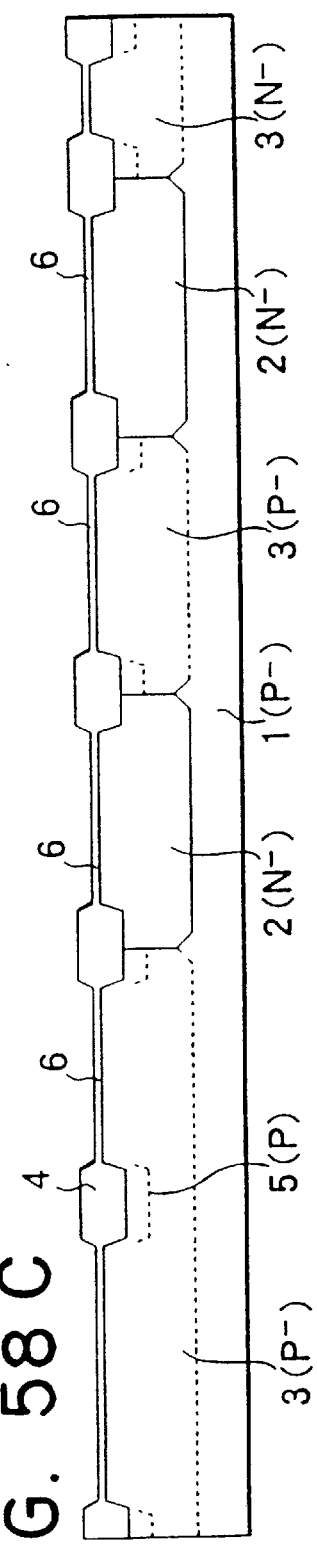

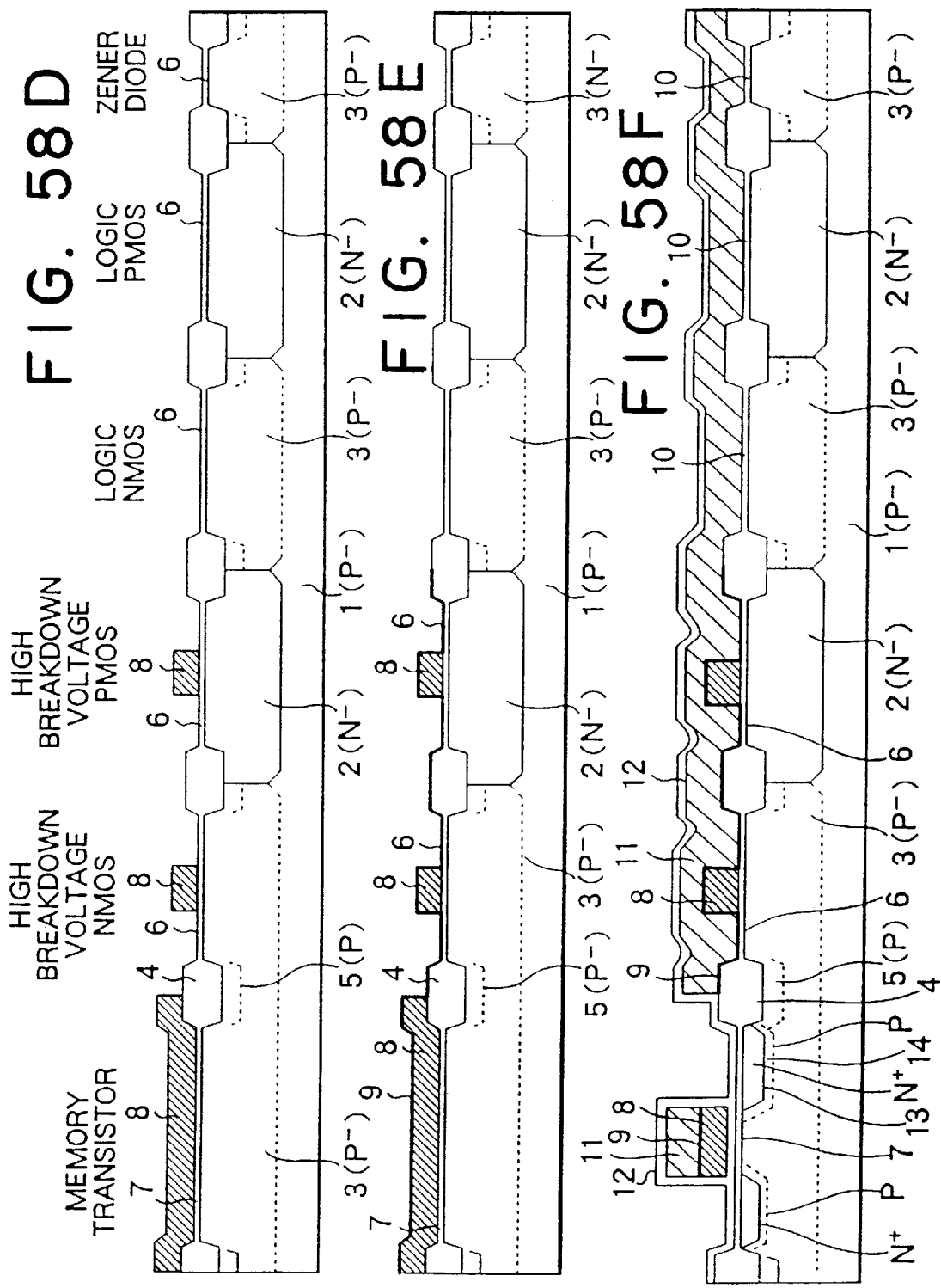

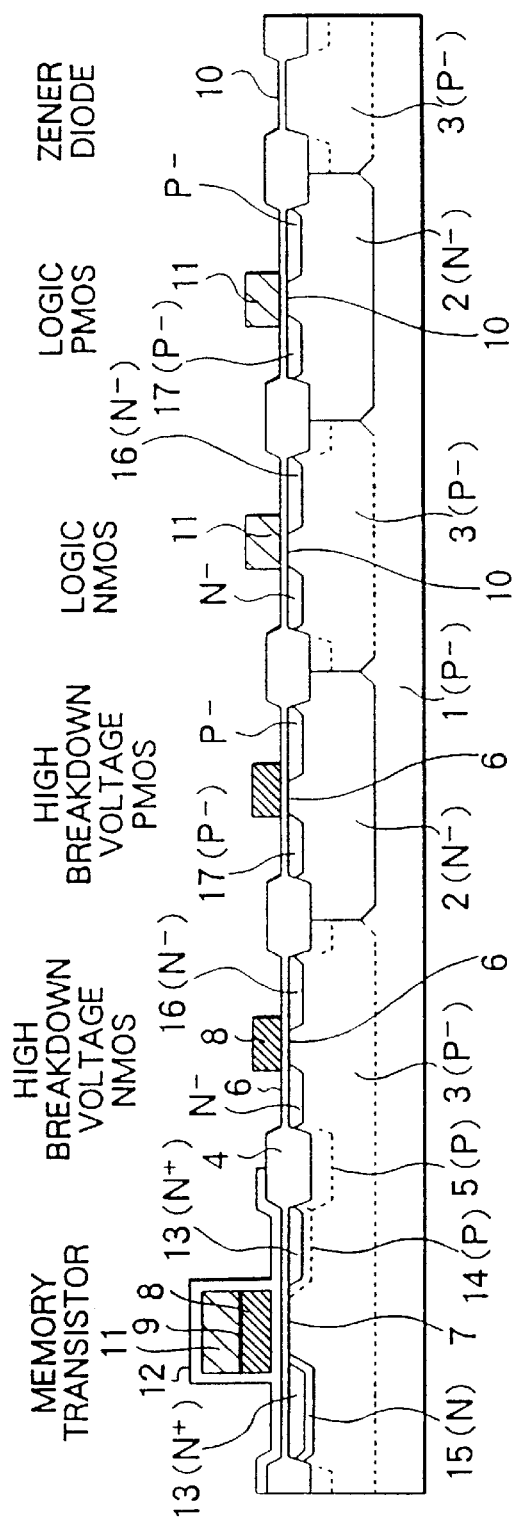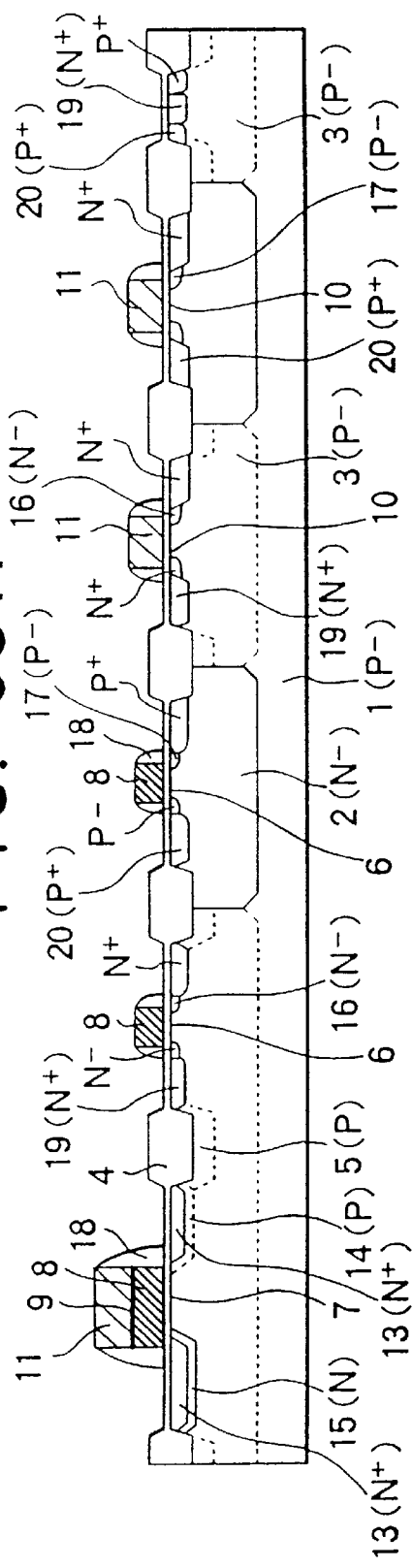

FIG. 59

| SCHEME | | SELECTED MEMORY BLOCK | UNSELECTED MEMORY BLOCK |
|---|---|---|---|
| SOURCE SHEME (TUNNEL ERASURE AT SOURCE END) | Ⓐ | Gate: Vpp, Source: GND, Drain: OPEN | Gate: GND, Source: GND, Drain: OPEN |
| GATE NEGATIVE BIASING (ERASURE OVER ENTIRE GATE SURFACE) | Ⓑ | Gate: -Vpp, Source: GND, Drain: GND | Gate: GND, Source: GND, Drain: GND |
|  | Ⓒ | Gate: -Vpp, Source: Vcc, Drain: Vcc | Gate: GND, Source: Vcc, Drain: Vcc |
| SUBSTATE POSITIVE BIASING SCHEME (ERASURE OVER ENTIRE GATE SURFACE) | Ⓓ | Gate: GND, Source: Vpp, Drain: Vpp, Sub: Vpp | Gate: Vpp/OPEN, Source: Vpp, Drain: Vpp, Sub: Vpp |
|  | Ⓔ | Gate: GND, Source: Vpp, Drain: Vpp, Sub: Vcc | Gate: Vcc, Source: Vcc, Drain: Vcc, Sub: Vcc |

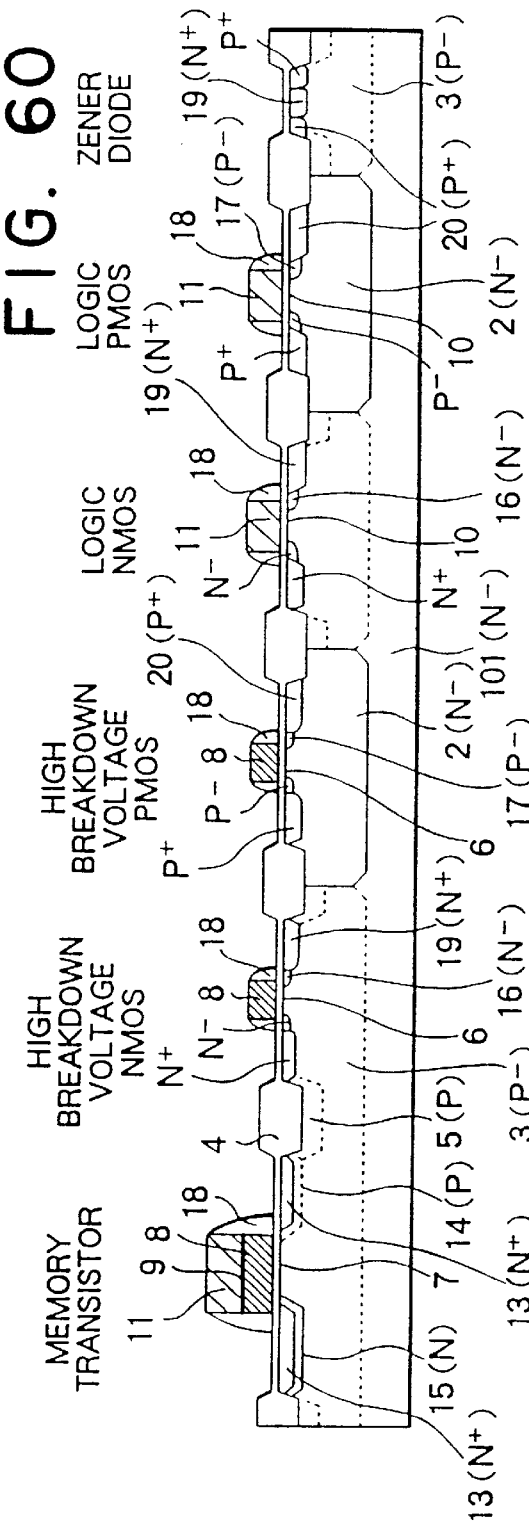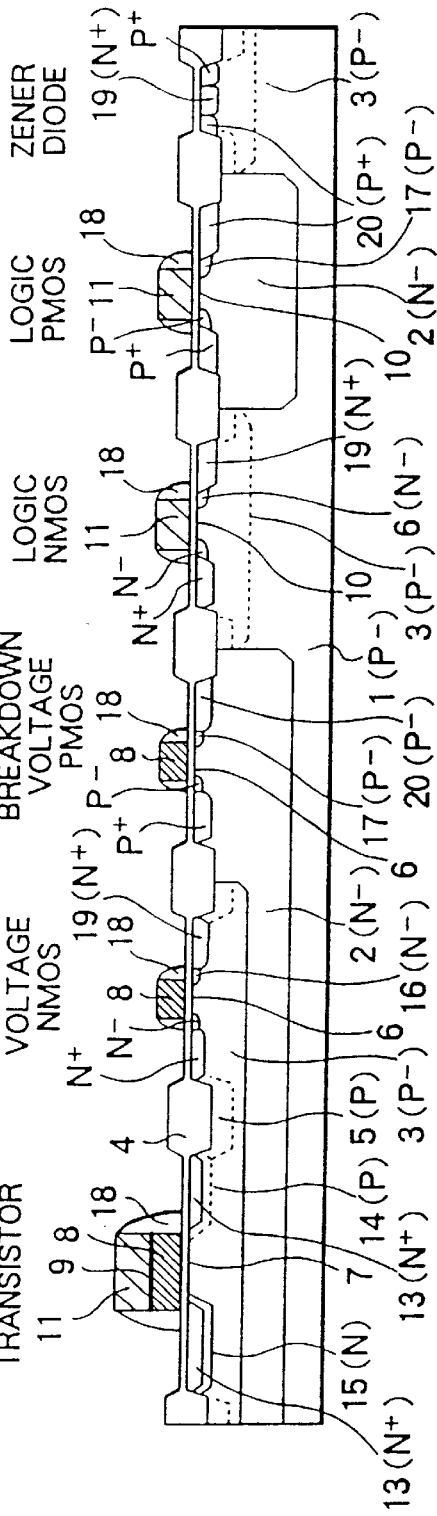

FIG. 64

| BIT: | 7 | 6 | 5 | 4 | 3 | 2 | 1 | 0 |
|---|---|---|---|---|---|---|---|---|
| | — | — | — | — | RAMS | RAM2 | RAM1 | RAM0 |
| INITIAL VALUE: | 1 | 1 | 1 | 1 | 0 | 0 | 0 | 0 |
| R/W: | R/W | R/W | R/W | R/W | R/W | R/W | R/W | R/W |

FIG. 65

| NO. | SRA ADDRESS | BIT 3 RAMS | BIT 2 RAM2 | BIT 1 RAM1 | BIT 0 RAM0 |
|---|---|---|---|---|---|
| (1) | H' F680 ~ H' F6FF | 0 | 0/1 | 0/1 | 0/1 |
| (2) | H' EC00 ~ H' EC7F | 1 | 0 | 0 | 0 |
| (3) | H' EC80 ~ H' ECFF | 1 | 0 | 0 | 1 |
| (4) | H' ED00 ~ H' ED7F | 1 | 0 | 1 | 0 |
| (5) | H' ED80 ~ H' EDFF | 1 | 0 | 1 | 1 |
| (6) | H' EE00 ~ H' EE7F | 1 | 1 | 0 | 0 |

SEMICONDUCTOR IC DEVICE HAVING A CONTROL REGISTER FOR DESIGNATING MEMORY BLOCKS FOR ERASURE

CROSS-REFERENCE TO RELATED APPLICATIONS

This application is a continuation of application Ser. No. 08/788,198, filed Jan. 24, 1997; now U.S. Pat. No 6,026,020 which, in turn, was a continuation of application Ser. No. 08/473,114, filed Jun. 7, 1995, now U.S. Pat. No. 5,768,194; and which, in turn, was a continuation of application Ser. No. 08/031,877, filed Mar. 16, 1993, now abandoned; and the entire disclosures of which are incorporated herein by reference.

BACKGROUND OF THE INVENTION

The present invention relates to a nonvolatile flash memory in which information is rewritable by electrical erasing/writing and a microcomputer incorporating the same.

JP-A-1-161469 (Laid-open on Jun. 26, 1989) describes a microcomputer having, as a programmable nonvolatile memory, an EPROM (erasable and programmable read only memory) or an EEPROM (electrically erasable and programmable read only memory) carried on a single semiconductor chip. Data and programs are held in such an on-chip nonvolatile memory of the microcomputer. Since information stored in the EPROM is erased by means of ultraviolet rays, the EPROM must be removed from a system on which it is mounted in order for the EPROM to be rewritten. The EEPROM can be erased and written electrically and therefore information stored therein can be rewritten with the EEPROM mounted on a system. However, memory cells constituting the EEPROM must be comprised of, in addition to memory devices such as MNOSs (metal nitride oxide semiconductors), selecting transistors and hence the EEPROM requires a relatively large chip occupation area being, for example, about 2.5 to 5 times as large as that of the EPROM.

JP-A-2-289997 (Laid-open on Nov. 29, 1990) describes a simultaneous erasing type EEPROM. This simultaneous erasing type EEPROM can be described as operating as a flash memory, such as described in the present specification. In the flash memory, information can be rewritten by electrical erasing and writing, each memory cell can be constructed of a single transistor as in the EPROM and, functionally, all memory cells or a block of memory cells can be erased simultaneously by electrical erasing. Accordingly, in the flash memory, information stored therein can be rewritten with the flash memory mounted on a system, the time for rewrite can be shortened by virtue of its simultaneous erasing function and contribution to reduction of the area occupied by a chip can be accomplished.

U.S. Pat. 5,065,364 (issued on Nov. 12, 1991) shows a flash memory of the type in which an array of electrically erasable and rewritable memory cells having control gates, drains and sources is divided into a plurality of memory blocks in a unit of data line, source lines in common to each block are led out and a voltage complying with an operation is applied separately to a source line by means of a source switch provided in each source line. At that time, ground potential is applied to the source line of a block selected for writing. A voltage VDI of, for example, 3.5 V is applied to the source line of a block not selected for writing. The voltage VDI guards against word line disturbance. The word line disturbance referred to herein is a phenomenon that for example, in a memory cell having a word line conditioned for selection and a data line conditioned for unselection, the potential difference between the control gate and floating gate is increased and as a result, electric charge is discharged from floating gate to control gate to decrease the threshold of the memory cell transistor.

JP-A-59-29488 (laid-open on Feb. 16, 1991) and JP-A-3-78195 (laid-open on Apr. 3, 1991) describe an ultraviolet light-erasable EPROM in which sources of memory cells connected with the same word line are connected in common and a source potential control switch is provided for the commonly connected sources. JP-A-3-78195 (laid-open on Apr. 3, 1991) describes an ultraviolet light-erasable EPROM in which sources of memory cells connected with adjacent two word lines are connected in common and a source potential control switch is provided for each adjacent two word lines. Each of the inventions disclosed in these three references is intended to provide a solution to a problem of erroneous writing/reading caused by leak current from an unselected memory cell in an EEPROM.

U.S. application Ser. No. 07/942,028 filed Sep. 8, 1992, which is a continuation application of U.S. application Ser. No. 07/568,071 filed Aug. 16, 1990, discloses a structure of a flash memory in which sources of memory cells are connected in common for the purpose of preventing a word line disturb problem for a writing operation.

Meanwhile, JP-A-3-14272 (laid-open on Jan. 22, 1991), JP-A-3-250495 (laid-open on Nov. 8, 1991) and JP-A-2-241060 (laid-open on Sept. 25, 1990) describe division of a memory cell array in a unit to data line.

SUMMARY OF THE INVENTION

The present inventors have first studied the fact that a flash memory is carried on a microcomputer to find out the following points.

(1) Programs and data are stored in a ROM incorporated or built in the microcomputer. Data is classified into data of a large capacity and data of a small capacity. When the programs and data are to be rewritten, the former data is typically rewritten in a large unit of severals of tens of KB (kilobyte) and the latter data is typically rewritten in a small unit of severals of tens of B (byte). At that time, if the flash memory is erased in a unit of chip batch or in a unit of memory block of the same size, inconvenience that the erase unit matches with a program area but is excessively large for a data area to impair ease of use thereof may occur or the converse case may occur.

(2) When part of information held in the flash memory is desired to be rewritten after the microcomputer is mounted on a system, it suffices to use part of the memory block holding the information of interest as an object to be rewritten. But if all simultaneously erasable memory blocks have an equal storage capacity, then even when rewrite of only a smaller amount of information than the storage capacity of a memory block is desired, the memory block of a relatively large storage capacity must be erased simultaneously and thereafter write is carried out over the whole of the memory block in question, with the result that time is consumed wastefully for rewrite of information not substantially required to be rewritten.

(3) Information to be written into the flash memory is determined in accordance with the system to which the microcomputer is applied but efficiency may sometimes be degraded when the information is all written from the beginning with the microcomputer of interest mounted on the system.

(4) When the flash memory is rewritten with the microcomputer mounted, it sometimes suffices that only part of information of a memory block, standing for an object to be rewritten, is rewritten. But even in this case, if information to be written into the whole of the memory block which has been erased simultaneously is all received sequentially externally of the microcomputer and rewritten, all of the information to be written into the whole of the memory block of interest will have to be received from the outside in spite of the fact that it suffices to rewrite only part of information of the memory block to be rewritten, and transfer, from the outside, of information not substantially required to be rewritten, that is, information held internally in advance of rewrite must be repeated, resulting in wastefulness of transfer of information for partial rewrite of the memory block.

(5) Because of information storing mechanism, the time for rewriting the flash memory through simultaneous erasing is far longer as compared to a memory such as RAM (random access memory) and so the flash memory cannot be rewritten on real time base in synchronism with machine control operation by the microcomputer.

The present inventors have studied the division of memory blocks in a unit of data line to find that the size of the minimum memory block can be decreased more easily by division into memory blocks in a unit of word line and using sources in common in a block and this is advantageous also from the standpoint of improving ease of use of the flash memory built in the microcomputer as studied firstly. When the division into memory blocks in a unit of data line is employed, all memory cells of a selected block for writing arranged in line and having drains connected to a data line applied with a write high voltage suffer from data line disturbance. The data line disturbance is a phenomenon that for example, in a memory cell associated with a word line not rendered to be selected and a data line rendered to be selected for writing, an electric field between the source and drain is increased, so that hot holes are injected from drain to floating gate to decrease the threshold of the memory cell transistor.

A major object of the invention is to provide a microcomputer incorporating a flash memory which is easy to use. More particularly, a first object of the invention is to provide a microcomputer capable of making highly efficient a processing of initial write of information into the built-in flash memory. A second object of the invention is to improve rewrite efficiency of part of information held in some of memory blocks of the flash memory by eliminating wastefulness of write operation after simultaneous erasing of the memory blocks of interest. A third object of the invention is to improve rewrite efficiency by eliminating wasteful transfer operation, from the outside, of write information necessary for partial rewrite of a memory block. A fourth object of the invention is to change information held in the flash memory on real time base in synchronism with control operation by the microcomputer.

Further, the invention has for its object to provide a flash memory in which the minimum size of memory block obtained by using sources in common in an electrically rewritable nonvolatile memory device can be decreased. Still another object is to prevent an erroneous operation due to data line disturbance in a unselected memory block for writing from occurring when formation of memory blocks is effected in a unit of word line.

Major aspects of the present invention will now be described.

More specifically, a microcomputer comprises, on a single semiconductor chip, a central processing unit and a non-volatile flash memory in which information to be processed by the central processing unit is rewritable by electrical erase and write, and the microcomputer is provided with an input terminal of an operation mode signal for designating a first operation mode in which rewrite of the flash memory is controlled by a circuit built in the semiconductor chip and a second operation mode in which it is controlled by a unit provided externally of the semiconductor chip.

When the central processing unit performs rewrite control in accordance with designation of the first operation mode, a rewrite control program to be executed by the central processing unit may be held in a mask ROM or a rewrite control program precedently stored in the flash memory may be transferred to a RAM and executed.

The fact that the amount of information to be stored in the flash memory in accordance with an application differs in accordance with the kind of the information such as for example a program, a data table or control data is taken into consideration. Then, in order that upon rewrite of part of information held in some of memory blocks of the flash memory, efficiency of rewrite can be improved by eliminating wastefulness of write operation after simultaneous erasing of the memory blocks of interest, a plurality of memory blocks having mutually different storage capacities may be allotted each for a simultaneously erasable unit in the flash memory.

When rewrite of the flash memory is controlled internally and externally of the microcomputer, in order for a memory block to be erased simultaneously can be designated easily, a register in which information for designating the memory block to be erased simultaneously is rewritably held may be incorporated in the flash memory.

When the built-in flash memory has, as a simultaneous erase unit, a plurality of memory blocks having mutually different storage capacities, in order that the built-in RAM can be utilized as a working area or a data buffer area for rewrite of memory block, a memory block having a storage capacity set to be smaller than that of the built-in RAM may be provided. In this case, for the sake of improving efficiency of rewrite by eliminating wastefulness of transfer operation, from the outside, of write information necessary for partial rewrite of the memory block, information held in the memory block having a storage capacity smaller than that of the built-in RAM may be transferred to the built-in RAM, all or part of the transferred information may be renewed on the RAM and the memory block of interest may be rewritten with renewed information. Further, upon tuning of data such as control data held in the flash memory, in order that information held in the flash memory can be changed on real time base in synchronism with control operation by the microcomputer, a processing may be effected wherein addresses of a specified area of the built-in RAM are controllably changed and arranged so as to overlap addresses of the memory block having the smaller storage capacity than the built-in RAM, that is, changed and arranged so that the overlapped RAM may be accessed when the memory block is accessed and after working has been done at the specified address, the arranged address of the RAM is restored to the original state and the contents of the memory block is rewritten with the information at the specified address of the RAM.

In order to decrease the minimum block size more easily as compared to the case where memory blocks are formed in a unit of data line, memory blocks are defined by connecting a common source line to memory cells having their control gates coupled to a single or a plurality of word lines in a unit of word line.

At that time, to take care of data line disturbance in an unselected memory block for writing, voltage output means is adopted which can control, in a unit of memory block, potential of the source line to first potential and to second potential of higher level than that of the first potential upon write operation, whereby the voltage output means applies the first potential to a source line of a memory block including memory cells having an associated data line and an associated word line applied with predetermined voltages so as to be selected for writing and applies the second potential to a source line of a memory block including memory cells having an associated data line applied with the predetermined voltage and an associated word line not applied with the predetermined voltage so as not to be selected for writing.

In order to improve ease of use in the formation of memory blocks in a unit of word line, a plurality of memory blocks include a single or a plurality of large memory blocks associated with a relatively large number of word lines and a single or a plurality of small memory blocks associated with a relatively small number of word lines.

At that time, in order to minimize the data line disturbance time, the large memory block and the small memory block have data lines in common and arranged separately in line, a selection circuit for selecting a data line upon write and read operations is arranged near the large memory block, a transfer gate circuit is inserted in data lines which are associated in common with the large memory block and small memory block, and a control circuit is provided which cuts off the transfer gate circuit upon write of the large memory block.

According to the above-mentioned aspects of the invention, when information is initially written into the flash memory in the phase preceding mounting of the microcomputer according to the invention, the information can be written efficiently under the control of the external write device such as a PROM writer by designating the second operation mode.

For example, programs, data tables or control data are written into the plurality of-memory blocks having mutually different capacities and defined each as a simultaneously erasable unit, in accordance with a storage capacity of each memory block.

When the microcomputer is mounted on the system and thereafter the flash memory is rewritten, the first operation mode is designated to cause, for example, the central processing unit built in the microcomputer to execute control of rewrite. In this case, data of a relatively large information amount can be written in a memory block of a relatively large storage capacity and data of a relatively small information amount can be written in a memory block of a relatively small storage capacity. Namely, a memory block having a storage capacity meeting the information amount to be stored can be utilized. Accordingly, even when a given memory block is erased simultaneously for rewrite of part of information held in the flash memory, such wastefulness that an information group subtantially not required to be rewritten is erased concurrently and thereafter written again can be prevented as far as possible.

Especially, when of the plurality of memory blocks, a memory block having a storage capacity set to be smaller than that of the built-in RAM is provided, this memory block may be utilized as a work area or a data buffer area for rewrite of memory block. More particularly, when the flash memory is rewritten with the microcomputer mounted, information in a memory block to be rewritten is transferred to the built-in RAM, only partial information to be rewritten is received from the outside and rewritten on the RAM and then the flash memory is rewritten, whereby transfer, from the outside, of information held internally in advance of rewrite and not required to be rewritten need not be repeated, so that wastefulness of information transfer for partial rewrite of the memory block can be eliminated. Further, in the flash memory, the time for simultaneously erasing a small memory block is not so short that the flash memory per se can be rewritten on real time base in synchronism with control operation by the microcomputer. But, by utilizing the built-in RAM as a work area or a data buffer area for rewrite of memory block, the same data as that rewritten on real time base can eventually be obtained in the memory block.

When memory blocks are defined each in a unit of word line, the minimum memory block has a storage capacity which corresponds to that of one word line, regardless of the number of parallel input/output bits. Contrary to this, when memory blocks are defined each in a unit of data line, the minimum memory block has a storage capacity corresponding to the number of data lines which in turn corresponds to the number of parallel input/output bits. This signifies that the storage capacity of the minimum memory block can be reduced more easily when memory blocks are defined in a unit of word line and especially in the case of a memory incorporated in the microcomputer wherein input/output of data is carried out in a unit of byte or word, the minimum size of memory block can be reduced drastically. This contributes to further improvement in ease of use of the flash memory built in the microcomputer and consequently improvement in efficiency of rewrite of small scale data in a unit of memory block.

In a region near the source side end of the drain of a nonvolatile memory device, electron and hole pairs are generated owing to a tunnel phenomenon between bands. In this case, when a relatively large electric field is generated between the source and drain, holes of the electron and hole pairs are accelerated by the electric field to turn into hot holes. The hot holes are injected to the floating gate through a tunnel insulating film. This state is referred to as data line disturbance and when the data line disturbance affects the device for a long time, the threshold of the memory device is decreased and there results an undesirable change of stored information which leads to an erroneous operation (data line disturbance fault). In an unselected block for writing, by applying second potential such as data line disturbance prevention voltage to a source line of a memory cell to raise source potential, an electric field between the drain and source is weakened, thereby ensuring that holes of electron and hole pairs generated near the drain can be prevented from turning into hot holes to prevent a decrease in the threshold of memory transistor.

For prevention of the data line disturbance fault, minimization of the data line disturbance time (the time for exposure to the data line disturbance state) is effective. In this case, the data line disturbance time affecting a small memory block owing to write concomitant with rewrite of a memory block having a large storage capacity is relatively increased in comparison with the converse case. In view of this fact, by adopting an arrangement in which with respect to an intervening transfer gate circuit, memory blocks on the side of a Y selection circuit are formed of large memory blocks and memory blocks on the opposite side are formed of small memory blocks, the data line disturbance time affecting memory cells of the memory blocks relatively near the Y selection circuit owing to write of the memory block relatively remote from the Y selection circuit can be reduced drastically as compared to the case of the converse arrangement of large memory blocks and small memory blocks. By virtue of this arrangement relation between the large memory blocks and small memory blocks, erroneous operation due to data line disturbance can further be suppressed.

According to still another aspect of the present invention, there is provided a microcomputer comprising a central processing unit, an electrically rewritable flash memory, flash memory rewriting I/O port means capable of being coupled to a ROM writer for rewriting the flash memory, switch means located between the central processing unit and the flash memory, and a rewriting mode decision means responsive to an externally supplied operation mode signal for controlling the switch means and the flash memory rewriting I/O port means, the central processing unit, the flash memory, the flash memory I/O port means, the switching means and the rewriting mode decision means being formed in a single semiconductor chip.

According to still another aspect of the present invention, there is provided there is provided an electrically rewritable flash memory device comprising:

a memory cell array including a plurality of memory cells arranged in rows and columns, each of the memory cells including a non-volatile memory element having first and second semiconductor regions formed in a first surface portion of a semiconductor substrate, a floating gate formed over and insulated from a second surface portion of the semiconductor substrate between the the first and second semiconductor regions, and a control gate formed over and insulated from the floating gate;

a plurality of first conductors extending in parallel with one another in a row direction over the semiconductor substrate, control gates of memory cells in one row being connected in common to one first conductor;

a plurality of second conductors extending in parallel with one another in a column direction over the semiconductor substrate, first semiconductor regions of memory cells in one column being connected in common to one second conductor;

a plurality of common conductors extending in the row direction over the semiconductor substrate, second semiconductor regions of at least two rows of memory cells being connected in common to one common conductor such that the at least one row of memory cells having their second semiconductor regions connected in common to one common conductor form a memory block, memory blocks so formed having different memory capacities;

a plurality of common voltage control circuits formed in the substrate, one provided for each of the memory blocks, for generating a common voltage assuming at least first and second voltage values; and a control circuit formed in the substrate for generating a control signal indicating which of the memory blocks is subjected to an erasing/writing operation, the control signal being supplied to the plurality of common voltage control circuits so that individual common voltage control circuits apply to their associated common conductors common voltages each having one of the first and second voltage values depending on the control signal to effect a writing operation with a common voltage of the second voltage value applied to a common conductor for a memory block which does not contain a memory cell selected for the writing operation and to effect a simultaneous erasing operation with a common voltage of the first voltage value applied to a common conductor for a memory block selected for a simultaneous erasing operation.

BRIEF DESCRIPTION OF THE DRAWINGS

FIG. 28 is a diagram for explaining the change of threshold of a memory cell with respect to data line disturbance time.

FIG. 52 is a waveform diagram showing output voltages generated from the power supply circuit of FIG. 51.

FIG. 59 is a diagram for explaining techniques of erasing the flash memory.

FIG. 60 is a longitudinal sectional view for explaining a semiconductor substrate/well structure corresponding to sector erase.

FIG. 61 is a longitudinal sectional view for explaining another semiconductor substrate/well structure.

FIG. 64 is a diagram showing an example of a RAM control register.

FIG. 65 is a diagram illustrating an address setting for a specified address area of the random access memory.

DESCRIPTION OF THE PREFERRED EMBODIMENTS

Embodiments of the present invention will be described in sequence of the following items.

[1] A microcomputer adopting an allover flash memory

[2] A microcomputer adopting a mask ROM and a flash memory

[3] write of information by means of a general purpose PROM writer

Figure 1:
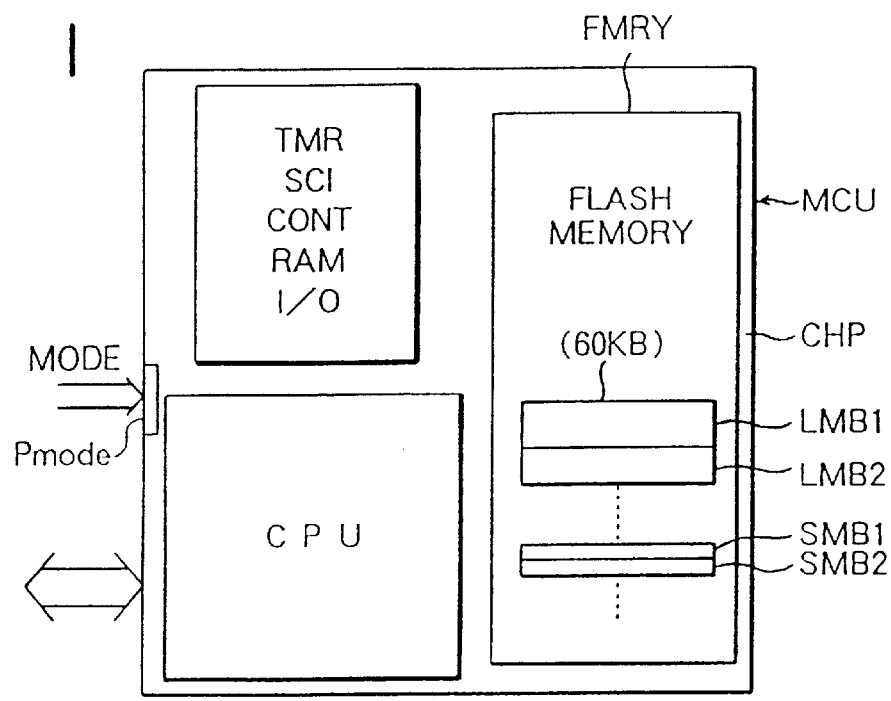
FIG. 1 is a block diagram showing an embodiment of a microcomputer adopting an all over flash memory.

[4] A write control program under the control of a CPU
[5] Proper use of write by the general purpose PROM writer or write by the CPU control
[6] Expedient to achieve rewrite on real time base
[7] Making partial rewrite of a memory block efficient
[8] The principle of the flash memory
[9] Formation of a plurality of memory blocks having different storage capacities and defined each in a unit of data line
[10] Details of a microcomputer corresponding to FIG. 1 A control circuit for rewrite of flash memory FMRY
[12] Details of the rewrite control procedure of the flash memory FMRY
[13] Formation of a plurality of memory blocks having different storage capacities and defined each in a unit of word line
[14] Countermeasures against data line disturbance in an unselected block for writing
[15] Correlation of data line disturbance time between memory blocks
[16] A transfer gate circuit for data line separation
[17] Dummy word lines
[18] Various forms of pluralization of memory blocks in a unit of word line
[19] Layout configuration of memory blocks
[20] The whole of a flash memory applied with countermeasurements against data line disturbance
[21] A method for production of a flash memory
[22] A semiconductor substrate/well structure meeting sector erase

[1] A microcomputer Adopting an Allover Flash Memory

FIG. 1 is a block diagram showing an embodiment of a microcomputer adopting an allover flash memory (the whole of the ROM in the microcomputer being in the form of a flash memory). In a microcomputer MCU shown in the figure, a central processing unit CPU, a nonvolatile flash memory FMRY in which information to be processed by the central processing unit CPU is rewritable by electrical erase and write, peripheral circuits such as timer TMR, serial communication interface SCI, random access memory RAM and input/output circuit I/O, and a control circuit CONT are formed on a single semiconductor chip CHP such as silicon through known semiconductor integrated circuit production techniques. In the flash memory FMRY, information is rewritable by electrical erase and write and like an EPROM, its memory cell can be constructed of a single transistor; and besides it has the function of electrically erasing all memory cells simultaneously or a block of memory cells (a memory block) simultaneously. The flash memory FMRY has a plurality of memory blocks each defined as a simultaneously erasable unit. In FIG. 1, LMB designates a large memory block having a relatively large storage capacity and SMB represents a small memory block having a relatively small storage capacity. The storage memory of the small memory block SMB is designed to be not larger than that of the random access memory RAM. Accordingly, the random access memory RAM can receive data transfer from the small memory block SMB to hold the information temporarily and can be used as a work area or data buffer area for rewriting. Requisite data and programs are written in the flash memory FMRY. Details of the flash memory FMRY will be described later.

The flash memory FMRY is allowed to rewrite its storage information under the control of the central processing unit CPU or under the control of a unit externally of the semiconductor chip CHP such as a general purpose PROM writer while the microcomputer MCU is mounted on a system. In the figure, MODE denotes an operation mode signal for selectively designating a first operation mode which causes the central processing unit to control rewrite of the flash memory FMRY and a second operation mode which causes the external unit to control rewrite of the flash memory FRMY and the operation mode signal is applied to a mode signal input terminal P mode on the semiconductor chip CHP.

[2] A Microcomputer Adopting a Mask ROM and a Flash Memory

Figure 2:
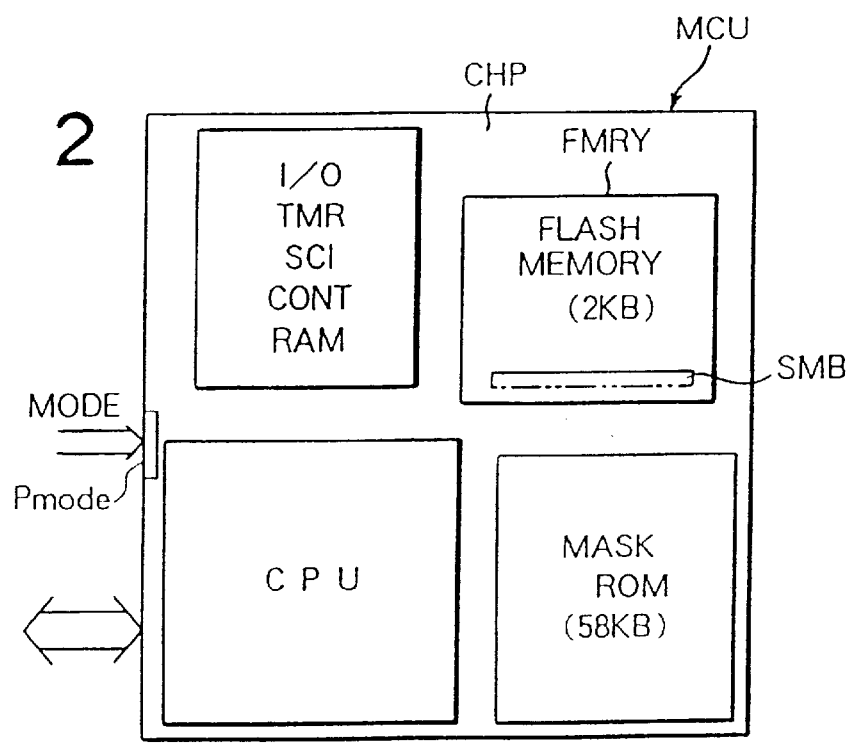
FIG. 2 is a block diagram showing an embodiment of a microcomputer adopting a flash memory along with a mask ROM.

FIG. 2 is a block diagram showing an embodiment of a microcomputer adopting a mask ROM along with a flash memory. In microcomputer MCU shown in the figure, part of the flash memory FMRY of FIG. 1 is replaced with a mask read only memory MASKROM. Held in the mask read only memory MASKROM are data and programs which need not be rewritten. A flash memory FMRY shown in FIG. 2 has a plurality of small memory blocks SMB each defined as a simultaneously erasable unit.

[3] Write of Information by Means of a General Purpose PROM Writer

Figure 3:
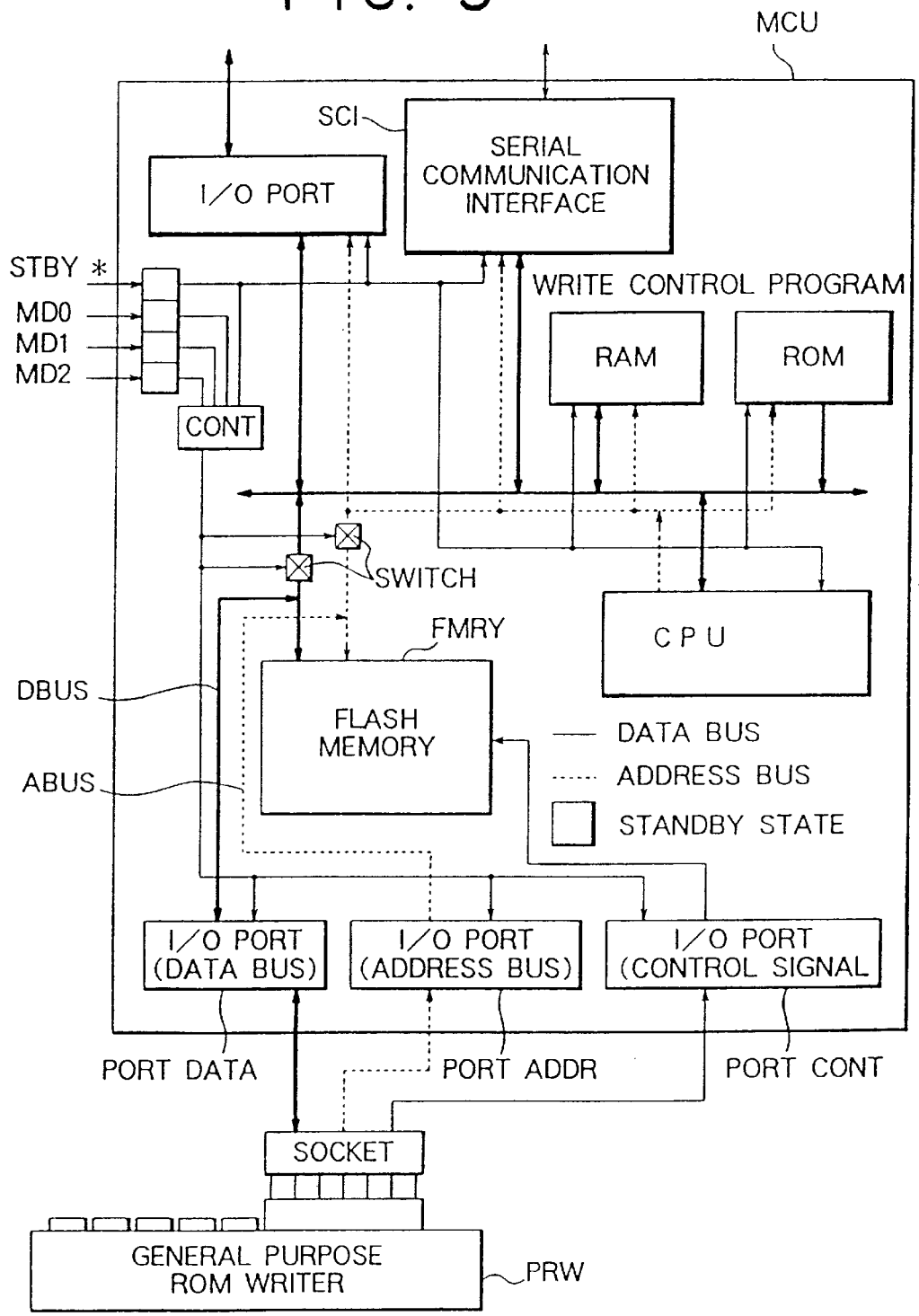
FIG. 3, is a block diagram drawn from the viewpoint of rewrite of a flash memory by means of a general purpose PROM writer.

FIG. 3 is a block diagram drawn from the viewpoint of rewrite of a flash memory FMRY by means of a general purpose PROM writer. In the figure, as an example of the mode signal MODE, MD0, MD1 and MD2 are indicated. The mode signals MD0 to MD2 are supplied to a control circuit CONT. A decoder included in the control circuit CONT, though not limitedly, decodes the mode signals MD0 to MD2 and decides whether an operation mode which does not require write into the flash memory FMRY is designated or whether the first operation mode or the second operation mode is designated. At that time, if designation of the second operation mode is determined, the control circuit CONT performs control such that it designates I/O ports which are to interface with the general purpose PROM writer PRW and permits the external general purpose PROM writer PRW to directly access the built-in flash memory FMRY. More specifically, an I/O port PORTdata for performing input/output of data between the writer and the flash memory FMRY, an I/O port PORTaddr for supplying address signals to the flash memory FMRY and an I/O port PORTcont for supplying various kinds of control signals to the flash memory FMRY are designated. In addition, the control circuit CONT suppresses substantial operation of built-in function blocks having no direct relation to rewrite control by means of the general purpose PROM writer PRW, such as the central processing unit CPU, random access memory RAM and mask read only memory MASKROM. For example, connection of such a built-in function block as the central processing unit CPU to the flash memory FMRY is disconnected through switch means SWITCH respectively arranged in data bus DBUS and address bus ABUS, as exemplified in FIG. 3. The switch means SWITCH can also be grasped as tristate type output circuits arranged in a circuit for delivering data from the built-in function block such as the CPU to the data bus DBUS and in a circuit for delivering addresses to the address bus ABUS. Such tristate output circuits are controlled such that they are brought into high impedance condition in response to the second operation mode. In the example of FIG. 3, the built-in function blocks not being directly related to the rewrite control based on the general purpose PROM writer, such as the central processing unit CPU, random access memory RAM and mask read only memory MASKROM, are brought into a low power consumption mode by a standby signal STBY* (sign* means that a signal assigned with this sign is a low active signal). If in a low power consumption mode the tristate output circuits are so controlled as to be brought into high output impedance condition, then the power consumption mode may be set to those function blocks in response to designation of the second operation mode by means of the mode signals MD0 to MD2 to substantially suppress operation of the built-in function blocks not having direct relation to the rewrite control based on the general purpose PROM writer PRW, such as the CPU, RAM and ROM.

When the second operation mode is set, the I/O ports PORTdata, PORTaddr and PORTcont of the microcomputer MCU couple to the general purpose PROM writer PRW through a conversion socket SOCKET. The conversion socket SOCKET has on the one hand a terminal arrangement adapted for the I/O ports PORTdata, PORTaddr and PORTcont and on the other hand a terminal arrangement adapted for a standard memory, terminals of one terminal arrangement having the same functions as those of terminals of the other terminal arrangement being connected mutually inside the conversion socket SOCKET.

[4] A Write Control Program Under the Control of a CPU

Figure 4:
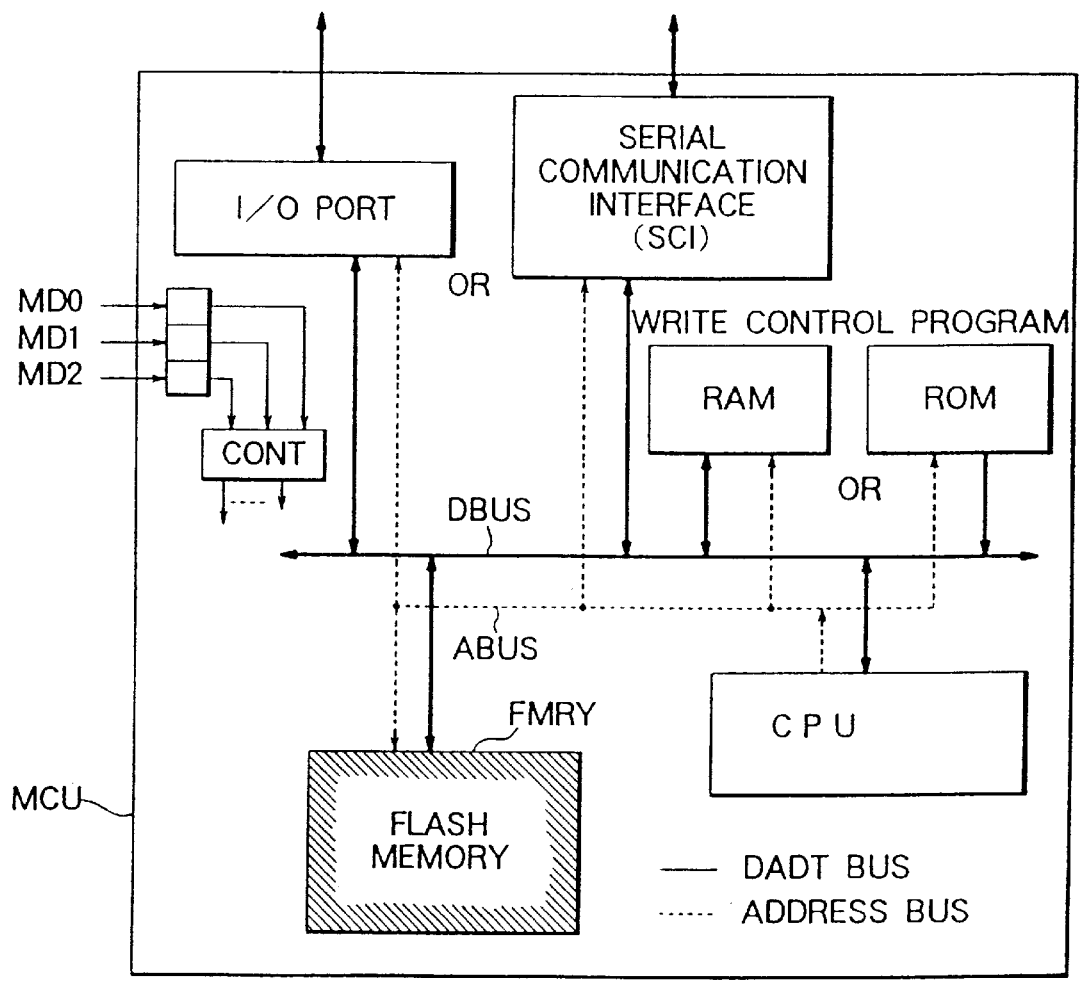
FIG. 4 is a block diagram drawn from the viewpoint of rewrite of a flash memory based on CPU control.

FIG. 4 is a block diagram drawn from the viewpoint of rewrite of a flash memory based on CPU control. In the microcomputer MCU of FIG. 1, a rewrite control program to be executed by the central processing unit CPU has precedently been written in the flash memory FMRY by means of the general purpose PROM writer PRW. In the microcomputer MCU of FIG. 2, a rewrite control program to be executed by the central processing unit CPU can be held in the mask read only memory MASKROM. When the first operation mode is designated by the mode signals MD0 to MD2 and a decoder included in the control circuit CONT recognizes this designation, the central processing unit CPU carries out write of data into the flash memory FMRY in accordance with a write control program written in the flash memory FMRY in advance or the rewrite control program held in the mask read only memory MASKROM.

Figure 5:
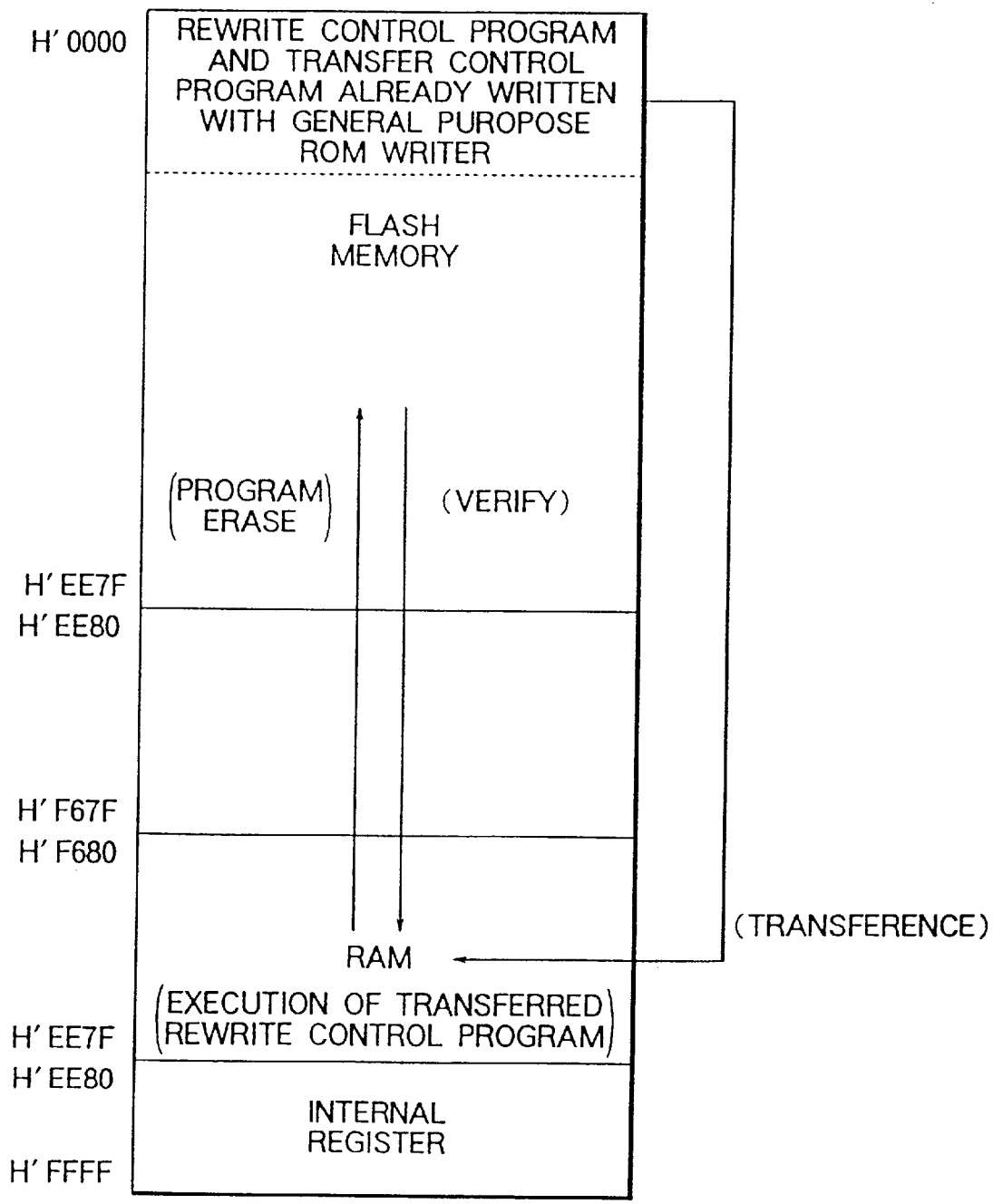
FIG. 5 is a memory map showing an example of a microcomputer applied with an all over flash memory.

FIG. 5 shows a memory map of the microcomputer having the allover flash memory (see FIG. 1). In the figure, a rewrite control program and a transfer control program have precedently been written in predetermined areas of the flash memory. When the first operation mode is designated, the central processing unit CPU executes the transfer control program to transfer the rewrite control program to the randam access memory RAM. After completion of the transfer, the processing of the central processing unit CPU branches to execution of the rewrite control program on the random access memory RAM and through this, the erase and write (inclusive of verification) of the flash memory FMRY is repeated.

Figure 6:
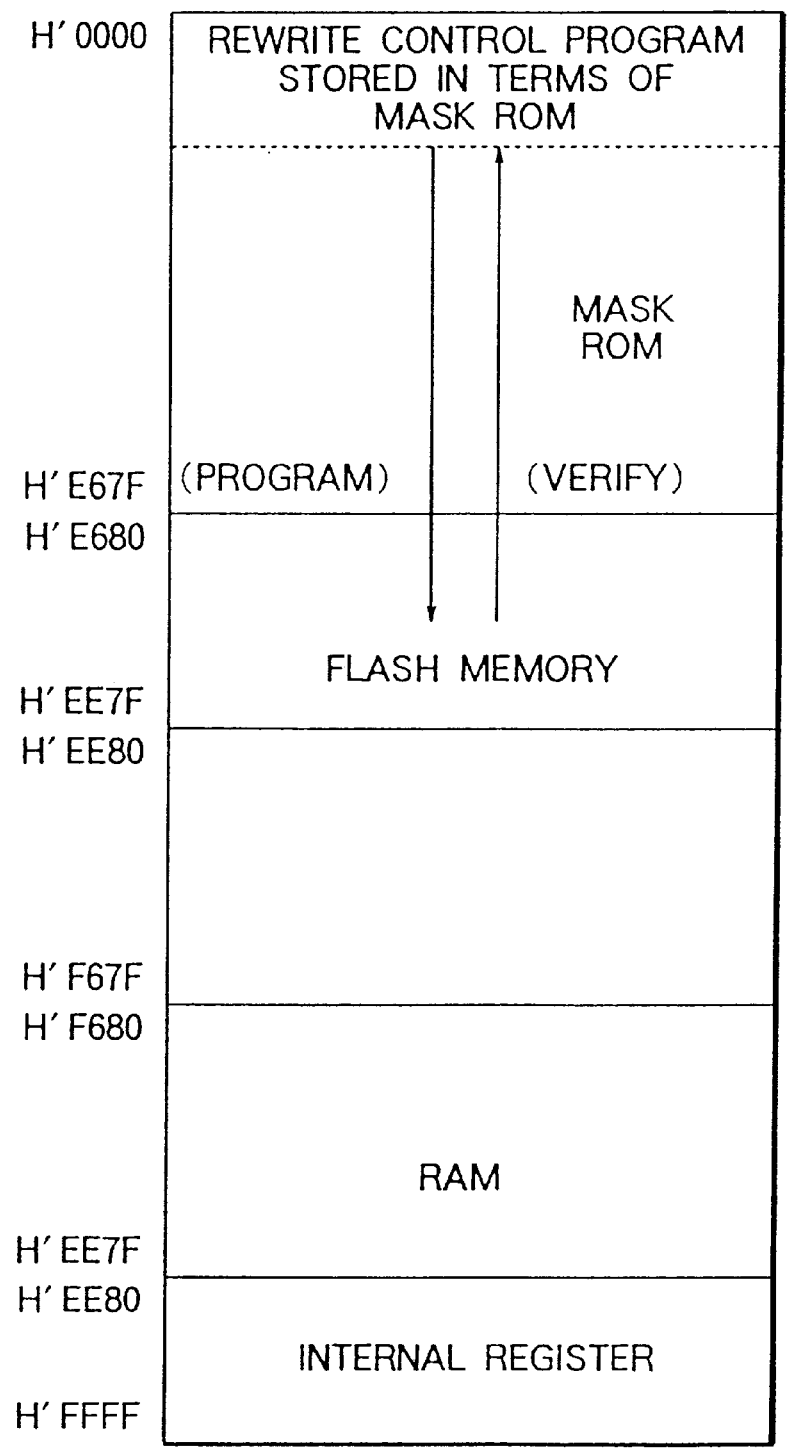
FIG. 6 is a memory map showing an example of a microcomputer having a flash memory along with a mask ROM.

FIG. 6 shows a memory map of the microcomputer having the mask ROM along with the flash memory (see FIG. 2). In this case, the transfer program as explained with reference to FIG. 5 is unneeded. When the first operation mode is designated, the central processing unit CPU sequentially executes a rewrite control program held in the mask read only memory MASKROM to thereby repeat erase and write of the flash memory FMRY.

Figure 7:
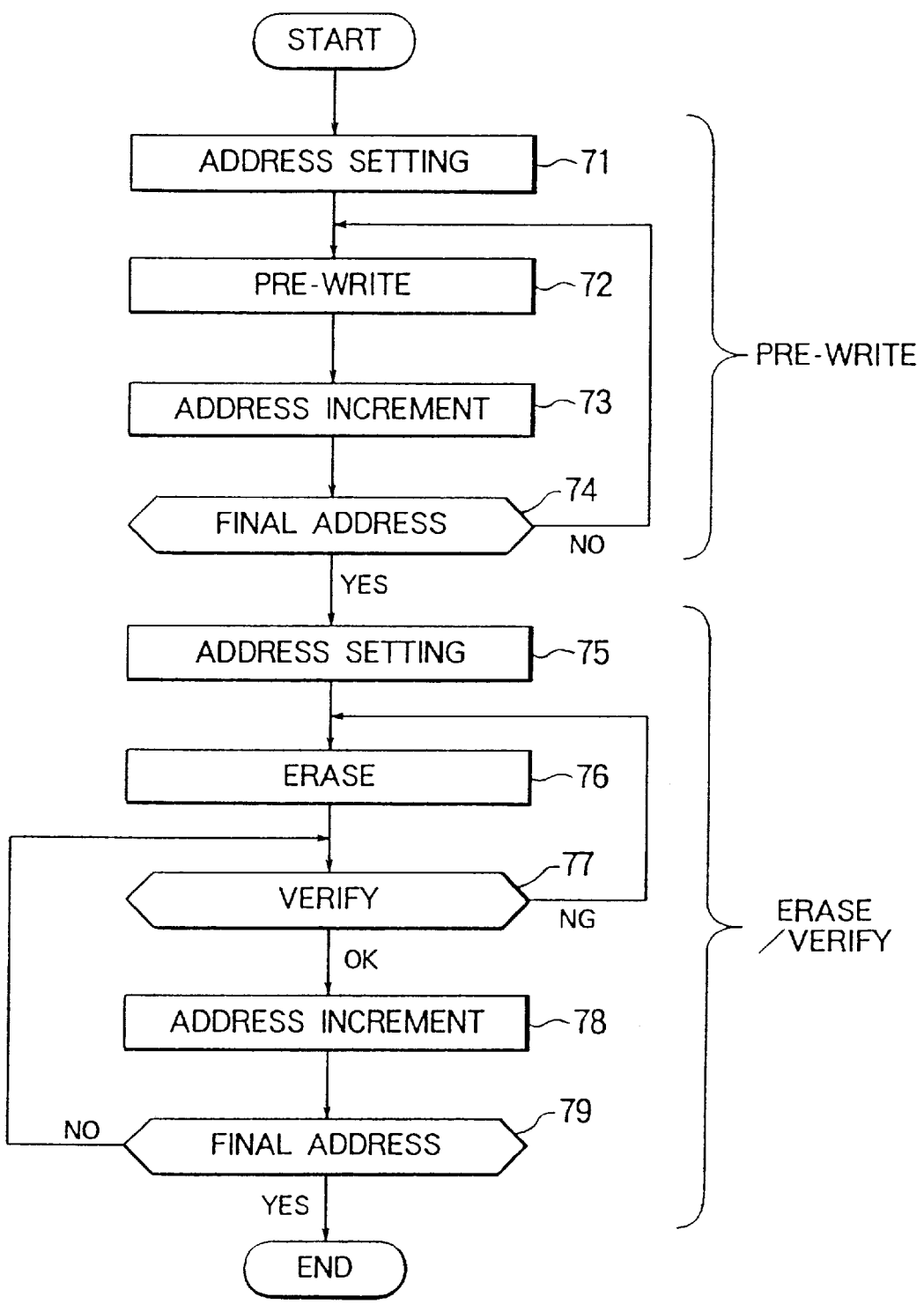
FIG. 7 is a diagram for explaining an example of the schematic control procedure of erase.

FIG. 7 shows an example of the control procedure of erase by the central processing unit CPU. Firstly, in accordance with the rewrite control program, the central processing unit CPU performs pre-write of memory cells present within an address range to be erased (steps 71 to 74). Through this, states of the memory cells before erase are all uniformed to written states. Subsequently, memory cells standing for objects to be erased are erased little by little while verifying the degree of erase each time erase is completed (erase/verify) in order to prevent excessive erase, thus completing an erase operation (steps 75 to 79). Erase by means of the general purpose PROM writer PRW can be done in a similar way. Erase sequence for the flash memory will be detailed hereinafter with reference to FIG. 22.

Figure 8:
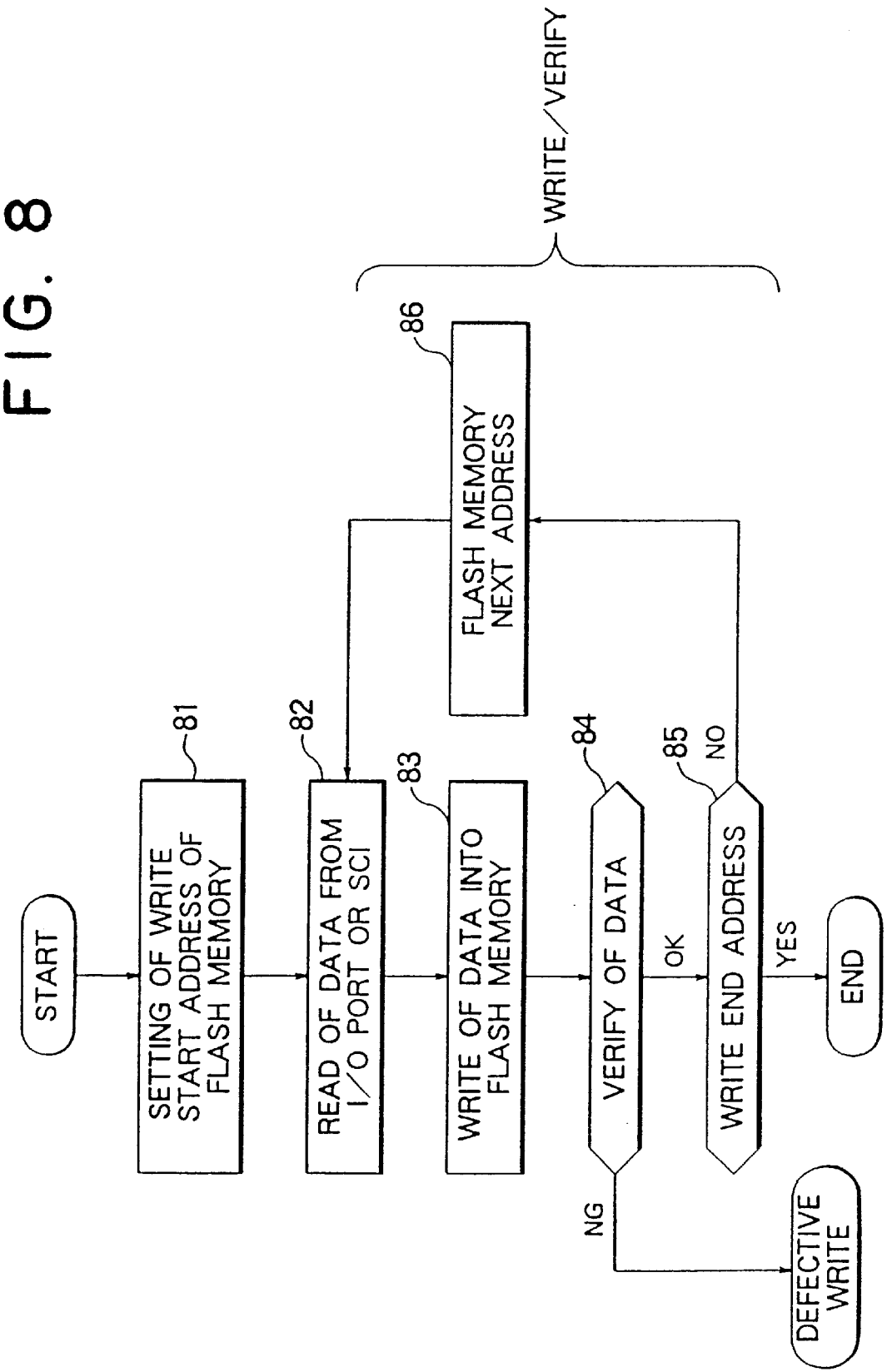
FIG. 8 is a diagram for explaining an example of the schematic control procedure of write.

FIG. 8 shows an example of the control procedure of write by the central processing unit CPU. Firstly, the central processing unit CPU sets a write start address of the flash memory FMRY (step 81). Subsequently, data transmitted from the outside is read through peripheral circuits designated by the rewrite control program, for example,the serial communication interface SCI or I/O ports (step 82). The thus read data is written into the flash memory FMRY for a predetermined time (step 83) and the written data is read to verify whether the data is written normally (write/verify) (step 84). Thereafter, the above read, write and verify of data are repeated until they are completed for a write end address (steps 85 and 86). Write by means of the general purpose PROM writer can be done in a similar way. In this case, however, data to be written is supplied from the PROM writer PRW through predetermined ports. Write sequence for the flash memory will be detailed later with reference to FIG. 21.

[5] Proper Use of Write by the General Purpose PROM Writer or Write by the CPU Control Principally, write by the general purpose PROM writer is applied to write of initial data or an initial program used before on-board of the microcomputer MCU, that is, mounting of the microcomputer MCU into a system. This can ensure that a relatively large amount of information can be written efficiently.

Write based on the CPU control is applied to the case where tuning of data is carried out while operating the system on which the microcomputer MCU is mounted (called a mounting machine) or the case where changes of data and programs under condition that the microcomputer MCU is mounted on the system (on-board condition), such as bug countermeasures for programs or changes of programs concomitant with version-up of the system, are needed. Through this, the flash memory FMRY can be rewritten without removing the microcomputer MCU from the mounting system.

[6] Expedient to Achieve Rewrite on Real Time Base

Figure 9:
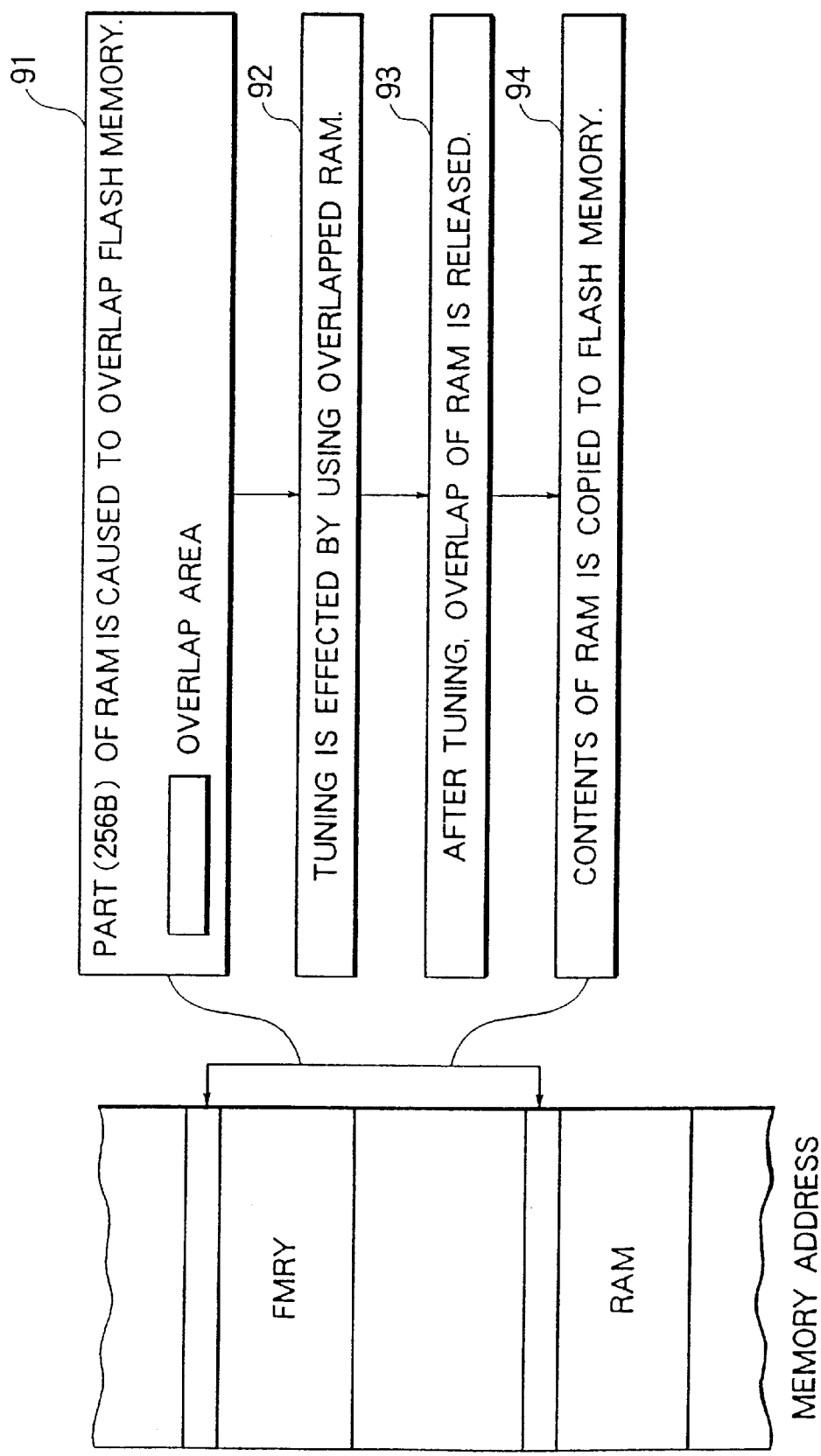
FIG. 9 is a diagram for explaining an example of an expedient to achieve rewrite of the flash memory on realtime base.

FIG. 9 shows an example of a technique of expedient to rewrite the flash memory on real time base. In the flash memory, because of its storage formatting, time required for erase cannot be reduced even when the storage capacity of a memory block defined as a simultaneous erasing unit is made to be small and it amounts up to, for example, several of tens of milliseconds to several of seconds. This makes it difficult to perform tuning of data by rewriting control data held in the flash memory on real time base while operating the system with the microcomputer MCU mounted thereon. To cope with this problem, the built-in RAM is utilized as a work area or data buffer area for rewrite of memory block.

More particularly, data of a predetermined small memory block SMB holding data to be subjected to tuning is first transferred to a specified address area of the random access memory RAM.

Next, the microcomputer MCU is switched to a flash memory write mode of operation. This write operation mode is set either by setting MD0 to MD2 for a predetermined value or by setting the rewrite high voltage Vpp to be applied to an external terminal to a predetermined rewrite high voltage. This write mode indicates that the flash memory FMRY is in a state in which it can be written by the CPU and does not indicate that the CPU is writing the flash memory.

Subsequently, a specified address area of the random access memory RAM is overlapped with an address of a part of the predetermined small memory block SMB of the flash memory FMRY (step 91).

The reasons why a specified address area of the random access memory RAM is overlapped with an address area of a predetermined small memory block SMB of the flash memory FMRY are as follows. Namely, when the flash memory FMRY stores a user program (e.g., an engine control program) and user data (e.g., engine control data), the user data are read out by the CPU in the course of execution of the user program to thereby effect engine control on the basis of the read out data. Thus, the user program contains addresses of a storage area of the flash memory FMRY in which the user data are stored. Therefore, in order to change the user data (i.e., in order to effect the user data tuning) without converting the user program, that is, without rewriting the addresses of the user data contained in the user program, it is necessary, for example, to change the address location of a specified address area of the random access memory RAM in such a manner that the specified address area of the random access memory RAM can be considered, when viewed in the address space of the CPU, as being the same as a predetermined address area of the flash memory FMRY in which the user data to be subjected to tuning are stored.

In other words, for tuning of user data, the addresses of the specified address area of the random access memory RAM are changed to the addresses of an area of the flash memory FMRY in which the user data to be subjected to tuning are stored. When the CPU executing the user program accesses the user data (data being subjected to tuning) in the flash memory FMRY, actually, the flash memory is not accessed but the specified area of the random access memory RAM is accessed.

Figure 63:
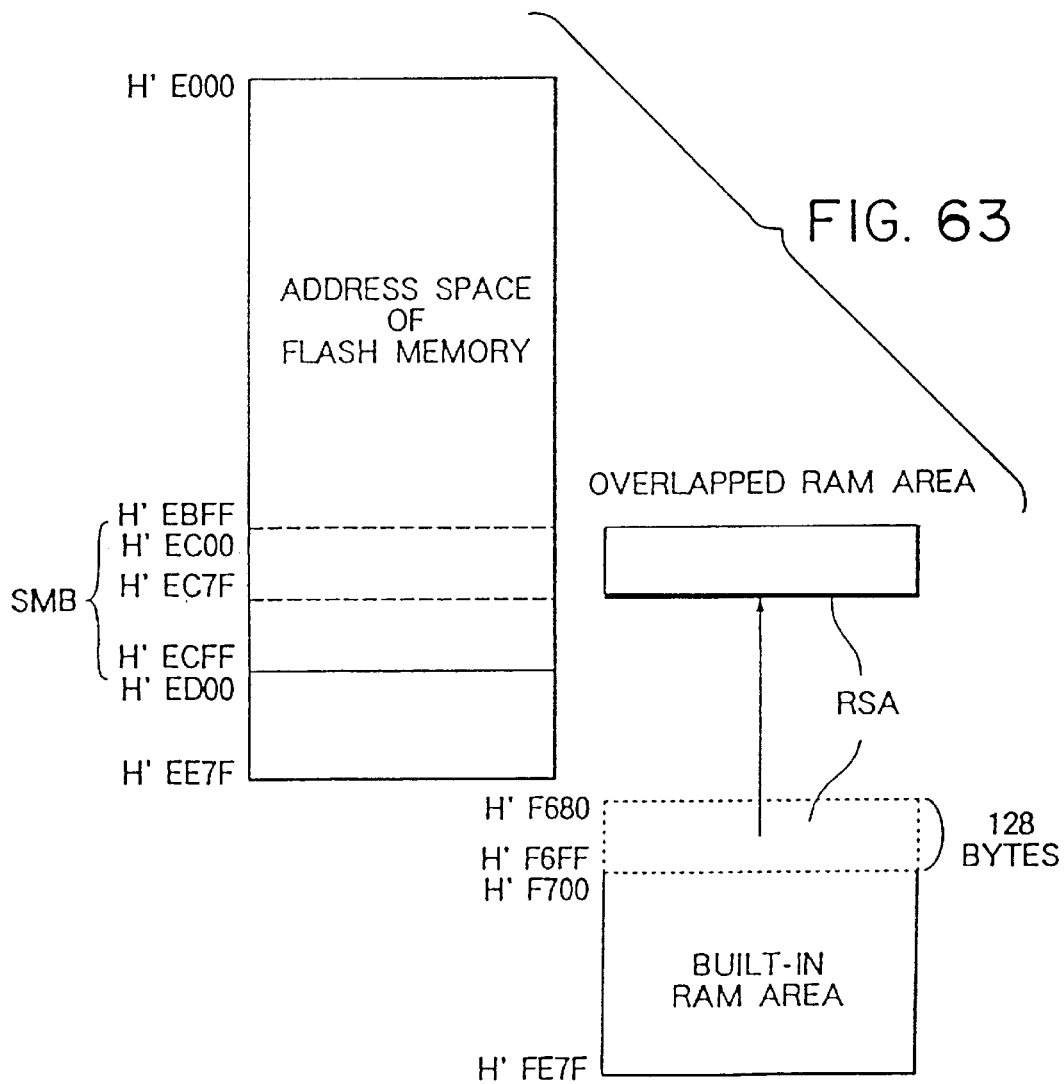
FIG. 63 is a diagram illustrating an overlap of a specified address area of the random access memory with a predetermined address area of the flash memory.

FIG. 63 is a diagrammatic representation of overlap of the specified address area of the random access memory RAM with the predetermined address area of the flash memory FMRY.

For example, as shown in FIG. 63, the address space of the flash memory FMRY is represented to be between hexadecimal addresses E000 and EE7F, and the address space of the random access memory RAM (built-in RAM area) is represented to be between hexadecimal addresses F680 and FE7F. In this figure, "H'" indicates that the addresses are in a hexadecimal representation.

The specified address area (SRA) of the random access memory RAM is, for example, a 128 byte-area having addresses from HF'680 to H'F6FF. When user data tuning is carried out, the addresses of the specified address area (SRA) are, in FIG. 63, overlapped with addresses H'ECOO to H'EC7E of a part of the address area (H'ECOO to H'ECFF) of the small memory block SMB within the address space of the flash memory FMRY.

Such a change of address arrangement can be realized by making the decode logic of the random access memory RAM switchable in response to a predetermined control bit or setting of a flag.

Figure 14:
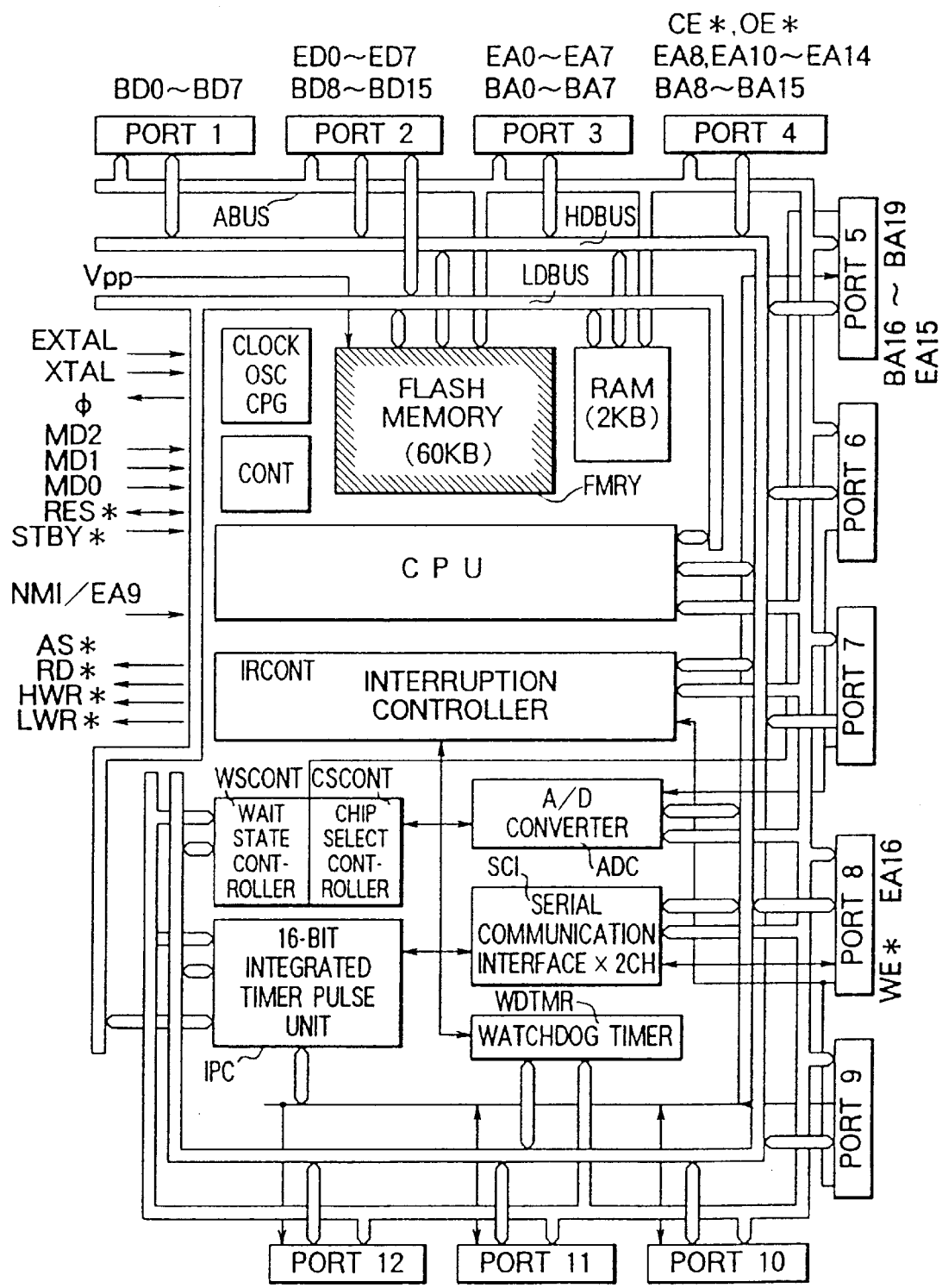
FIG. 14 is a block diagram showing an embodiment of further details of a microcomputer corresponding to the microcomputer of FIG. 1.

Namely, the chip select controller CSCONT shown in FIG. 14 has a RAM control register RAMCR as shown in FIG. 64. This register is an eight bit register which is readable and writable from the CPU and in which each of bits 3 to 0 has an initial value "0" and each of the bits 7 to 4 has an initial value "1". The bits 3 to 0 are made valid when the microcomputer MCU is in a write operation mode. Here, the initial values are those set in the register at the time when the microcomputer is reset.

The bit 3 (RAMS) of the RAM control register RAMCR determines it how the specified address area SRA of the random access memory RAM is utilized, i.e., whether the specified address area SRA of the random access memory is utilized as having its original addresses or as having addresses overlapped with those of a part of the address area of the small address block SMB of the flash memory FMRY.

FIG. 65 illustrates how to set addresses of the specified address area SRA by use of the RAM control register RAMCR. When the RAMS bit is reset to "0", the specified address area SRA is utilized as having its original addresses H'F680 to H'F6FF of the random access memory RAM, while when the RAMS bit is set to "1" with the microcomputer CPU being under write operation mode, the specified address area SRA is utilized as being overlapped with the addresses of a part of the small memory block SMB of the flash memory FMRY.

Bit 2 (RAM2) to bit 0 (RAM0) of the RAM control register RAMCR serve to determine it where in the small memory block SMB of the flash memory FMRY the addresses of the specified area SRA should be overlapped with. When the RAMS bit is reset (cleared) to "0", the values of the bits 2 to 0 are of no significance. Meanwhile, when the RAMS bit is set to "1", the addresses of the specified area SRA are variable depending on the values of the bits 2 to 0.

Namely, the addresses of the specified area SRA are:

H'EC00 to H'EC7F for bits 2 to 0 being "0", "0", "0",

H'EC80 to H'ECFF for bits 2 to 0 being "0", "0", "1",

H'ED00 to H'ED7F for bits 2 to 0 being "0", "1", "0",

H'ED80 to H'EDFF for bits 2 to 0 being "0", "1", "1" and

H'EE00 to H'EE7 F for bits 2 to 0 being "1", "0", "0".

Then, tuning of control data is carried out using the specified address area SRA of the random access memory RAM which is overlapped with the address of the predetermined memory block.

After completion of tuning (step 92), the address overlapping of the random access memory RAM and memory block SMB is released, so that the address arrangement of the random access memory RAM restores its original state (step 93). Namely, the value of the RAMS bit of the RAM control register RAMCR is changed by the CPU from "1" (set state) to "0" (reset or cleared state).

Finally, data having been subjected to tuning which is held in the the specified address area SRA of the random access memory RAM is written by the CPU into the predetermined address area of the memory block SMB of the flash memory FMRY (step 94).

This writing operation is performed by executing the write control program stored in the flash memory FMRY. Namely, data in the small memory block of the flash memory FMRY which data are to be changed or tuned are erased in accordance with the steps of the erase flow chart, as will be later described in detail with reference to FIG. 22. Thereafter, the data having been transferred to the random access memory RAM and having been subjected to the tuning are written by the CPU into the small memory block SMB of the flash memory FMRY (the data being written in the whole of the the small memory block SMB). In other words, the scheme which will be next described in "[7] Making partial rewrite of a memory block efficient" is employed.

Through this, the same data as control data held in the flash memory which has been rewritten on real time base can eventually be set in or obtained on the memory block SMB while operating the system with the microcomputer MCU mounted thereon.

Figure 66:
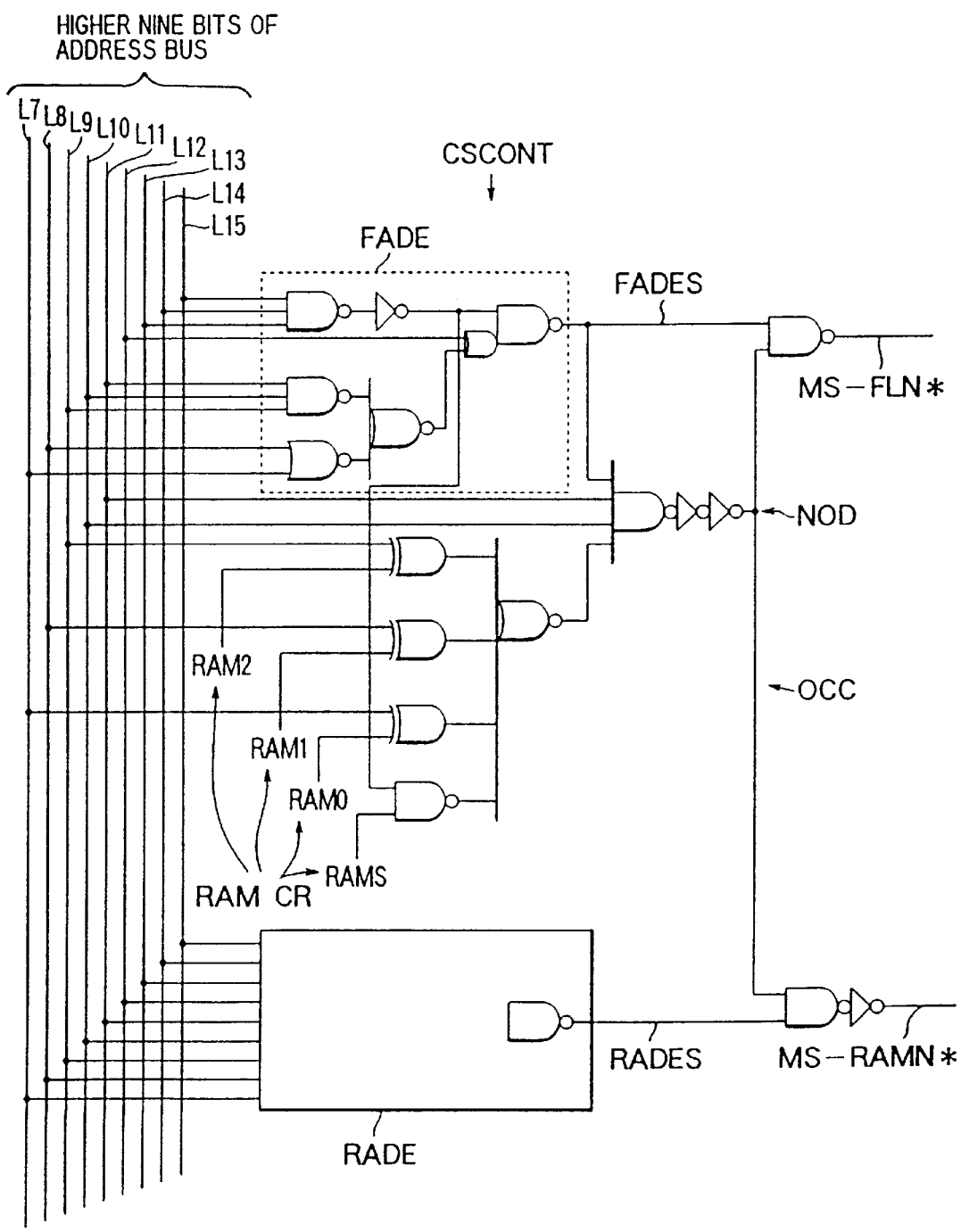
FIG. 66 is a diagram showing an example of a chip select controller.

Subsequently, the microcomputer MCU is switched from the flash memory write operation mode to the normal operation mode by resetting the mode signal MD0 to MD2 or by resetting the rewrite high voltage Vpp to be applied to the external terminal of the microcomputer to 0 volt. FIG. 66 shows an example of a circuit structure of a part of the chip select controller CSCONT in which a RAM address decoder RADE and a flash address decoder FADE are coupled to address bus lines L15 to L7 for the higher bits 15 to 7 of the inner address bus (bit 15 to 0) to decode the address signal on the address bus lines L15 to L7. For example, if the address signal on the lines L15 to L7 represents an address area of the random access memory RAM, the RAM address decoder RADE decodes the signal and makes its output signal RADES high. Meanwhile, if the address signal on the lines L15 to L7 represents an address area of the flash memory FMRY, the flash address decoder FADE decodes the signal and makes its output signal FADES high.

In FIG. 66, the logic circuit OCC other than the RAM address decoder RADE and the flash address decoder FADE serves as means for overlapping the addresses of the predetermined address area of the flash memory FMRY (a part of the small memory block SMB) with addresses of the specified address area of the random access memory RAM, as described above. The RAMS and RAM2 to RAM0 correspond to those of the RAM control register RAMCR described above with reference to FIG. 64.

A specific operation of the circuit shown in FIG. 66 is considered to be readily understood by those skilled in the art and will not be described in detail. With the RAMS bit value being made "1", when the addresses of the predetermined address area of the flash memory FMRY (the addresses overlapped with the addresses of the specified address area SRA of the random access memory RAM) are accessed under the conditions in which the values of RAM2 to RAM0 are made to correspond to one of states (2) to (6) shown in FIG. 65, a detection at a low level indicating that the overlap designation area is accessed appears on a point NOD in FIG. 66. As a result, flash memory select signal MS-FLN* is brought into a high level non-active state and RAM selection signal MS-RAMN* is brought into a low level active state so that the address signal for otherwise accessing the small memory block SMB of the flash memory FMRY now serves to access the specified address area SRA of the random access memory RAM without accessing the small memory block SMB of the flash memory FMRY.

On the other hand, with the RAMS bit value being set to "1", when the address signal on the address lines L15 to L7 indicates an address other than one of the addresses of address areas of the flash memory FMRY represented by bits RAM2 to RAM0 of the RAM control register RAMCR (i.e., other than the address area of one of the addresses represented by one of states (2) to (6) shown in FIG. 65), the detection signal on the node NOD is brought into a high level. As a result, when the address signal on the address bus lines indicates the flash memory FMRY, the flash memory selection signal MS-FLN* is brought into a low level active state so that data is read into the CPU from an address area of the flash memory FMRY specified by the address signal on the address bus lines, while when the address signal on the address bus lines indicates the random access memory RAM, the RAM selection signal MS-RAMN* is brought into a low level active state so that an address area of the random access memory RAM specified by the address signal on the address bus lines is accessed by the CPU for data reading therefrom or data writing thereinto.

[7] Making Partial Rewrite of a Memory Block Efficient

Figure 10:
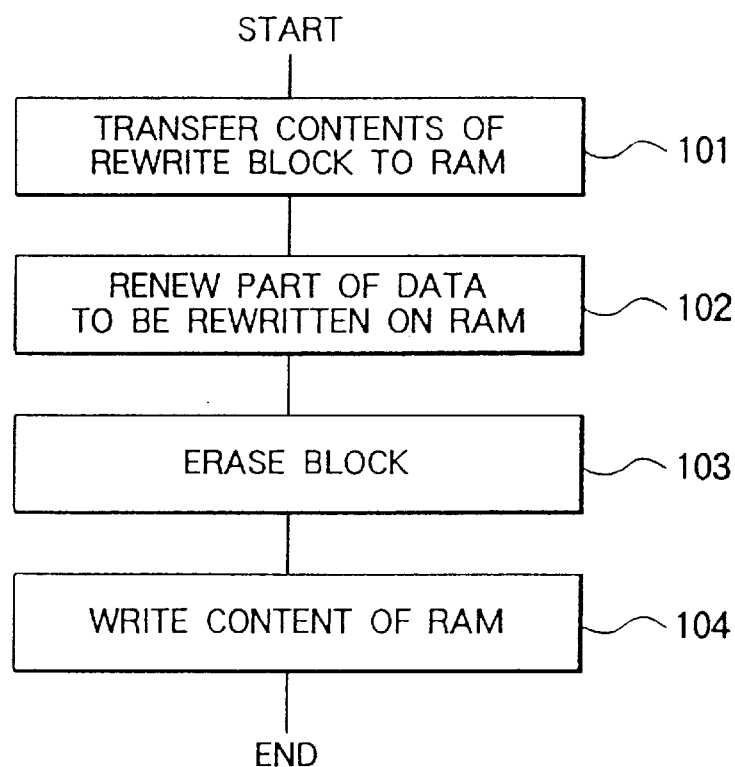
FIG. 10 is a diagram for explaining an example of a manner of making partial rewrite of a memory block of the flash memory efficient.

FIG. 10 shows an example of a technique of making partial rewrite of a memory block of the flash memory efficient. When part of information held in a predetermined memory block of the flash memory is rewritten upon modification of a bug of a program or version-up of the program, information held in the memory block having a smaller storage capacity than that of the RAM is transferred to the built-in RAM (step 101), part of the transferred information is renewed on the RAM (step 102), and after the data in the memory block in question is erased (step 103), the memory block in is rewritten with the renewed information (step 104). Through this, even when one of the memory blocks SMB is erased simultaneously, information held in that memory block SMB can be preserved. Therefore, by receiving only data to be rewritten from the outside and rewriting the data on the RAM, transfer, from the outside, of information not required to be rewritten and held in the flash memory FMRY before rewriting can be unneeded, thus avoiding wastefulness of information transfer for partial rewrite of the memory block. The above description with reference to FIG. 10 will be clear also from the description with reference to FIGS. 63 to 66 made hereinbefore.

[8] The Principle of the Flash Memory

Figure 11A:
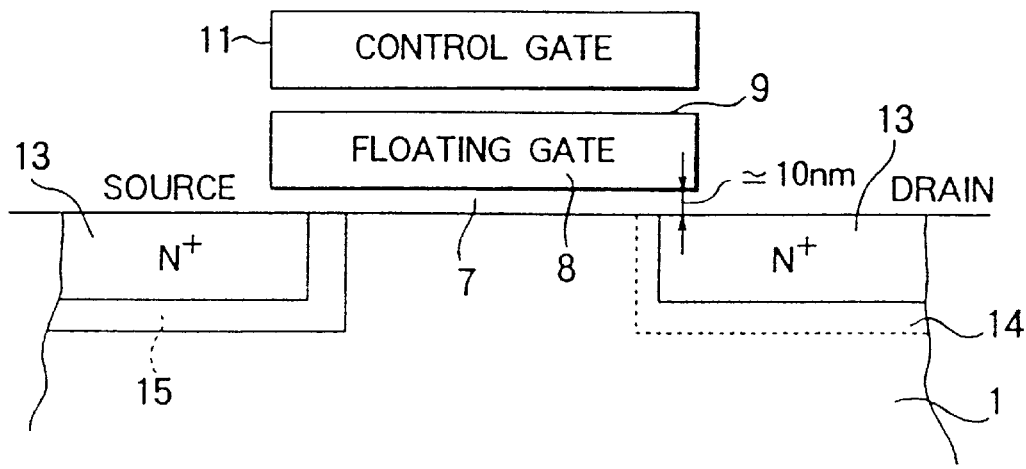
FIGS. 11A and 11B are diagrams for explaining the principle of the flash memory.
Figure 11B:
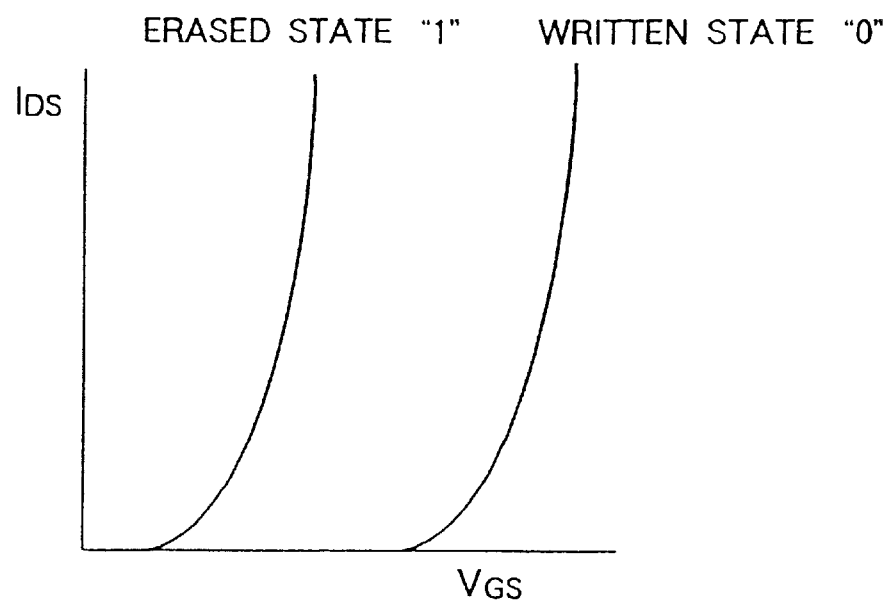

FIGS. 11A and 11B show the principle of the flash memory. A memory cell exemplified in FIG. 11A is constructed of an insulated gate field effect transistor having a two-layer gate structure. In the figure, 1 designates a P type silicon substrate, 14 a P type semiconductor region formed in the silicon substrate 1, 13 an N type semiconductor region and 15 and N type semiconductor region of low concentration. Denoted by 8 is a floating gate formed over the P type silicon substrate 1 through a thin oxide film 7 (for example, having a thickness of 10 nm) serving as a tunnel insulating film and by 11 is a control gate formed over the floating gate 8 through an oxide film 9. A source is formed of 13 and 15 and a drain is formed of 13 and 14. Information stored in this memory cell is substantially held as a change in threshold voltage in the transistor. Described hereinafter is the case where a transistor used in the memory cell to store information (hereinafter referred to as a memory transistor) is of N channel type, except otherwise described.

A write operation of information to the memory cell can be realized by, applying high voltages to, for example, the control gate 11 and drain so that electrons may be injected from the drain side to the floating gate 8 through avalanche injection. As a result of the write operation, the memory transistor assumes a threshold voltage as viewed from its control gate 7 which is raised as shown in FIG. 11B in comparison with that of the memory transistor without subjected to a write operation and so placed in the erase condition.

On the other hand, an erase operation can be realized by applying a high voltage to, for example, the source so that electrons may be drawn out of the floating gate 8 to the source side through tunnel phenomenon. As a result of the erase operation, the memory transistor assumes a threshold voltage as viewed from its control gate 11 which is lowered as shown in FIG. 11B. The threshold of the memory transistor shown in FIG. 11B is set to a positive voltage level in both of the write condition and erase condition. In other words, in relation to a word line selection level applied from a word line to the control gate 11, the threshold voltage for write condition is set to be higher and the threshold voltage for erase condition is set to be lower. Thanks to the fact that both the threshold voltages are related to the word line selection level in a manner described as above, a memory cell can be constructed of a single transistor without employing a selection transistor. When stored information is to be erased electrically, erase of the stored information can be done by drawing electrons stored in the floating gate 8 to the source electrode and therefore, by keeping the erase operation continuing for a relatively long time, electrons which are larger in amount than electrons injected in the floating gate 8 upon a write operation are drawn out. Thus, when electrical erase keeps continuing for a relatively long time, resulting in excessive erase, the threshold voltage of the memory transistor assumes, for example, a negative level and there occurs such inconvenience that a word line is selected even when the word line is at an unselection level. Write can also be effected by utilizing tunnel current as in the case of erase.

In a read operation, to prevent the memory cell from being written weakly, that is, to prevent the floating gate 8 from being injected with undesired carriers, voltages applied to the drain and control gate 11 are limited to relatively low values. For example, a low voltage of about 1V is applied to the drain and a low voltage of about 5V is applied to the control gate 11. Under the application of these voltages, the magnitude of a channel current flowing through the memory transistor is detected so as to decide whether information stored in the memory cell is "0" or "1".

Figure 12:
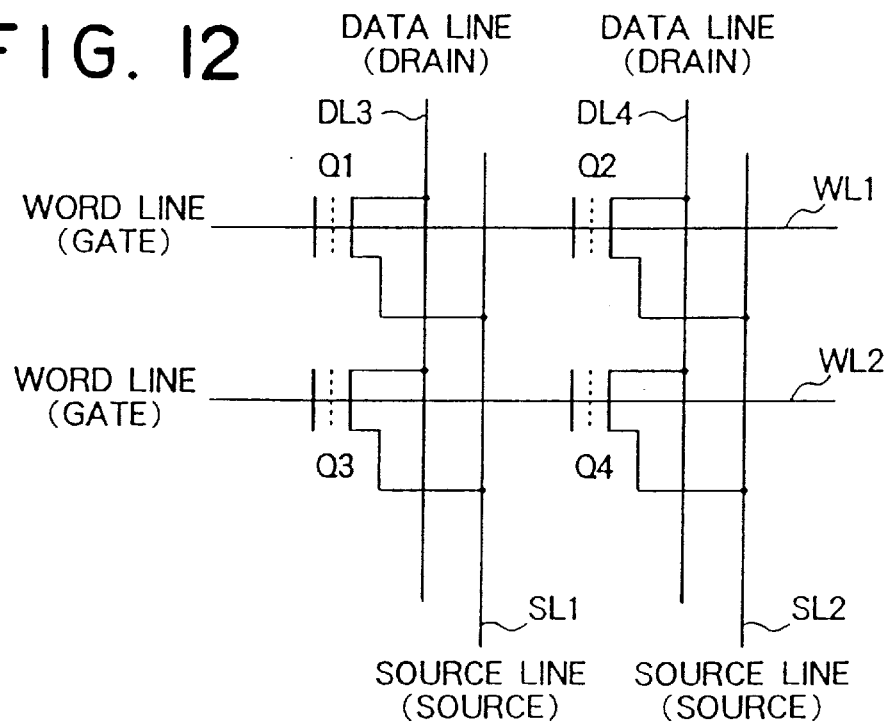
FIG. 12 is a diagram for explaining the principle of construction of a memory cell array using memory transistors of FIGS. 11A and 11B.

FIG. 12 shows the principle of construction of a memory cell array using the memory transistors. In the figure, four memory transistors (memory cells) Q1 to Q4 are typically depicted. In the memory cells arranged in matrix in X and Y directions, control gates (gates for selection of memory cells) of memory transistors Q1 and Q2 (Q3 and Q4) arranged on the same row are connected to a corresponding word line WL1 (WL2), and drain regions (input/output nodes of memory cells) of memory transistors Q1 and Q3 (Q2 and Q4) are connected to a corresponding data line DL1 (DL2). Source regions of the memory transistors Q1 and Q3 (Q2 and Q4) are coupled to a source line SL1 (SL2).

Table 1 shows an example of voltage conditions for erase operation and write operations of memory cells.

TABLE 1

| memory element | selection/ unselection | source | drain | gate |
|---|---|---|---|---|
| writing | | | | |
| Q1 | selection | 0 V | 6 V | 12 V |
| Q2 | unselection | 0 V | 0 V | 12 V |
| Q3 | unselection | 0 V | 6 V | 0 V |
| Q4 | unselection | 0 V | 0 V | 0 V |
| Erasing (positive voltage scheme) | | | | |
| Q1, Q3 | selection | 12 V | 0 V | 0 V |
| Q2, Q4 | unselection | 0 V | 0 V | 0 V |
| Erasing (negative voltage scheme) | | | | |
| Q1, Q2 | selection | 5 V | 0 V | −10 V |
| Q3, Q4 | unselection | 5 V | 0 V | 0 V |

In this table, memory elements mean memory cells and gates mean control gates serving as selection gates of the memory cells. In erase based on a negative voltage scheme shown in the figure, a negative voltage of, for example, −10 V is applied to the control gate to form a high electric field necessary for erase. As is clear from the voltage conditions exemplified in the figure, in erase based on a positive voltage scheme, memory cells at least sources of which are connected in common can be erased collectively. Accordingly, with the source lines SL1 and SL2 connected together in the construction of FIG. 12, the four memory cells Q1 to Q4 an be erased simultaneously. In this case, by changing the number of memory bits connected to the same source line, the size of memory block can be set desirably. As for the source line division scheme, in addition to a typical instance shown in FIG. 12 where the data line is defined as a unit (a common source line is so laid as to extend in the data line direction), there is available an instance where the word line is defined as a unit (a common source line is so laid as to extend in the word line direction). On the other hand, in erase based on the negative voltage scheme, memory cells having control gates connected in common can be erased simultaneously.

Figure 13:
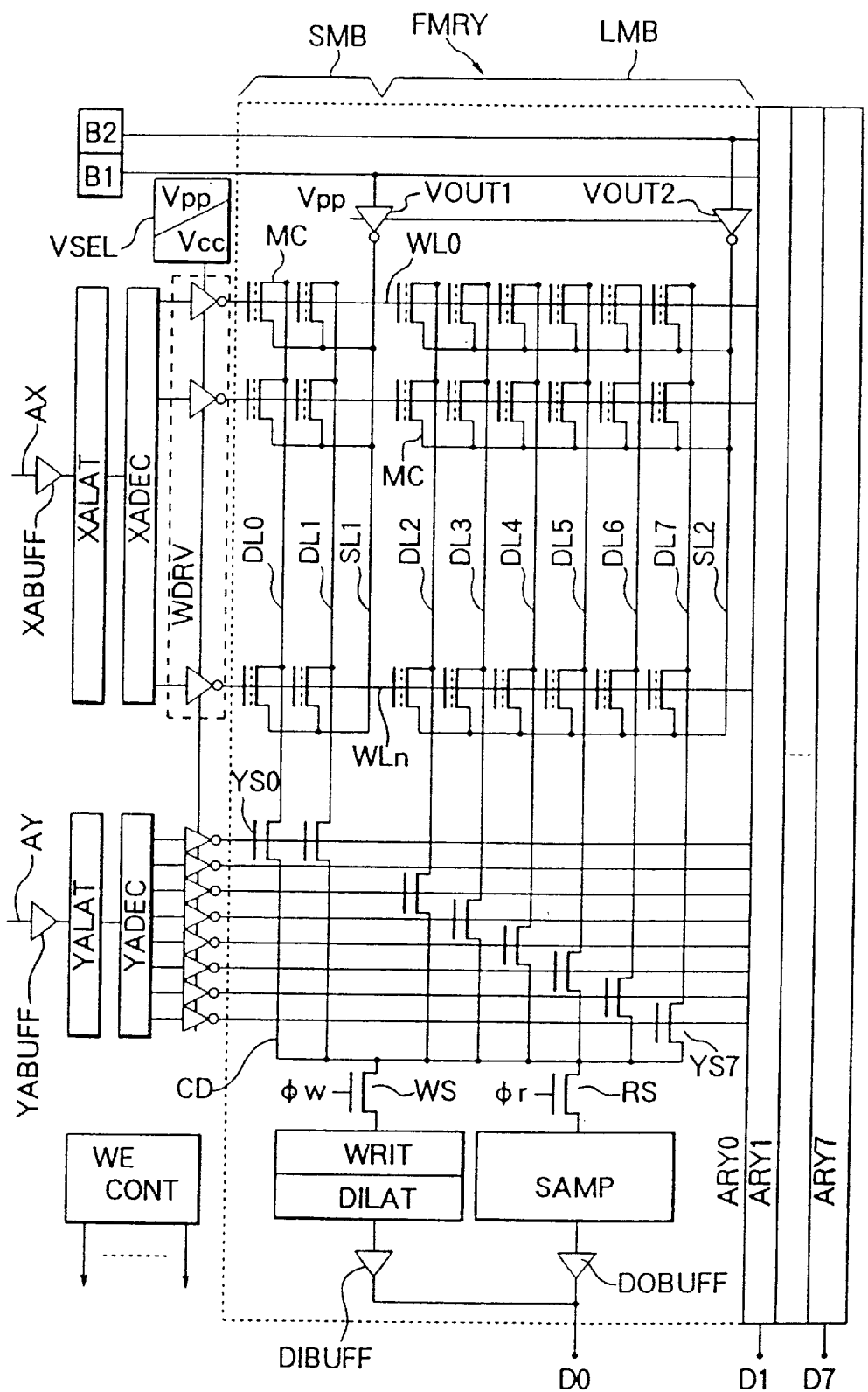
FIG. 13 is a circuit block diagram showing an example of a flash memory in which a plurality of memory blocks are defined each in a unit of data line and having different storage capacities.

[9] Formation of a Plurality of Memory Blocks Having Different Storage Capacities and Defined Each in a Unit of Data Line FIG. 13 is a circuit block diagram showing an example of a flash memory in which storage capacities of simultaneously erasable memory blocks are made to be different.

The flash memory FMRY shown in the figure has data input/output terminals D0 to D7 of 8 bits, so that memory array portions ARY0 to ARY7 are provided in association with the respective data input/output terminals. Each of the memory array portions ARY0 to ARY7 is divided into two of a memory block LMB having a relatively large storage capacity and a memory block SMB having a relatively small storage capacity. In the figure, details of the memory array portion ARY0 are typically illustrated and the other memory array portions ARY1 to ARY7 are constructed similarly.

In each of the memory array portions ARY0 to ARY7, memory cells MC formed of insulated gate field effect transistors of two-layer gate structure as explained previously in connection with FIG. 11 are arranged in matrix. Also, in the figure, WL0 to WLn designate word lines which are common to all of the memory array portions ARY0 to ARY7. Control gates of memory cells arranged on the same row are connected to a corresponding word line. In each of the memory array portions ARY0 to ARY7, drain regions of memory cells MC arranged on the same column are connected to a corresponding data line DL0, . . . or DL7. Source regions of memory cells MC constituting the memory block SMB are connected in common to a source line SL1 and source regions of memory cells MC constituting the memory block LMB are connected in common to a source line SL2.

A high voltage Vpp used for erase is supplied from voltage output circuits VOUT1 and VOUT2 to the source lines SL1 and SL2. An output operation of the voltage output circuits VOUT1 and VOUT2 is selected in accordance with values of bits B1 and B2 of an erase block designation register. For example, by setting "1" to the bit B1 of the erase block designation register, only the memory block SMB of each of the memory array portions ARY0 to ARY7 is allowed to be erased simultaneously. When "1" is set to the bit B2 of the erase block designation register, only the memory block LMB of each of the memory array portions ARY0 to ARY7 is allowed to be erased simultaneously. When "1" is set to both the bits B1 and B2, the whole of the flash memory is allowed to be erased simultaneously.

Selection of the word line WL0, . . . or WLn is effected by causing a row address decoder XADEC to decode a row address signal AX fetched in through a row address buffer XABUFF and a row address latch XALAT. A word driver WDRV selects a word line on the basis of a selection signal delivered out of the row address decoder XADEC. In a data read operation, the word driver WDRV is operated with a power supply as represented by voltage Vcc such as 5 V and earth potential such as 0 V fed from a voltage selection circuit VSEL, and it drives a word line to be selected to a selection level by the voltage Vcc and maintains a word line not to be selected at an unselection level such as earth potential. In a data write operation, the word driver WDRV is operated with a power supply as represented by voltage Vpp such as 12 V and earth potential such as 0 V fed from the voltage selection circuit VSEL and it drives a word line to be selected to a write high voltage level such as 12 V. In a data erase operation, the output of the word driver WDRV is rendered to be a low voltage level such as 0 V.

In each of the memory array portions ARY0 to ARY7, the data lines DL0 to DL7 are connected in common to a common data line CD through column selection switches YS0 to YS7. Switching control of the column selection switches YS0 to YS7 is carried out by causing a column address decoder YADEC to decode a column address signal AY fetched in through a column address buffer YABUFF and a column address latch YALAT. An output selection signal of the column address decoder YADEC is fed in common to all of the memory array portions ARY0 to ARY7. Accordingly, when any one of the output selection signals of the column address decoder YADEC is rendered to be a selection level, a single data line is brought into connection to the common data line CD in each of the memory array portions ARY0 to ARY7.

Data read from a memory cell MC to the common data line is applied to a sense amplifier SAMP through a selection switch RS and the amplified data is delivered to the outside through a data output latch DOLAT and a data output buffer DOBUFF. The selection switch RS is set to a selection level in synchronism with a read operation. Write data fed from the outside is held in a data input latch circuit DILAT through a data input buffer DIBUFF. When data stored in the data input latch circuit DILAT is "0", a write circuit WRIT supplies a write high voltage to the common data line CD through a selection switch WS. This write high voltage is fed to the drain of a memory cell, whose control gate is applied with the high voltage under the direction of a row address signal AX, through a data line selected by a column address signal AY, so that write into the memory cell in question is carried out. The selection switch WS is set to a selection level in synchronism with a write operation. Various timings for write and erase and voltage selection control signals are generated by a write/erase control circuit WECONT.

[10] Details of a Microcomputer Corresponding to FIG. 1

FIG. 14 is a block diagram showing an embodiment of further details of a microcomputer corresponding to the microcomputer of FIG. 1. The microcomputer MCU shown in the figure comprises as the same function blocks as those shown in FIG. 1 a central processing unit CPU, a flash memory FMRY, a serial communication interface SCI, a control circuit CONT and a random access memory RAM. As equivalence to the timer of FIG. 1, the microcomputer comprises a 16-bit integrated timer pulse unit IPU and a watchdog timer WDTMR. Also, as equivalence to the peripheral circuits I/O of FIG. 1, the microcomputer comprises ports PORT1 to PORT12. Further, as the other function blocks, there are provided a clock oscillator CPG, an interruption controller IRCONT, an analog/digital converter ADC and a wait state controller WSCONT. The central processing unit CPU, flash memory FMRY, random access memory RAM and 16-bit integrated timer pulse unit IPU are coupled to an address bus ABUS, a lower data bus LDBUS (for example, 8 bits) and an upper data bus HDBUS (for example, 8 bits). The serial communication interface SCI, watchdog timer WDTMR, interruption controller IRCONT, analog/digital converter ADC, wait state controller WSCONT, chip select controller CSCONT and ports PORT1 to PORT12 are coupled to the address bus ABUS and higher data bus HDBUS.

In FIG. 14, the chip select controller CSCONT, an example of a circuit structure is shown in FIG. 66, serves as means for decoding higher bits (for example, bits 15 to 7) of the address bus (ABUS) to generate a selection signal indicating which address area the address signal on the address bus (ABUS) designates for selection. The chip select controller CSCONT may include a plurality of address area designation registers which are set for designating address areas of the built-in random access memory RAM, address areas of the built-in flash memory, address areas of I/O devices such as a memory and/or a floppy disk controller externally connected to the microcomputer MCU.

When the access speed of the I/O devices such as a memory and/or a floppy disk controller externally connected to the microcomputer is lower than the access speed of the microcomputer, the chip select controller CSCONT decodes the address signal on the address bus to determine whether the address signal is for an access to a low speed memory or an I/O device externally connected to the microcomputer MCU. If so determined, the the chip select controller CSCONT informs the wait state controller WSCONT thereof. As a result, the wait state controller WSCONT inserts one or more wait states in the bus cycle of the microcomputer. Such chip select controller as described above is disclosed, for example, U.S. Pat. No. 5,070,473 issued on Dec. 3, 1991 and assigned to Hitachi Microcomputer Engineering Ltd. and Hitachi, Ltd., the disclosure of which is hereby incorporated by reference.

In FIG. 14, Vpp designates a high voltage for rewrite of the flash memory. EXTAL and XTAL represent signals supplied from a not-shown vibrator, provided externally of the chip of the microcomputer, to the clock oscillator CPG. Denoted by $\phi$ is a synchronizing clock signal delivered from the clock oscillator CPG to the outside. MD0 to MD2 designate mode signals supplied to the control circuit CONT in order to set the first operation mode or the second operation mode upon rewrite of the flash memory FMRY and correspond to the mode signal MODE in FIG. 1. Denoted by RES* is a reset signal and by STBY* is a standby signal, these signals being supplied to the central processing unit CPU and other circuit blocks. NMI designates a non-maskable interrupt signal for applying a non-maskable interruption to the interruption controller ICONT. Other interruption signals, not shown, are applied to the interruption controller ICONT through the ports PORT8 and PORT9. Denoted by AS* is an address strobe signal indicative of validity of an address signal delivered to the outside, by RD* is a read signal for informing the outside of a read cycle, by HWR* is an upper byte write signal for informing the outside of a write cycle of upper 8 bits and by LWR* is a lower byte write signal for informing the outside of a write cycle of lower 8 bits, these signals being access control signals for the outside of the microcomputer MCU.

The ports PORT1 and PORT2 are allotted, though not limitedly, for input/output of data BD0 to BD15 used for the microcomputer MCU to access the outside in the other mode than the second operation mode in which the external PROM writer performs direct rewrite control of the flash memory FMRY. At that time, the ports PORT3 to PORT5 are allotted, though not limitedly, for address signals BA0 to BA19.

On the other hand, when the second operation mode is set in the microcomputer MCU, the ports PORT2 to PORT5 and PORT8 are allotted, though not limitedly, for connection to the PROM writer adapted to control write of the flash memory FMRY. More specifically, the port PORT2 is allotted for input/output of data ED0 to ED7 for write and verify and the ports PORT3 to PORT5 and PORT8 are allotted for input of address signals EA0 to EA16 as well as input of access control signal CE* (chip enable signal), OE* (output enable signal) and WE* (write enable signal). The chip enable signal CE* is an operation selection signal for the flash memory FMRY delivered from the PROM writer, the output enable signal OE* is a designation signal of an output operation for the flash memory FMRY and the write enable signal WE* is a designation signal of a write operation for the flash memory FMRY. For inputting one-bit EA9 of address signals EA0 to EA16, the input terminal of the signal NMI is allotted. External terminals of the thus allotted ports and other necessary external terminals including the application terminal of high voltage Vpp are connected to the general purpose PROM writer through the conversion socket SOCKET explained in connection with FIG. 3. Conveniently, the allotment of the external terminals at that time can be done in the form of such a terminal arrangement that the microcomputer MCU can be connected with ease to the PROM writer PRW through the conversion socket SOCKET. The external terminals allotted for connection to the PROM writer PRW in the second operation mode are assigned with other functions in the other operation mode of the microcomputer MCU.

Figure 15:
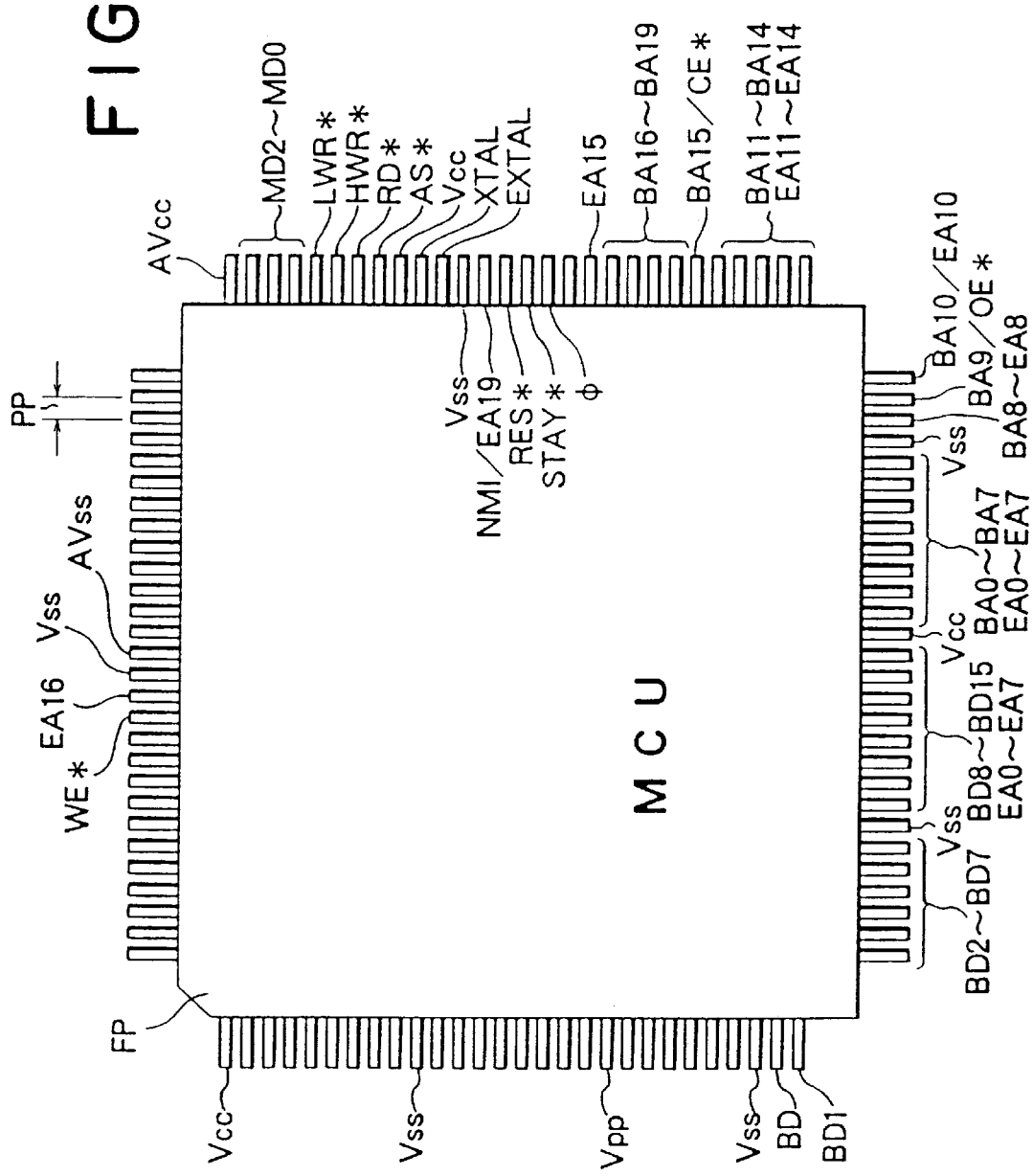
FIG. 15 is a plan view showing the packaged state of the microcomputer of FIG. 14.

FIG. 15 shows a top view of a flat package of the FIG. 14 microcomputer MCU which is, for example, sealed with resin and designed to have external terminals in four directions. Signals shown in FIG. 15 are identical to those shown in FIG. 14. External terminals (pins) not assigned with signal names may be utilized as an input pin of a wait signal, an input pin of a bus request signal, an output pin of a bus acknowledge signal and input/output pins for signals between such a peripheral circuit as serial communication interface SCI and the outside.

In the package FP shown in FIG. 15, the distance PP between adjacent terminals (pins) led from the package FP may be 0.5 mm or less. To explain, consider that a user of the microcomputer MCU connects the flash memory FMRY included in the microcomputer MCU to the PROM writer PRW through the conversion socket SOCKET so as to write data into the flash memory FMRY. In this case, when the distance between adjacent terminals (pin pitch) PP of the package FP is set to be 0.5 mm or less, pin bends due to unwanted contact between external terminals of the conversion socket SOCKET and those of the package FP tend to occur when the package FP is inserted into the conversion socket SOCKET. In the event that such pin bends take place, electrical connection between terminals of the conversion socket SOCKET and those of the package FP is prevented in respect of terminals suffering from the pin bends, thus making it impossible to write data into the flash memory FMRY by means of the PROM writer PRW.

As far as this point is concerned, according to the invention, the central processing unit CPU is allowed to write data into the flash memory FMRY and therefore, after the package of the microcomputer MCU is mounted on a mounting board (printed board), the user can write data in the flash memory FMRY by means of the central processing unit CPU without using the external PROM writer PRW for write of data into the flash memory FMRY, whereby even when the microcomputer MCU is sealed in the package having the pin pitch which is 0.5 mm or less, the user can be relieved from committing lead bends of external terminals led from the package. It is to be noted that in the semiconductor maker, an automatic handler can be used and therefore a test of the microcomputer MCU can be conducted steadily and without causing pin bends even if the microcomputer MCU is sealed in the package of the pin pitch being 0.5 mm or less.

[11] A Control Circuit for Rewrite of Flash Memory FMRY

Figure 16:
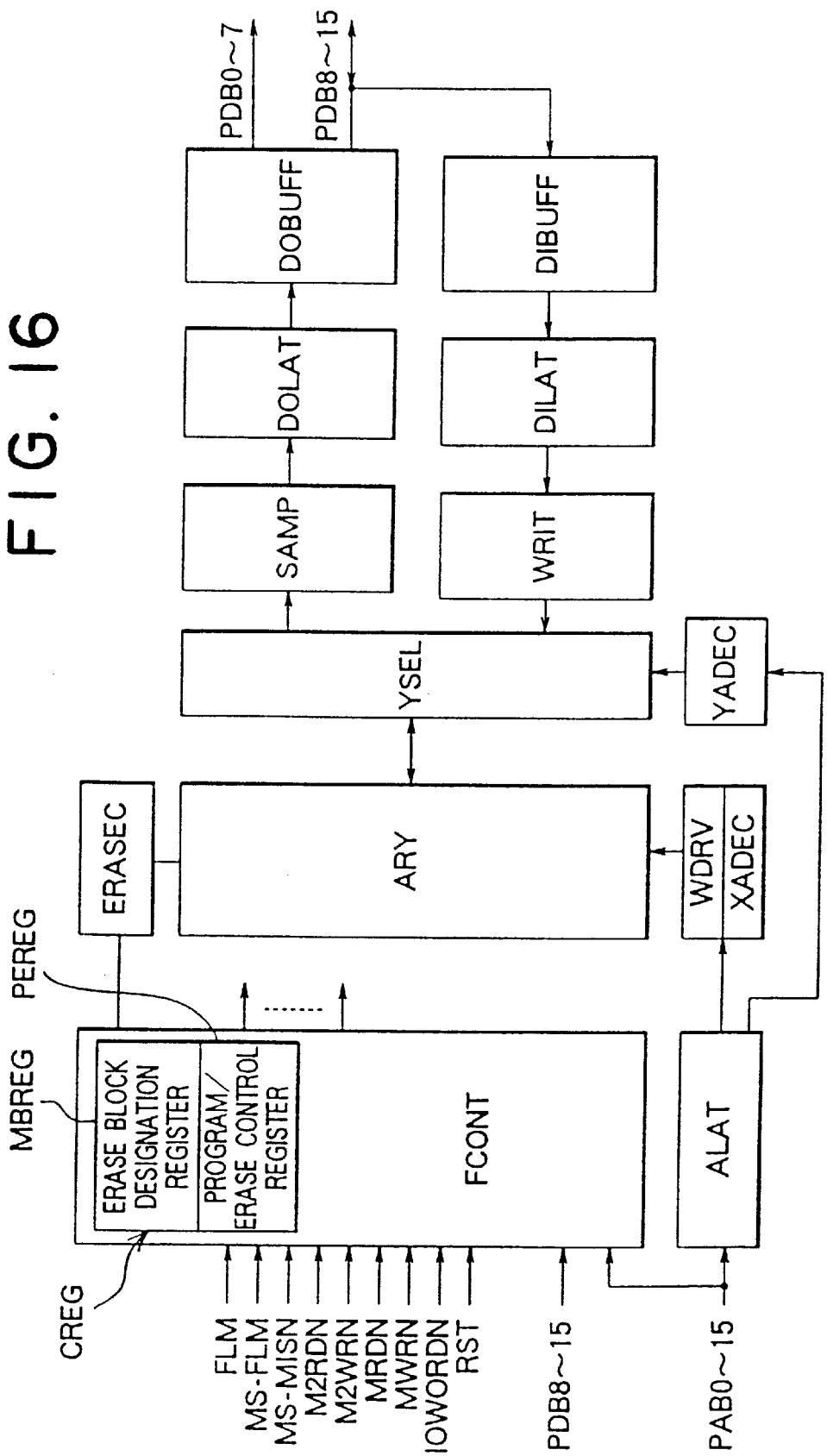
FIG. 16 is a block diagram showing the whole of the flash memory incorporated in the microcomputer of FIG. 14.
Figure 17:
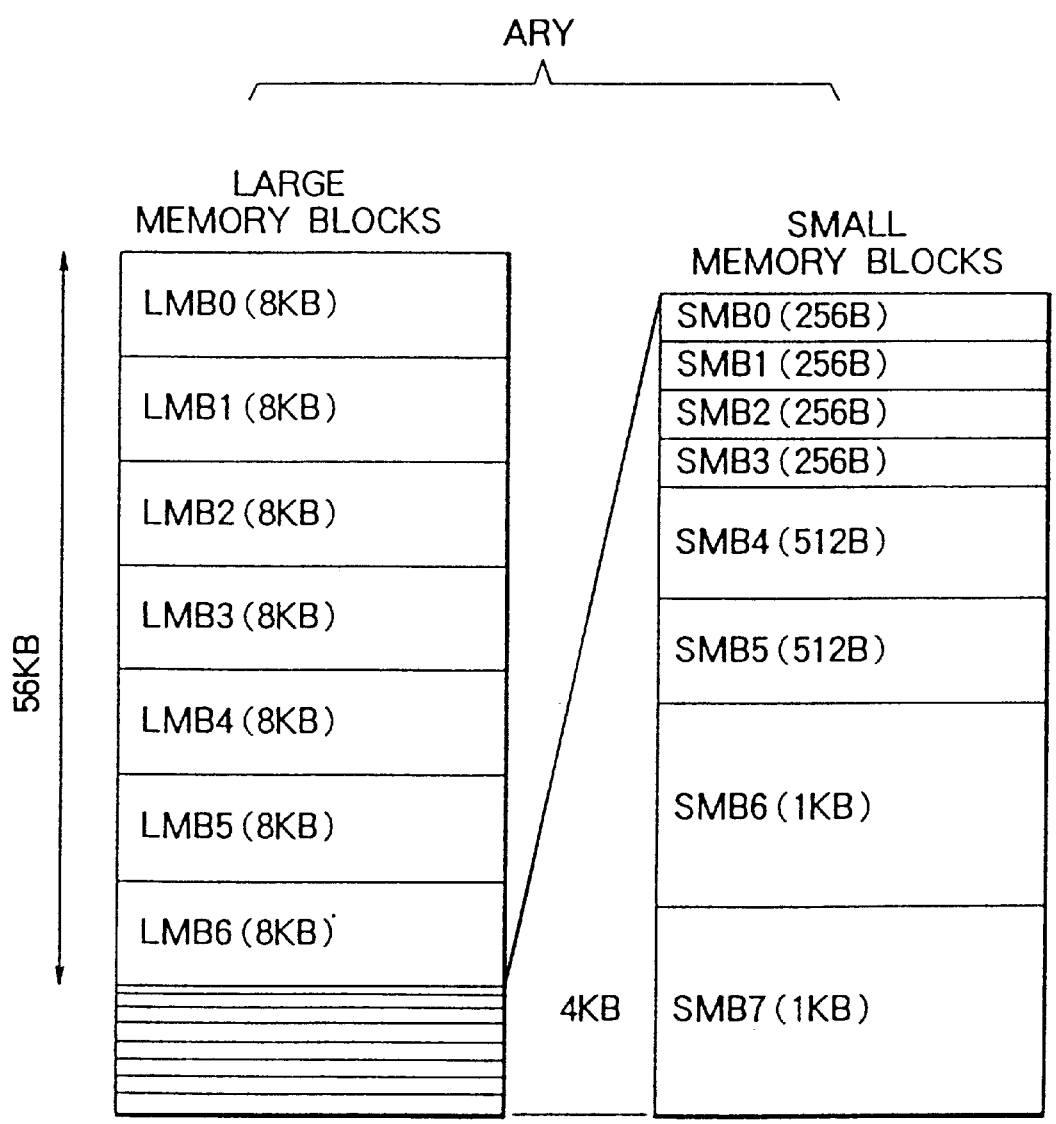
FIG. 17 is a diagram for explaining an example of division into memory blocks.

FIG. 16 is a block diagram showing the whole of the flash memory FRMY incorporated in the microcomputer MCU of FIG. 14. In the figure, ARY designates a memory array in which memory cells formed of insulated gate field effect transistors of two-layer gate structure explained in connection with Figs 11A and 11B are arranged in matrix. In this memory array ARY, like the construction explained with reference to FIG. 13, control gates of memory cells are connected to a corresponding word line, drain regions of memory cells are connected to a corresponding data line and source regions of memory cells are connected to a source line common to each memory block, but the array is divided into memory blocks in a different manner from FIG. 13. For example, as shown in FIG. 17, the array is divided into seven large memory blocks (large blocks) LMB0 to LMB6 each having a relatively large storage capacity and eight small memory blocks (small blocks) SMB0 to SMB7 each having a relatively small storage capacity. The large memory block is utilized as, for example, a program storing area or a large capacity data storing area. The small memory block is utilized as, for example, a small capacity data storing area.

In FIG. 16, ALAT designates a latch circuit for address signals PAB0 to PAB15. In the first operation mode, the address signals PAB0 to PAB15 correspond to output address signals BA0 to BA15 of the central processing unit CPU. In the second operation mode, the address signals PAB0 to PAB15 correspond to output address signals EA0 to EA15 of the PROM writer PRW. XADEC designates a row address decoder for decoding a row address signal fetched in through the address latch ALAT. WDRV designates a word driver for driving a word line on the basis of a selection signal delivered out of the row address decoder XADEC. In a data read operation, the word driver WDRV drives the word line with a voltage of 5 V and in a data write operation, drives the word line with a high voltage of 12 V. In a data erase operation, all outputs of the word driver WDRV are rendered to be a low voltage level of 0V. YADEC designates a column address decoder for decoding a column address signal fetched in through the address latch YALAT. YSEL designates a column selection circuit for selecting a data line in accordance with an output selection signal of the column address decoder YADEC. SAMP designates a sense amplifier for amplifying a read signal from a data line selected by the column selection circuit YSEL in a data read operation. DOLAT designates a data output latch for holding an output of the sense amplifier. DOBUFF designates a data output buffer for delivering data held in the data output latch DOLAT to the outside. In the figure, PDB0 to PDB7 are data of lower 8 bits (one byte) and PDB8 to PDB15 are data of upper 8 bits. In accordance with this example, the output data is of two bytes at maximum. DIBUFF designates a data input buffer for fetching write data fed from the outside. The data fetched in by the data input buffer DIBUFF is held in a data input latch circuit DILAT. When the data held in the data input latch circuit DILAT is "0", a write circuit WRIT supplies a write high voltage to a data line selected by the column selection circuit YSEL. This write high voltage is supplied to the drain of a memory cell whose control gate is applied with a high voltage in accordance with a row address signal, so that the memory cell in question undergoes write.

ERASEC designates an erase circuit for supplying an erase high voltage to a source line of a designated memory block to erase the memory block simultaneously.

FCONT designates a control circuit for performing timing control of a data read operation and selection control of various timings and voltages for write and erase. This control circuit FCONT comprises a control register CREG including the erase block designation register MBREG and the program/erase control register PEREG.

Figure 18:
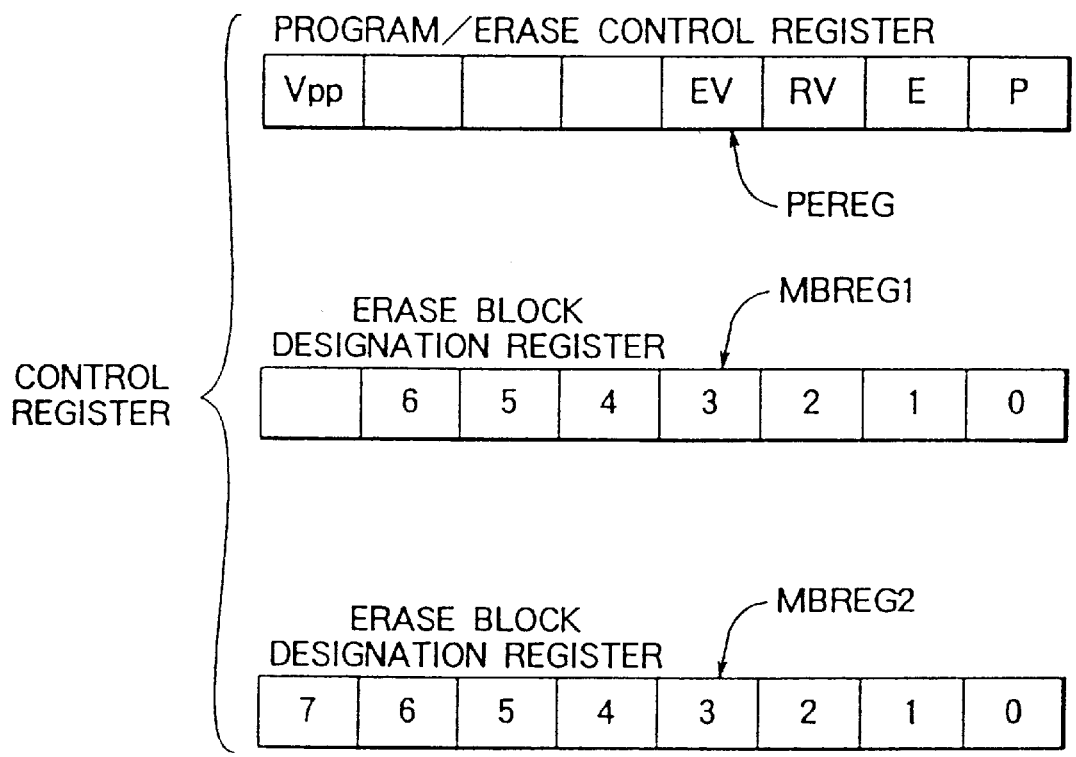
FIG. 18 is a diagram for explaining an example of a control register.

FIG. 18 shows an example of the control register CREG. The control register CREG includes a program/erase control register PEREG of 8 bits and erase block designation registers MBREG1 and MBREGG2 each being of 8 bits. In the program/erase control register PEREG, Vpp represents a high voltage applying flag which is rendered to be "1" in accordance with the application of a rewrite high voltage. An E bit is a bit for designating an erase operation and an EV bit is a bit for designating a verify operation for erasure. A P bit is a bit for designating a write operation (program operation) and a PV bit is a bit for designating a verify operation for writing. The erase block designation register MBREG1 is a register for designating any one of memory blocks contained in the seven divisions of large block and the erase block designation register MBREG2 is a register for designating any one of memory blocks contained in the eight divisions of small block, each of these registers having 0-th bit to seventh bit which are bits for designating individual memory blocks whereby, for example, bit "1" signifies selection of a corresponding memory block and bit "0" signifies unselection of a corresponding memory block. For example, when the seventh bit of the erase block designation register is "1", the small memory block SMB7 is designated.

The control register CREG is readable/writable from the outside. The control circuit FCONT makes reference to the contents set in the control register CREG to control erase and write in accordance with the contents. The operation state of erase and write can be controlled by the CPU or externally by rewriting the contents of the control register CREG.

In FIG. 16, the control circuit FCONT is supplied with control signals of FLM, MS-FLM, MS-MISN, M2RDN, M2WRN, MRDN, MWRN, IOWOTDN and RST and is also supplied with data of PDB8 to PDB15 of upper one byte and predetermined bits of address signals PAB0 to PAB15.

The control signal FLM is a signal for designating an operation mode of the flash memory FMRY whereby its "0" designates the first operation mode and its "1" designates the second operation mode. This signal FLM is formed on the basis of, for example, the mode signals MD0 to MD2.

The control signal MS-FLN is a selection signal of the flash memory FMRY whereby its "0" designates selection and its "1" designates unselection. In the first operation mode, the central processing unit CPU delivers the control signal MS-FLN and in the second operation mode, the control signal MS-FLM corresponds to a chip enable signal CE* supplied from the PROM writer PRW.

The control signal MS-MISN is a selection signal of the control register CREG. In this case, selection of which one of the program/erase control register PEREG, erase block designation register MBREG1 and erase block register MBREG2 is determined by consulting predetermined bits of the address signals PAB0 to PAB15. In the first operation mode, the central processing unit CPU delivers the control signal MS-MISN. In the second mode, the most significant address bit EA16 delivered out of the PROM writer PRM is deemed as the control signal MS-MISN, though not limitedly.

The M2RDN is a memory read strobe signal, the M2WRN is a memory write strobe signal, the MRDN is a read signal of the control register CREG and the MWRN is a write signal of the control register CREG. In the first operation mode, the central processing unit CPU delivers these control signals. In the second operation mode, though not limitedly, a write enable signal WE* supplied from the PROM writer PRW is deemed as the M2WRN and MWRN and an output enable signal OE* supplied from the PROM writer is deemed as the M2RDN and MRDN. The memory write strobe signal M2WRN is deemed as a strobe signal for writing data to be written in a memory cell into the data input latch circuit DILAT. Practically, write into the memory cell is started by setting a P bit of the control register CREG.

IOWORDN is a signal for switching access to the flash memory FMRY between 8-bit read access and 16-bit read access. In the second operation mode, this control signal IOWORDN is fixed to a logical value for designating the 8-bit read access.

RST is a reset signal for the flash memory FMRY. When the flash memory FMRY is reset by this signal RST or when the Vpp flag of program/erase control register PEREG is rendered to be "0", the mode setting bits EV, PV, E and P in the program/erase control register PEREG are cleared.

Figure 19:
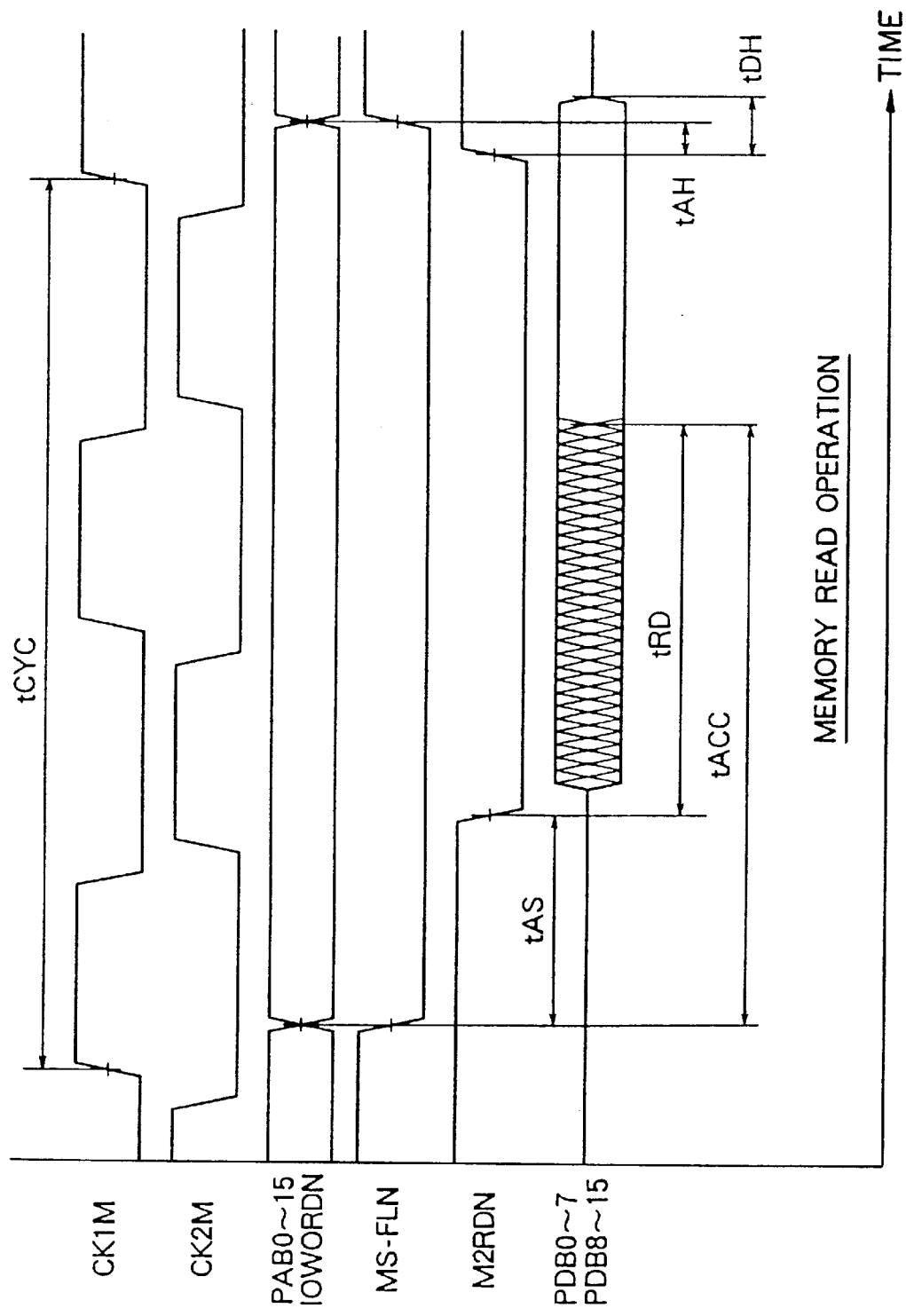
FIG. 19 is a timing chart showing an example of a memory read operation in the flash memory.

FIG. 19 is a timing chart showing an example of a memory read operation in the flash memory FMRY. In the figure, CK1M and CK2M are non-overlap 2-phase clock signals which are deemed as operation reference clock signals. Denoted by tCYC is cycle time which differs only slightly from access time for the RAM. A read operation of the control register CREG is carried out at similar timings.

Figure 20:
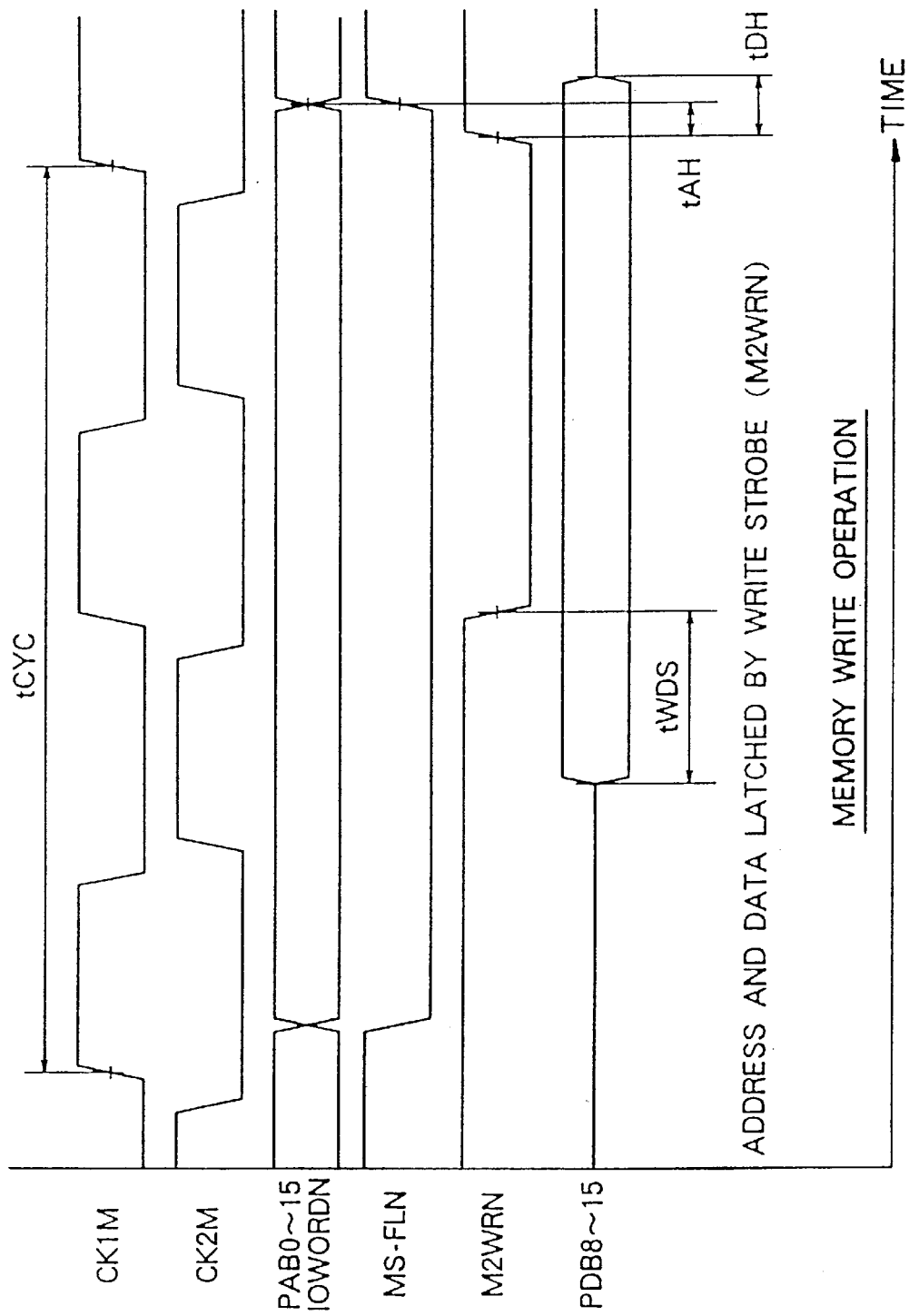
FIG. 20 is a timing chart showing an example of a memory write operation in the flash memory.

FIG. 20 is a timing chart showing an example of a memory write operation in the flash memory FMRY. In a memory write operation designated by a write strobe signal M2WRN shown in the figure, actual write of a memory cell is not carried out as described previously but input address signals PAB0 to PAB15 are held in the address latch circuit ALAT and input data of PB8 to PB15 is held in the data input latch DILAT, thus completing a write cycle of interest. A write operation of the control register CREG is conducted at similar timings but in this case, actual data write into the control register CREG is carried out.

[12] Details of the Rewrite Control Procedure of the Flash Memory FMRY

In this item, an example of details of the control procedure will be described in which the central processing unit CPU or the PROM writer performs write and erase of the flash memory through the control circuit FCONT. Basically, in the flash memory, information is written into a memory cell under the erase condition. In the first operation mode in which rewrite of the flash memory is effected with the microcomputer mounted on the system, a rewrite control program to be executed by the central processing unit CPU includes a program for erase and a program for write. The rewrite control program can be programmed such that an erase process routine is initially executed and a write process routine is automatically executed without interruption in accordance with designation of the first operation mode. Alternatively, erase and write may be separated and then the first operation mode may be designated thereto separately. Rewrite control by the PROM writer can be executed through a similar operation to that of the first operation mode. The write control procedure and erase control procedure will now be described.

Figure 21:
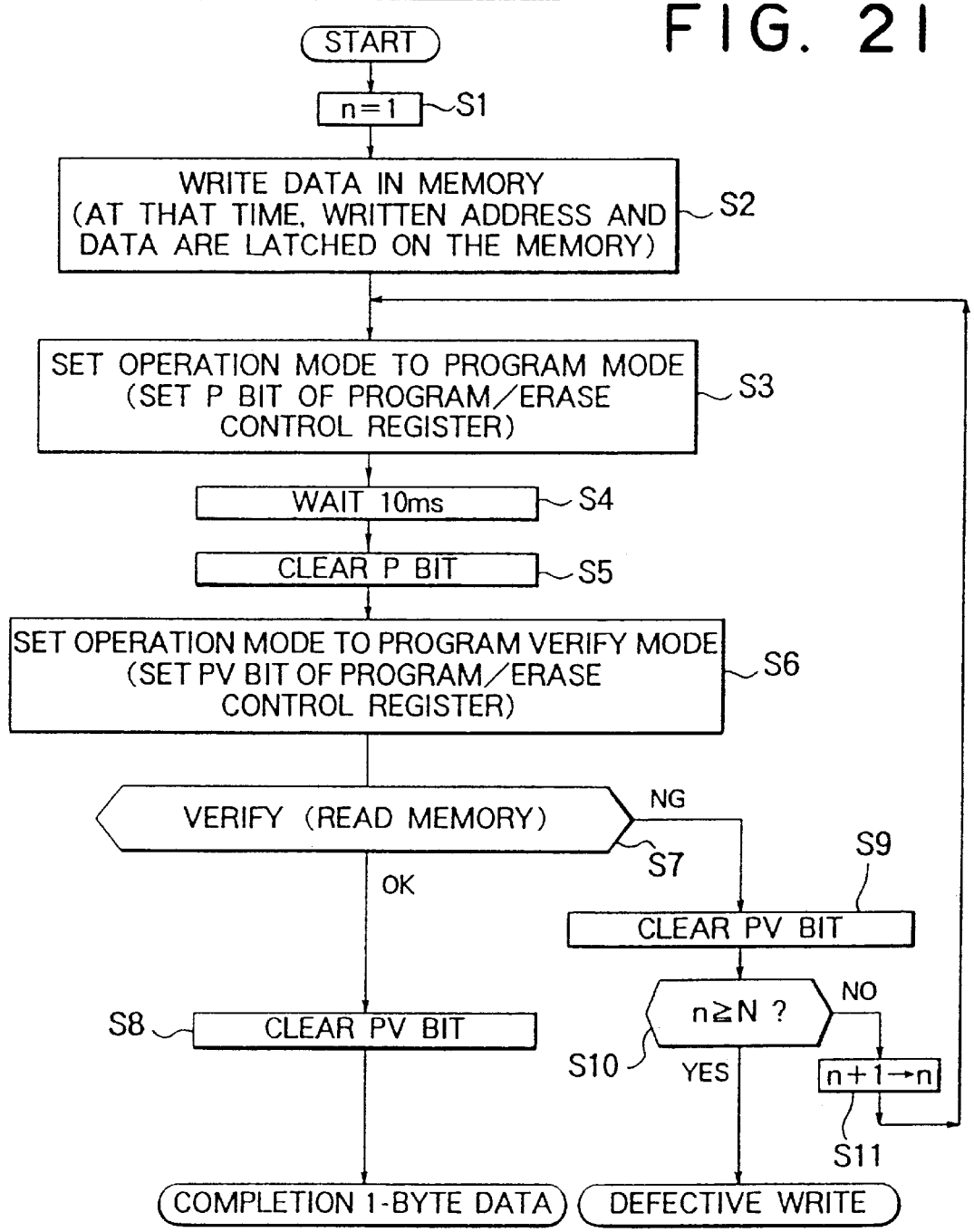
FIG. 21 is a flow chart showing an example of details of the write control procedure.

FIG. 21 shows an example of details of the write control procedure. The procedure shown in the figure is the procedure for write of data of, for example, one byte and is common to both of the control by the central processing unit CPU in the first operation mode and the control by the PROM writer in the second operation mode. The following description will be given by way of a control master which is represented by the central processing unit CPU.

In the initial step of data write in a unit of byte, the central processing unit CPU sets one to a counter n built therein (step S1). Subsequently, the central processing unit CPU performs the memory write operation explained in connection with FIG. 20 to set data to be written in the flash memory FMRY to the data input latch circuit DILAT shown in FIG. 16 and set an address to be written with the data to the address latch circuit ALAT (step S2). Then, the central processing unit CPU issues a write cycle to the control register CREG to set a program bit P (step 3). Through this, the control circuit FCONT applies, on the basis of the data and address set in the step 2, high voltages to the control gate and the drain of a memory cell designated by the address to perform write. The central processing unit CPU waits for, for example, 10 μsec. to clear the write process time on the flash memory side (step S4) and then clears the program bit P (step S5).

Thereafter, in order to confirm the write state, the central processing unit CPU issues a write cycle to the control register CREG and sets a program verify bit PV (step 6). Through this, the control circuit CONT utilizes the address set by the step 2 to apply a verify voltage to a word line to be selected by that address and to read data from the memory cell subjected to write. To ensure a sufficient write level, the verify level voltage is set to a voltage level of, for example, 7 V which is higher than the power supply voltage Vcc such as 5 V. Thus, the central processing unit CPU checks coincidence of read-out data with data utilized for write (step S7). If the central processing unit CPU confirms coincidence through verify, it clears the program verify bit PV (step S8), thus completing write of the one-byte data.

On the other hand, if the central processing unit CPU confirms non-coincidence through verify by step S7, it clears the program verify bit PV in step S9 and thereafter decides whether the value of counter n reaches a write retry upper-limit frequency N (step S10). Thus, if the write retry upper-limit frequency N is reached, defective write is determined and the processing ends. If the write retry upper-limit frequency N is not reached, the central processing unit CPU increments the value of counter n by one (step S11) and repeats the processing beginning with the step S3.

Figure 22:
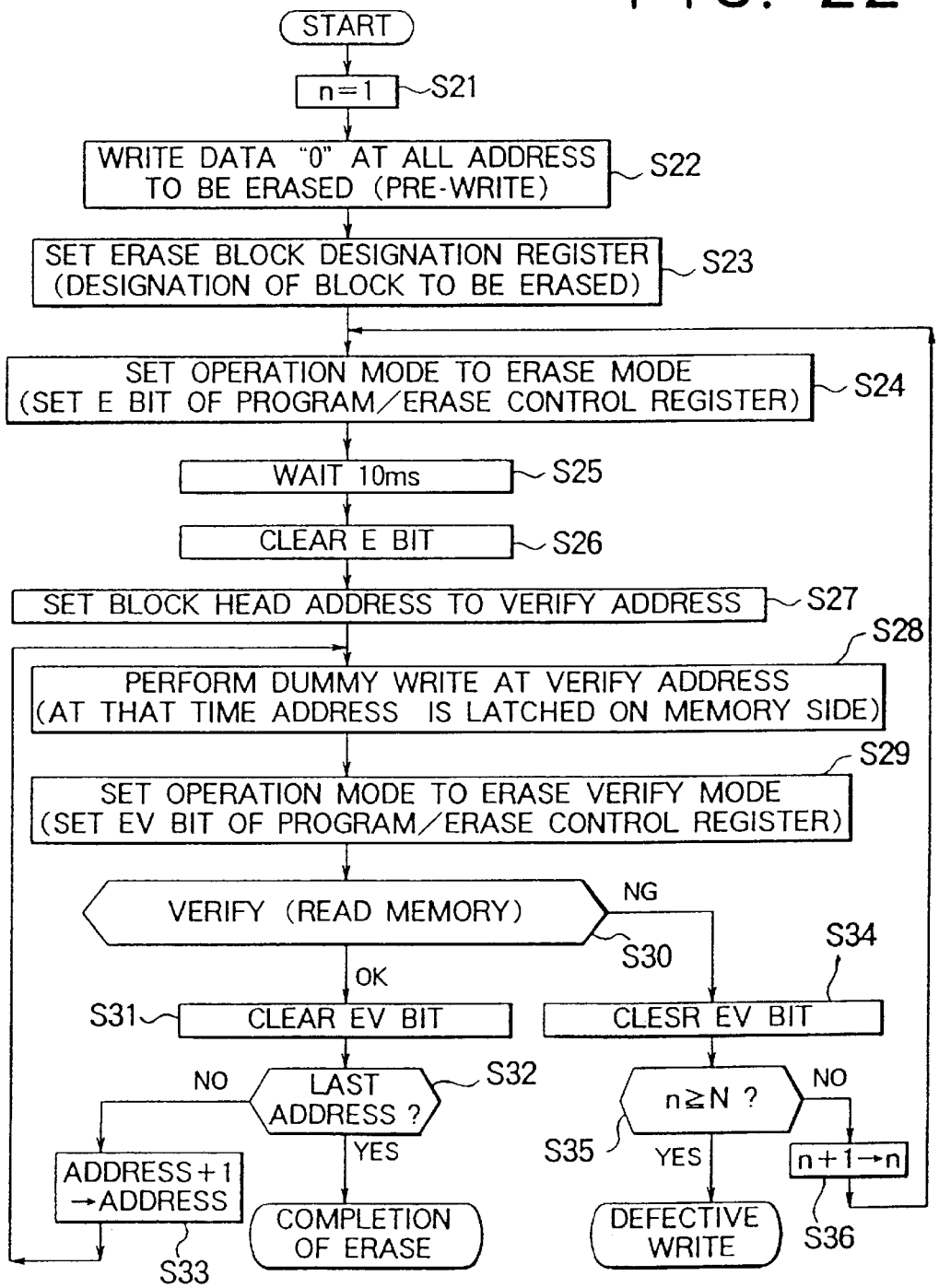
FIG. 22 is a flow chart showing an example of details of the erase control procedure.

FIG. 22 shows an example of details of the erase control procedure. The procedure shown in the figure is common to both of the control by the central processing unit CPU in the first operation mode and the control by the PROM writer in the second operation mode. The following description will be given by way of a control master which is represented by the central processing unit CPU.

Upon erase, the central processing unit CPU sets one to its built-in counter n (step S21). Subsequently, the central processing unit CPU performs pre-write of memory cells within an area to be erased (step S22). Namely, data "0" is written in a memory cell at an address to be erased. The control procedure for pre-write may make use of the write control procedure explained with reference to FIG. 21. This pre-write processing is carried out in order to uniform, over all bits, electric charge amounts present in the floating gates before erasing, thus making the erase state uniform.

Subsequently, the central processing unit CPU issues a write cycle to the control register CREG to designate a memory block to be erased simultaneously (step S23). More particularly, a memory block number to be erased is designated to the erase block designation registers MBREG1 and MBREG2. After the designation of the memory block to be erased, the central processing unit CPU issues a write cycle to the control register CREG to set an erase bit E (step 24). Through this, the control circuit ECONT applies a high voltage to a source line of the memory block designated by the step 23 to erase the memory block of interest simultaneously. The central processing unit CPU waits for, for example, 10 msec. to clear the batch erasing process time on the flash memory side (step S25). A time duration of 10 msec. is shorter than the time for completing one erase operation. Then, the erase bit E is cleared (step S26).

Thereafter, in order to confirm the erase state, the central processing unit CPU first sets internally a head address of the memory block to be erased simultaneously as an address to be verified (step S27) and then performs dummy write to the verify address (step S28). Namely, a memory write cycle is issued to the address to be verified. Through this, the memory address to be verified is held in the address latch circuit ALAT. Subsequently, the central processing unit CPU issues a write cycle to the control register CREG and sets an erase verify bit EV (step 29). Through this, the control circuit FCONT utilizes the address set by the step 28 to apply an erase verify voltage to the word line to be selected by the address and to read data of the erased memory cell. To ensure a sufficient erase level, the erase verify voltage is set to a voltage level of, for example, 3.5 V which is lower than the power supply voltage Vcc such as 5 V. Thus, the central processing unit CPU verifies coincidence of read-out data with data under the erase completion state (step S30). If the central processing unit CPU confirms coincidence through verify, it clears the erase verify bit EV (step S31) and then decides whether the present verify address is a final address of the erased memory block (step S32), thus completing a series of erase operations if the final address is identified. If the final address is not reached, the central processing unit CPU increments the verify address by one (step S33) and repeats the processing beginning with the step S29.

On the other hand, if the central processing unit CPU confirms non-coincidence through verify by step S30, it clears the erase verify bit EV in step S34 and thereafter decides whether the value of counter n reaches a gradual erase upper-limit frequency N (step S35). If the gradual erase upper-limit frequency N is reached, a defective erase is determined and the processing ends. If the gradual erase upper-limit is not reached, the central processing unit CPU increments the value of counter n by one (step S36) and repeats the processing beginning with step S24. Practically, in order to prevent an excessive erase in which the threshold voltage of the memory cell assumes a negative value owing to erase effected excessively, erase is gradually repeated for a short time of 10 msec while performing verify every frequency.

Figure 24:
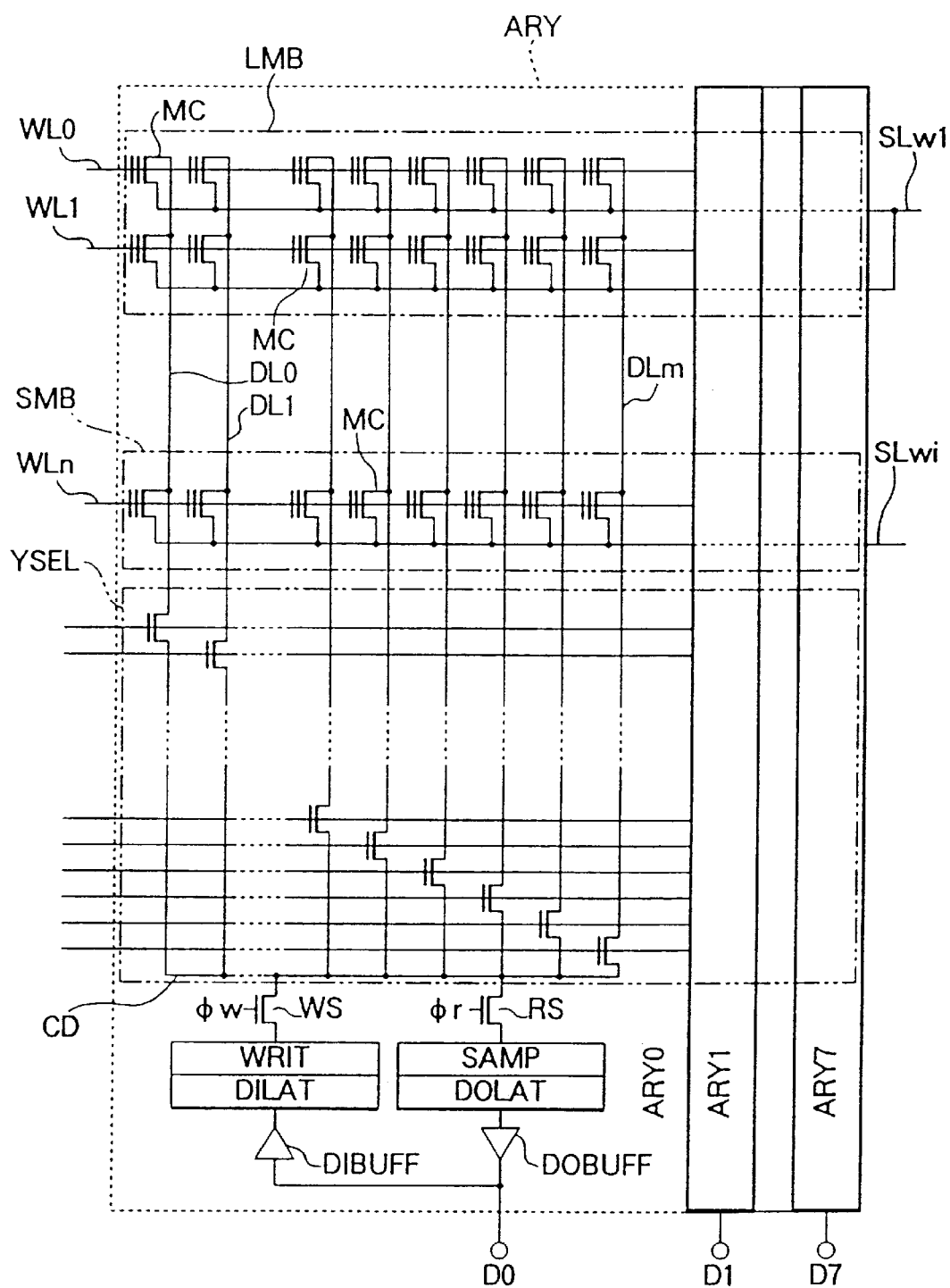
FIG. 24 is a memory array portion configuration diagram showing an example of a flash memory in which a plurality of memory blocks are defined each in a unit of word line, having different capacities.

[13] Formation of a Plurality of Memory Blocks Having Different Storage Capacities and Defined Each in a Unit of Word Line FIG. 24 shows a memory mat configuration of a flash memory in which a plurality of memory blocks are defined each in a unit of word line and the simultaneously erasable memory blocks have different storage capacities.

While in the configuration shown in FIG. 13 memory blocks are defined each in a unit of data line, memory blocks are defined in a unit of word line in FIG. 24. In the figure, a memory block LMB having a relatively large storage capacity and a memory block SMB having a relatively small storage capacity are illustrated as representatives throughout memory array portions ARY0 to ARY7.

In each of the memory array portions ARY0 to ARY7, memory cells MC formed of insulated gate field effect transistors of two-layer gate structure as explained previously in connection with FIG. 11 are arranged in matrix. In the figure, WL0 to WLn designate word lines which are common to all of the memory array portions ARY0 to ARY7. Control gates of memory cells arranged on the same row are connected to a corresponding word line. In each of the memory array portions ARY0 to ARY7, drain regions of memory cells MC arranged on the same column are connected to a corresponding data line DL0, . . . or DLm. Source regions of memory cells MC constituting the small memory block SMB are connected in common to a source line SLwi extending in the word line direction and source regions of memory cells MC constituting the large memory block LMB are connected in common to a source line SLw1 extending in the word line direction. As in the case of FIG. 13, in simultaneous erasing effected in a unit of memory block, a memory block to be erased simultaneously is designated by the erase block designation register, so that high voltage Vpp for erase is supplied to a source line of the designated memory block. Details of the voltage conditions for erase and write will be described later. YSEL designates a Y selection circuit, CD a common data line, WRIT a write circuit, DILAT a data input latch, SAMP a sense amplifier, DOLAT a data output latch, DIBUFF a data input buffer and DOBUFF a data output buffer.

Figure 25A:
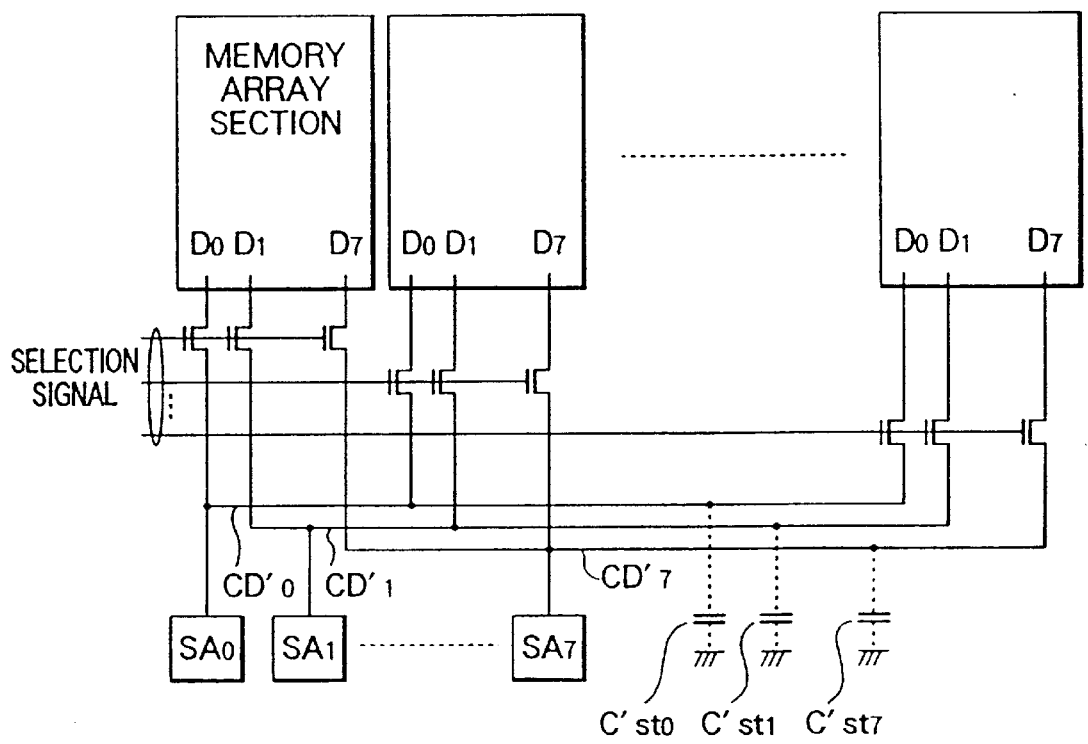
FIGS. 25A and 25B are diagrams for explaining an advantage of the embodiment shown in FIG. 24.
Figure 25B:
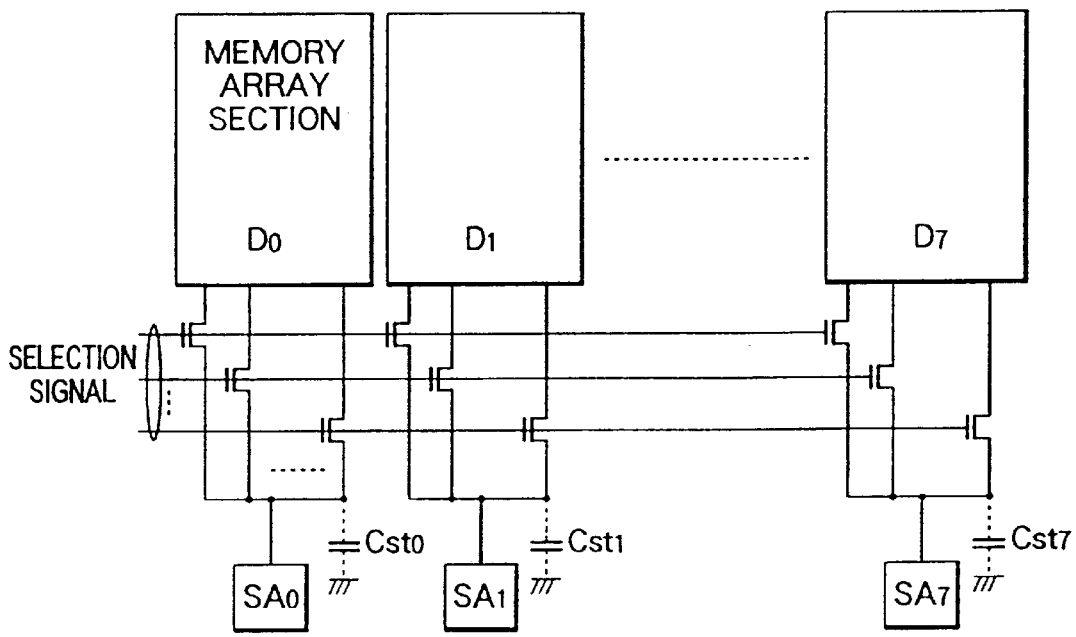

The relation between memory array portions ARY0 to ARY7 and output data resembles that in FIG. 13. More particularly, one bit of input/output data corresponds to one memory mat. For example, data D0 is under the charge of the memory array portion ARY0. By employing such a configuration of one memory mat per one input/output, the common data line CD can be sectioned, one for each memory array portion, and need not extend over a long distance throughout all of the memory array portions, as illustrated in FIGS. 25A and 25B. The length of the common data line CD is much smaller than that of the common data line CD'. Accordingly, parasitic capacitance (Cst) associated with the common data line CD can be reduced (Cst<<C'st) to contribute to speed-up of access and a low voltage operation.

When memory blocks such as LMB and SMB are defined each in a unit of word line as shown in FIG. 24, a minimum memory block in the whole of memory array ARY having a parallel input/output bit number equal to one byte has a storage capacity corresponding to that of one word line, that is, the storage capacity corresponding to the number of memory cells associated with one word line over the entire memory array. This holds regardless of the number of parallel input/output bits. Contrarily, when memory blocks are defined each in unit of data line as shown in FIG. 13, a minimum memory block in the whole of memory array has a storage capacity complying with the number of parallel input/output bits to amount up to a storage capacity of 8 data lines (one data line is associated with each memory mat). Accordingly, if the number of memory bits in the direction of data line is ⅛ of the number of memory bits in the direction of word line, no difference takes place between memory blocks defined in a unit of data line and memory blocks defined in a unit of word line. Practically, however, the number of memory bits in the direction of data line is conditioned by the efficiency of layout of semiconductor integrated circuit formation or the efficiency of addressing memory cells, amounting up to about ½ of the number of memory bits in the direction of word line and in addition, due to the fact that the flash memory built in the microcomputer is connected to internal data bus, the number of parallel input/output bits is defined in a unit of byte or word. For these reasons, the storage capacity of the minimum memory block can be reduced drastically in the case where memory blocks are defined each in a unit of word line. With the minimum size of memory block reduced, convenience of use of a memory block as a data area can be improved further and besides the effect of preventing such wastefulness that information is erased simultaneously together with information which need not substantially be rewritten and then the latter information is again written can fulfill itself.

Figure 26A:
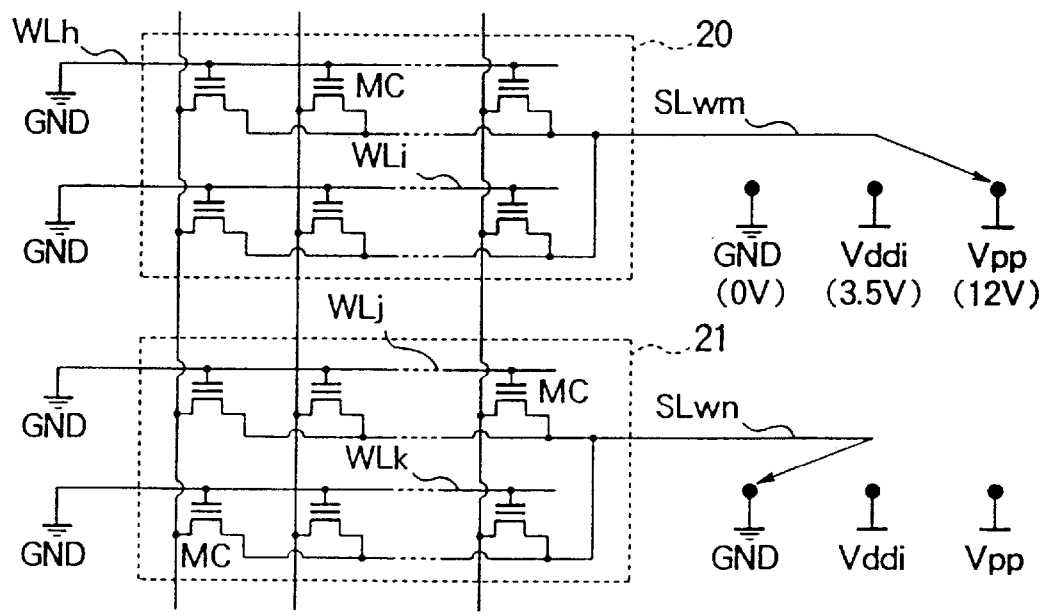
FIGS. 26A and 26B are diagrams for explaining an example of voltage conditions for countermeasures against data line disturbance in an unselected block for writing.
Figure 26B:
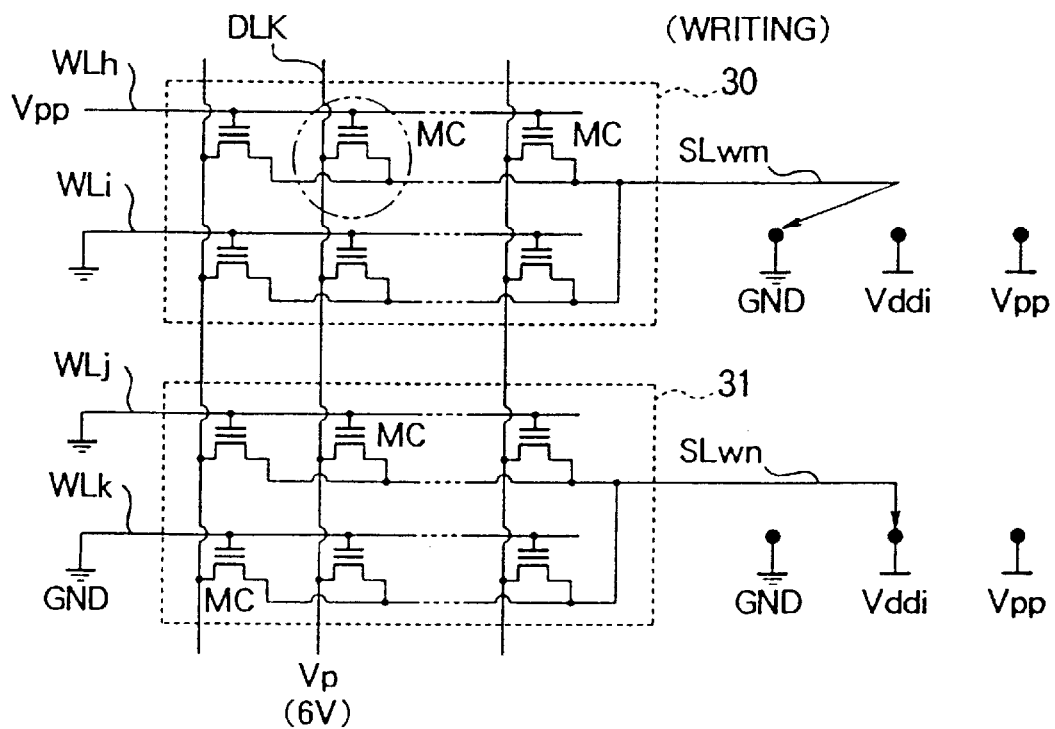

[14] Countermeasures Against Data Line Disturbance in an Unselected Block for Writing FIGS. 26A and 26B show an example of the voltage conditions for erase/write available when memory blocks are defined each in a unit of word line. Especially, countermeasures against data line disturbance are applied to an unselected block (unselected memory block) for writing.

In FIG. 26A showing the voltage conditions for erase, a selected block (selected memory block) 20 is a memory block selected for simultaneous erasing and an unselected block 21 is a memory block not selected for simultaneous erasing. In an erase operation, word lines WLh to WLk depicted as representatives are applied with ground potential GND such as 0 V. In the selected block 20, its common source line SLwm is applied with a high voltage Vpp of, for example, 12 V so that memory cells of the selected block 20 may be erased simultaneously. In the unselected block 21, its common source line SLwn is maintained at ground potential GND to inhibit erase.

In FIG. 26B showing the voltage conditions for write, a selected block 30 is a memory block containing memory cells selected for writing and an unselected block 31 is a memory block not containing memory cells to be written. In the selected block 30, a common source line SLwm is applied with ground potential GND and when, for example, a memory cell MC circled by phantom line is to be written, high voltage Vpp is applied to a word line WLh connected with its control gate and a relatively high voltage Vp of, for example, 6 V is applied to its data line. In the selected block 30, a word line WLi not selected is applied with ground potential GND.

Upon writing, in the unselected block 31, all word lines WLj and WLk are maintained at ground potential GND, so that memory cells are rendered not to be selected. Because of the nature of formation of memory blocks in a unit of word line, the data line extending into the unselected block 31 is also applied with voltage Vp in accordance with write effected in the selected block 30. Namely, a memory cell MC in the unselected block 31 is placed in the condition of word line unselection and data line selection in accordance with write effected in the selected block 30. For example, in accordance with the condition shown in FIG. 26B, when a circled memory cell in the selected block is to be written, a memory cell (surrounded by a quadrangle of phantom line)in the unselected block 31 and connected to a data line DLk associated with the former memory cell is applied with voltage Vp. Then, a common source line SLwn in the unselected block 31 is applied with a voltage Vddi (data line disturbance prevention voltage) of, for example, 3.5 V to apply countermeasures against data line disturbance. If the source line SLwn is applied with ground potential GND as in the case of the selected block 30, then data line disturbance will occur. In the selected block 30, memory cells which are connected to data line DLk and are not to be written are applied with ground potential GND at their associated word lines and source lines to set up the same condition as that responsible for occurrence of data line disturbance but such condition can be substantially negligible. This will become apparent from item [15] of "Correlation of data line disturbance time between memory blocks" to be described later with reference to FIG. 29.

Figure 27A:
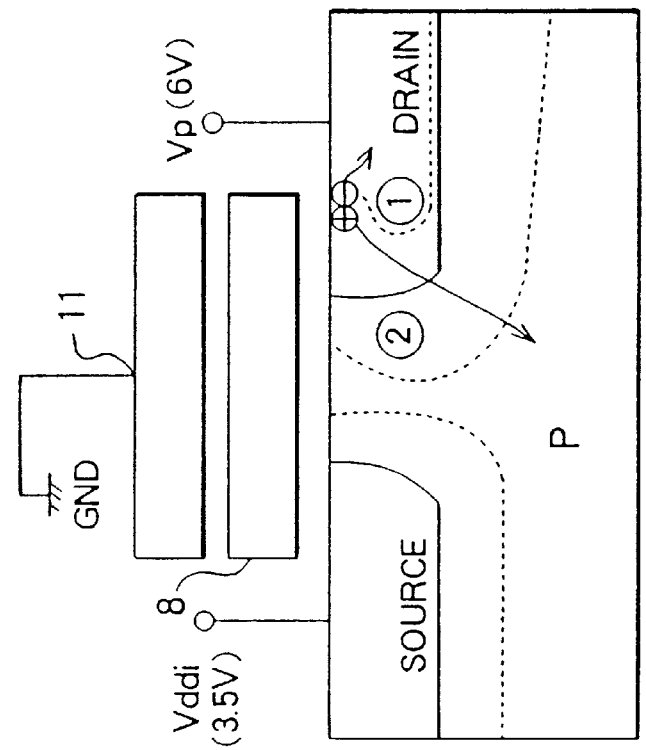
FIGS. 27A and 27B are diagrams for explaining the principle of generation of data line disturbance and countermeasures there against.

FIG. 27A shows the mechanism of generation of data line disturbance. More particularly, in a region (1) near the source side end of drain, electron and hole pairs are generated through a tunnel phenomenon between bands. At that time, if the source is maintained at ground potential GND and the drain is maintained at a relatively high voltage Vp to generate a relatively large electric field, holes of the electron and hole pairs are accelerated by an electric field in a depletion layer of the region (2) and turn into hot holes. The hot holes pass through a thin tunnel insulating film of about 10 nm thickness (under floating gate electrode 8) so as to be injected into the floating gate 8. This state is a data line disturbance state and when a memory cell transistor suffers from the data line disturbance for a long time, its threshold is decreased, with the result that the memory cell being in write state "0" changes to erase state "1" and the memory cell being in erase state "1" undergoes depletion to cause an unwanted change of stored information or an eventual erroneous operation (data line disturbance fault).

Figure 27B:
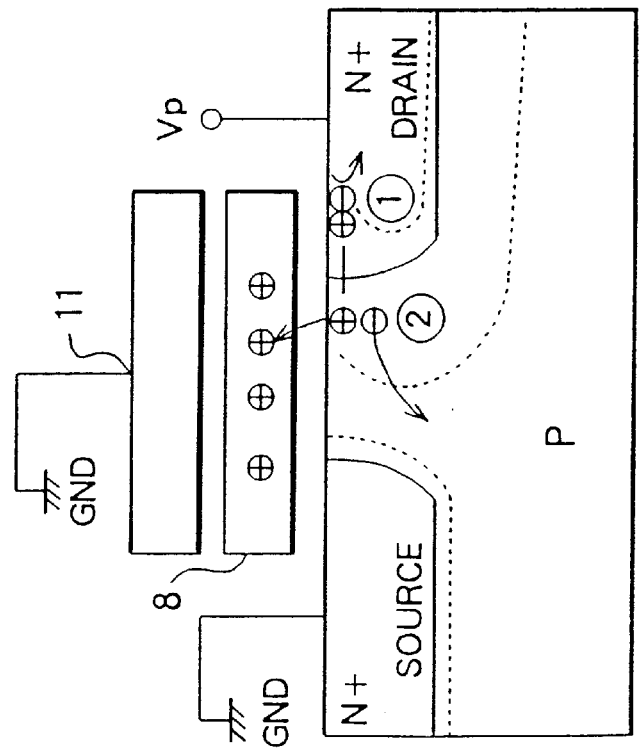

FIG. 27B shows the mechanism of counter-measurements against data line disturbance. To describe, when potential on the source side is raised in the unselected block for writing by applying a voltage Vddi of 3.5 V to the source of a memory cell as shown in FIGS. 26A and 26B, an electric field in a depletion layer as indicated by a region (2) is weakened and as a result, the turning of holes of electron and hole pairs into hot holes is prevented to ensure that the reduction in threshold of the memory cell transistor can be prevented.

FIG. 28 shows an example of experiment concerning the change of threshold of a memory cell with respect to data line disturbance time. In this experiment, a memory cell transistor as shown in the figure is used and write is repeated to obtain threshold voltages by maintaining the source potential Vs at 0 V, floating (open) and 3.5 V, respectively, under the condition that ground potential GND is applied to the control gate and substrate of the memory cell transistor and 6.5 V is applied to the drain thereof. The upper portion of the figure is for the memory cell transistor being in the write state "0" and the lower portion is for the memory cell transistor being in the erase state "1". As is clear from the figure, for Vs=3.5 V, a decrease in threshold which is too large to be negligible does not occur within a data line disturbance time of about 1000 seconds under any of the erase state and the write state.

From the above, it will be understood that in order to prevent occurrence of faults due to data line disturbance, the source potential of the unselected memory block needs to be biased with a data line disturbance prevention voltage Vddi such as 3.5 V not higher than the drain voltage and the data line disturbance time needs to be reduced to as small a value as possible.

[15] Correlation of Data Line Disturbance Time Between Memory Blocks

Figure 29:
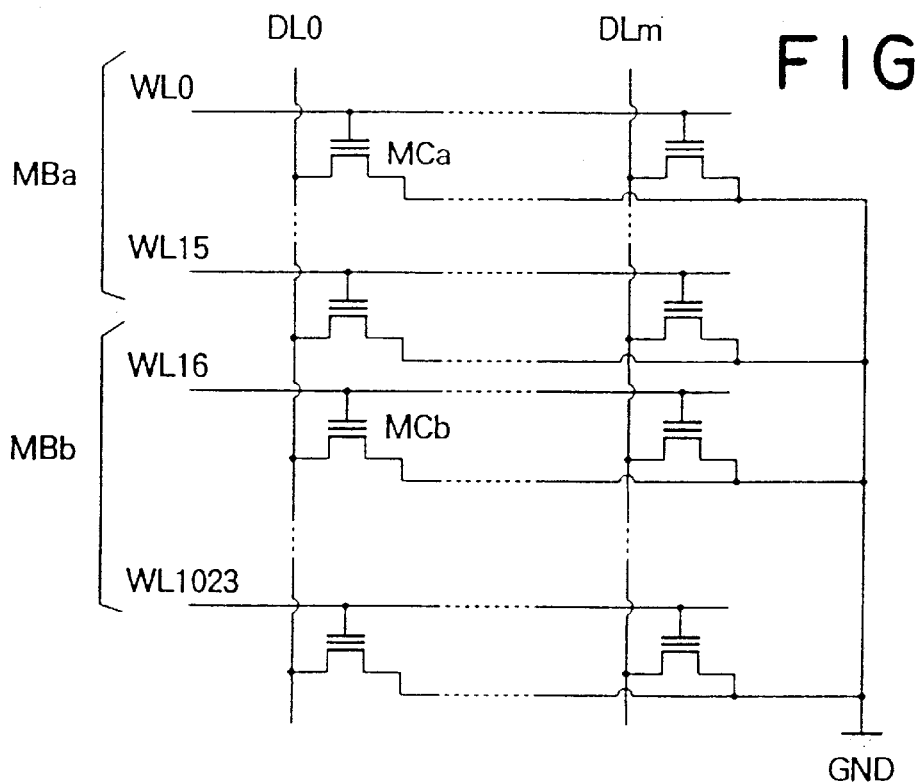
FIG. 29 is a circuit diagram for explaining the correlation of data line disturbance time between memory blocks of small storage capacities and memory blocks of large storage capacities.

The correlation of data line disturbance time between a memory block MBa having a relatively small storage capacity and a memory block MBb having a relatively large storage capacity as shown in FIG. 29 will be described. For convenience of explanation, the common source line of an unselected block for writing is also maintained at ground potential GND as in selected block for writing. The data line disturbance time in this case is shown in Table 2. In this table, though not limitedly, the write time per memory cell one bit is set to 100 μsec. and the number of times of the erase and write is set to 10000. One erase and write operation referred to herein means such an operation that an object memory block is erased simultaneously and thereafter individual word lines are sequentially selected to write memory cells. But the data line disturbance time of a memory cell in the memory block selected for writing is handled on the assumption that a word line to which the memory cell of interest is coupled is not selected.

TABLE 2

|  | data line disturbance time affecting MCa | data line disturbance time affecting MCb |
|---|---|---|
| MBa selected, MBb unselected | <PHASE A/A> 100 μS × 15 × 1 time = 1.5 msec | <PHASE B/A> 100 μS × 16 × 104 times = 1.6 sec |
| MBb selected, MBa unselected | <PHASE A/B> 100 μS × 1008 × 104 times = 1000 sec | <PHASE B/B> 100 μS × 1007 × 1 time = 0.1 sec | write time per bit = 100 μS
write/erase times = 104

According to the results, the data line disturbance time affecting a memory cell MCa of the memory block MBa is 1.5 msec when the memory block MBa of interest is selected for writing (Phase A/A) and 1000 sec. when the memory block MBb is selected (Phase A/B). Firstly, this difference is due to a difference in storage capacity (the number of word lines) between the memory blocks MBa and MBb. Namely, this is due to the fact that while in a calculation equation of data line disturbance time shown in Phase A/A which is 100 μs×15× one frequency the time of word line switching upon write following simultaneous erasing of the memory block is 15 which corresponds to the number of word lines of the memory block MBa, the number of times of word line switching upon write following simultaneous erasing of the memory block is 1008 corresponding to the number of word lines of the memory block MBb in a calculation equation of data line disturbance time shown in Phase A/B which is 100 μs×1008×10000 frequencies. Secondly, the above difference is attributable to the fact that in calculation of the data line disturbance time affecting the memory cell MCa in the memory block MBa selected for rewriting the number of times of substantial rewrite is deemed as one. More specifically, the difference is due to the fact while the number of times of rewrite is deemed as one in the calculation equation of data line disturbance time shown in Phase A/A which is 100 μs×15× one time, the number of times of rewrite is 10000 which coincides with the number of times of actual rewrite operations in the calculation equation of the data line disturbance time shown in Phase A/B which is 100 μs×1008×10000 times. Presumably, this is because for the memory cell MCa in the memory block MBa selected for rewriting, threshold voltages of all memory cells are raised through prewrite preceding simultaneously erasing and thereafter erase is carried out stepwise from the viewpoint of prevention of excessive erase upon each rewrite operation as explained with reference to FIG. 22, so that the data line disturbance time of the memory cell MCa of interest is substantially defined by the time for one rewrite operation. In other words, the data line disturbance state affecting the memory cell MCa in the memory block MBa selected for rewriting is deemed as being initialized every rewrite operation. Contrary to this, when a memory block selected for rewriting is the memory block MBb, the memory cell MCa does not undergo the initialization and the data line disturbance time is accumulated in accordance with the frequency of actual rewrite operations.

Similarly, the data line disturbance time affecting the memory cell MCb of the memory block MBb is 0.1 sec. when the memory block MBb of interest is selected as write object (Phase B/B) and is 16 sec. when the memory block MBa is selected (Phase B/A). As in the preceding, this difference is also due to the fact that the storage capacity (the number of word lines) differs between the memory blocks and the substantial frequency of rewrite operations is deemed as one in the calculation of the data line disturbance time affecting the memory cell MCb in the memory block MBb selected for rewriting.

From this, it is clear that the data line disturbance time to which the unselected memory block is subjected owing to write of the selected memory block is far longer than the data line disturbance time affecting the memory cell in the selected memory block. Accordingly, it will be appreciated that in order to prevent a decrease in threshold voltage of a memory cell due to data line disturbance, the common source line on the unselected memory block side for writing is at least required to be biased by voltage Vddi but the data line disturbance time affecting the memory cell in the selected memory block can be neglected without causing Almost any troubles.

Further, the following will be clear from the contents of Phase A/B and Phase B/A in the correlation of the data line disturbance time shown in Table 2. Namely, the data line disturbance time (e.g., 1000 sec) affecting an unselected memory block having a small storage capacity owing to write of a memory block having a large capacity is relatively larger than the data line disturbance time (e.g., 1.6 sec) in the converse case.

[16] A Transfer Gate Circuit for Data Line Separation

Figures 30A, 30B:
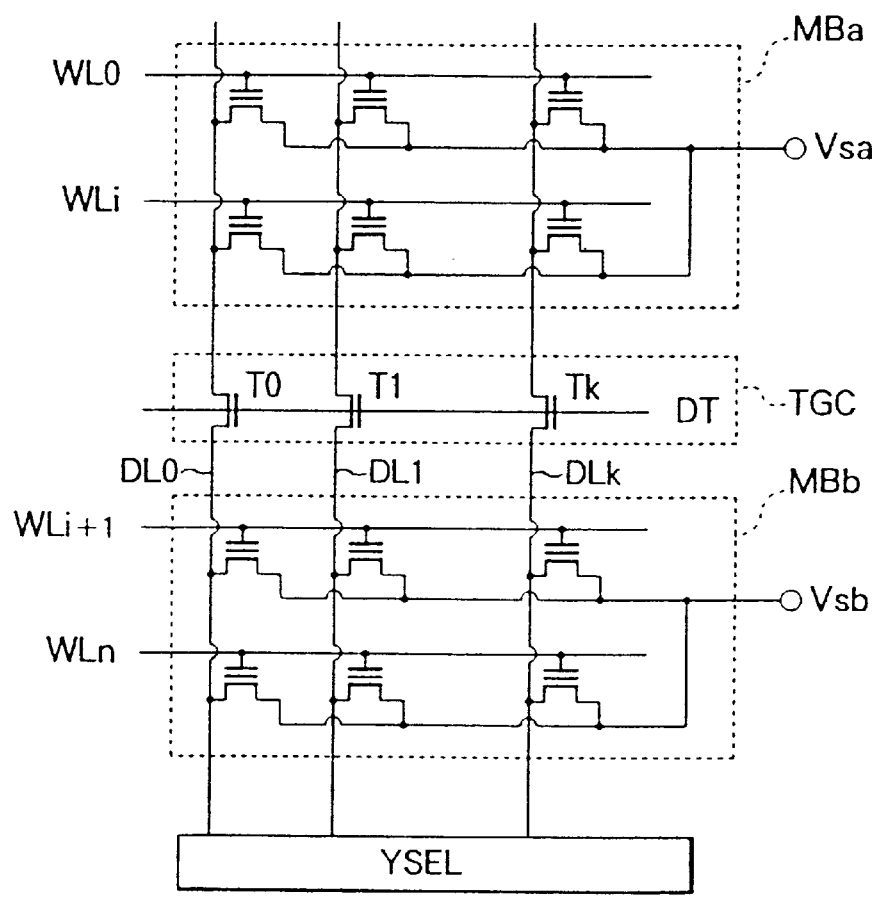
FIGS. 30A and 30B are diagrams showing an embodiment of a memory array in which a transfer gate circuit for selectively separating data lines is interposed between memory blocks.

FIGS. 30A and 30B show an embodiment of a memory array in which a transfer gate circuit for selectively separating data lines is interposed between memory blocks. A transfer gate circuit TGC is arranged between memory blocks MBa and MBb and has transfer MOS transistors T0 to Tk associated with data lines DL0 to DLk in one to one correspondence relationship, the transfer MOS transistors being controlled for switching by a control signal DT. According to this example, a Y selection circuit YSEL such as a column selection switch circuit is arranged on the side of the memory block MBb. FIG. 30B shows switch control modes of the transfer MOS transistors T0 to Tk. When the memory block MBa is a selected block for writing, the transfer MOS transistors T0 to Tk are rendered on. At that time, source potential Vsa of the memory block MBb serving as the selected block for writing is maintained at ground potential GND and source potential Vsb of the memory block MBb standing for the unselected block for writing is maintained at data line disturbance prevention voltage Vddi such as 3.5 V. On the other hand, when the memory block MBb is a selected block for writing, the transfer MOS transistors T0 to Tk are rendered off. At that time, source potential Vsb of the memory block MBb standing for the write selected block is maintained at ground potential GND. Source potential Vsa of the memory block MBa standing for an unselected block for writing may be maintained at either data line disturbance prevention voltage Vddi such as 3.5 V or ground potential GND (or floating). This is because by virtue of the transfer MOS transistors T0 to Tk rendered to be cutoff, data line write voltage Vp fed through the Y selection circuit YSEL is not transmitted to the memory block MBa.

The transfer gate circuit TGC is in particular of significance in connection with the data line disturbance time of an unselected block for writing as will be described below. More specifically, when the memory block MBa is set to be a selected block for writing, a relatively high voltage Vp for write of the memory block MBa is applied through a data line to the memory block MBb preceding the transfer gate circuit TGC (on the side of Y selection circuit YSEL). Under this condition, the common source line of the memory block MBb serving as an unselected block for writing is applied with data line disturbance prevention voltage Vddi to essentially prevent data line disturbance but as this condition continues for a long time (resulting in considerable prolongation of the data line disturbance time), the threshold of a memory cell subject to write condition in the unselected memory block for writing MBb slightly decreases even if the source of the memory cell is biased by voltage Vddi, as will be clear from FIG. 28. Thus, by taking advantage of the fact that the data line disturbance time affecting a memory block of a small storage capacity owing to write concomitant with rewrite of a memory block of a large storage capacity is relatively larger than the data line disturbance time in the converse case, as described with reference to FIGS. 30A and 30B, the transfer gate circuit TGC intervenes such that the memory block MBb on the side of Y selection circuit YSEL is made to be a large memory block having a relatively large storage capacity and the memory block MBa on the opposite side is made to be a small memory block having a relatively small storage capacity. By making the memory block MBa a small memory block and making the memory block MBb a large memory block in this manner, the data line disturbance time affecting a memory cell of the memory block MBb owing to write of the memory block MBa can be far shorter than the data line disturbance time in the case where the memory block MBa is made to be a large memory block and the memory block MBb is made to be a small memory block. Through this, prevention of an erroneous operation due to data line disturbance can further be perfected.

Figure 31:
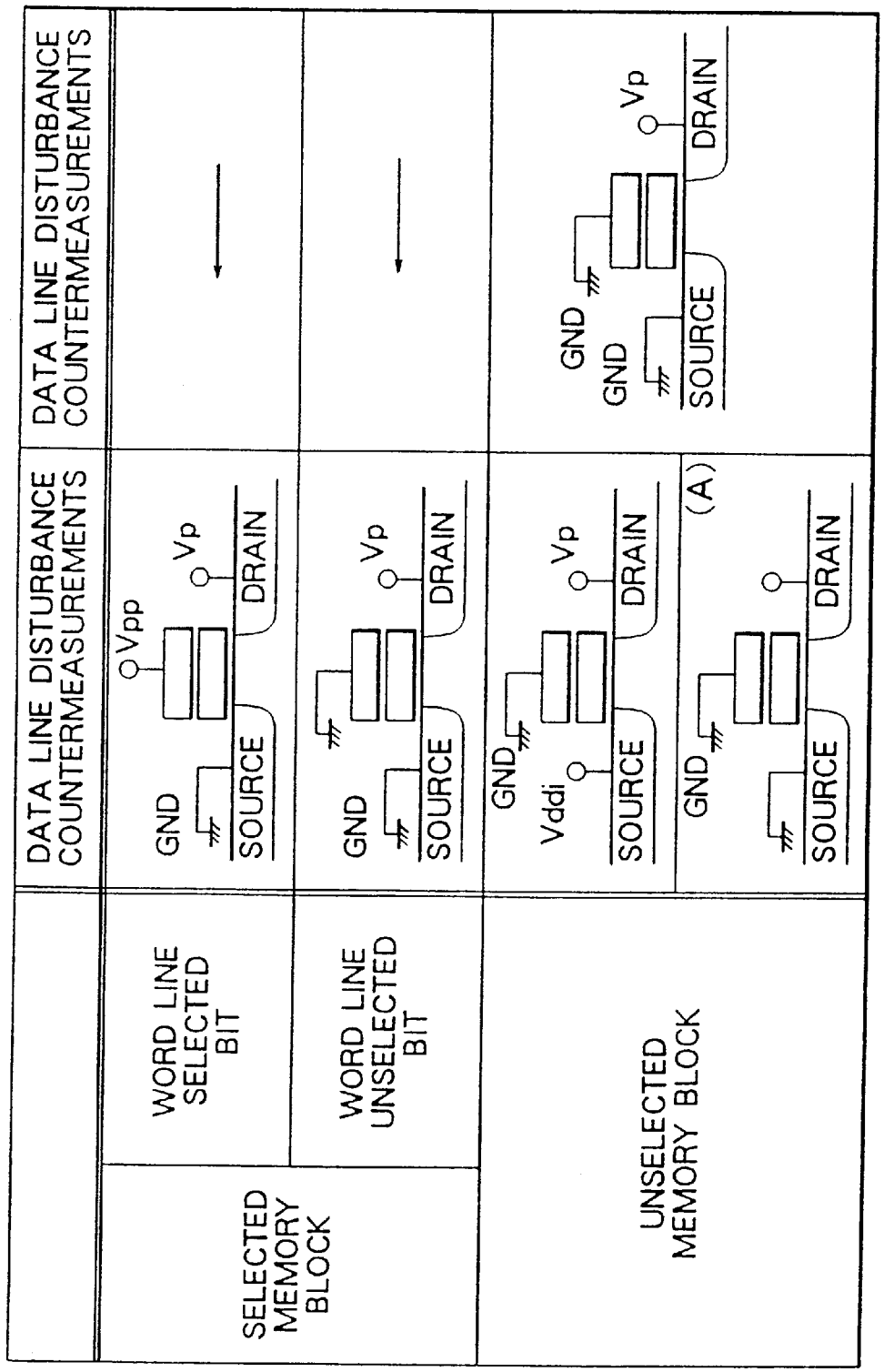
FIG. 31 in an explanatory diagram in which an example of voltage conditions for countermeasures against data line disturbance is summed up.

The countermeasures against data line disturbance are summed up in FIG. 31. In the figure, the voltage application condition showing countermeasures against data line disturbance for the unselected memory block shown at (A) is representative of a memory cell transistor connected to a data line which is interrupted from the supply of write voltage by the off state of the transfer gate circuit TGC.

[17] Dummy Word Lines

Figure 32:
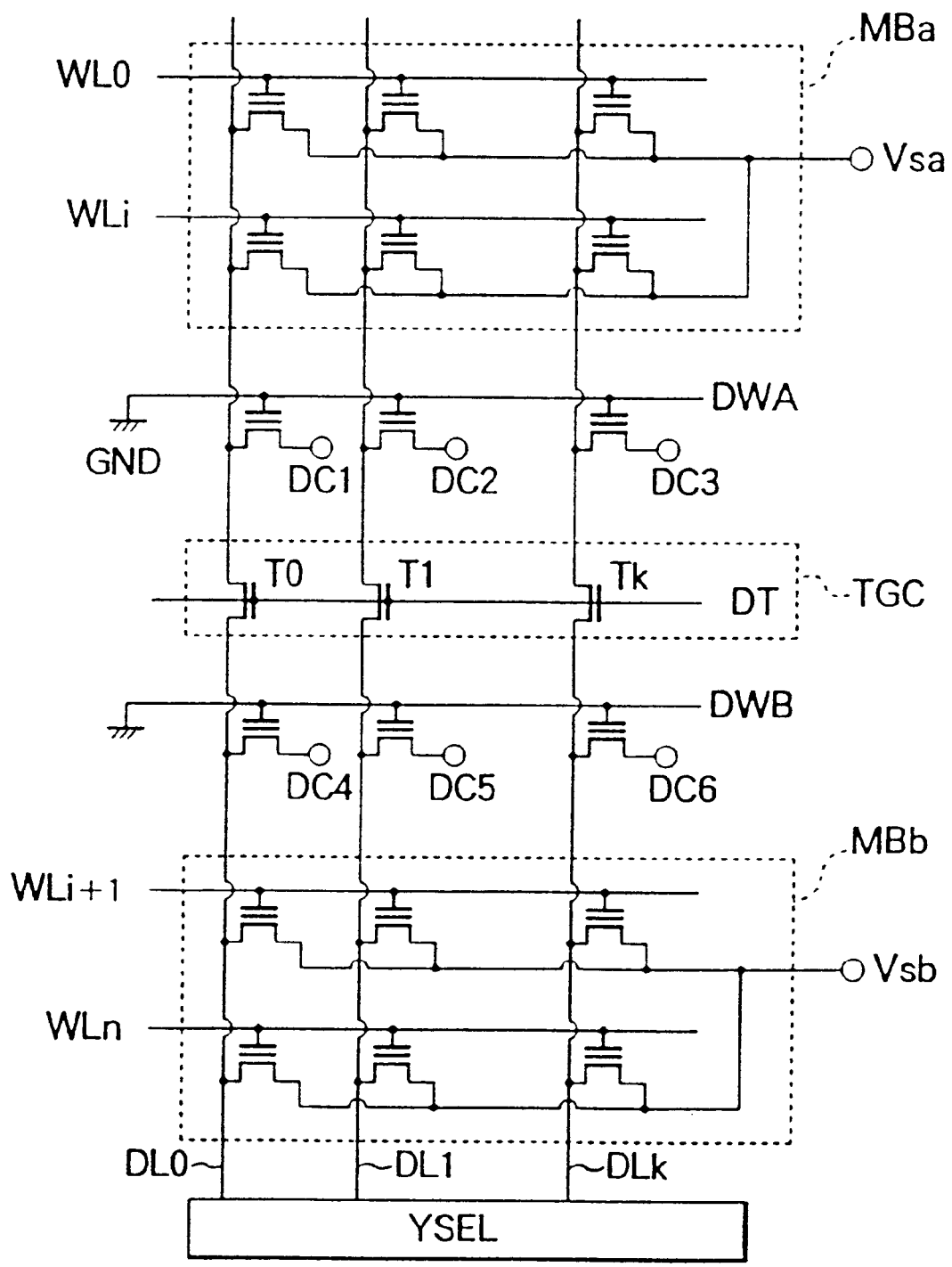
FIG. 32 is a circuit diagram showing an example wherein a dummy word line is arranged between a memory block and a transfer gate.
Figure 33:
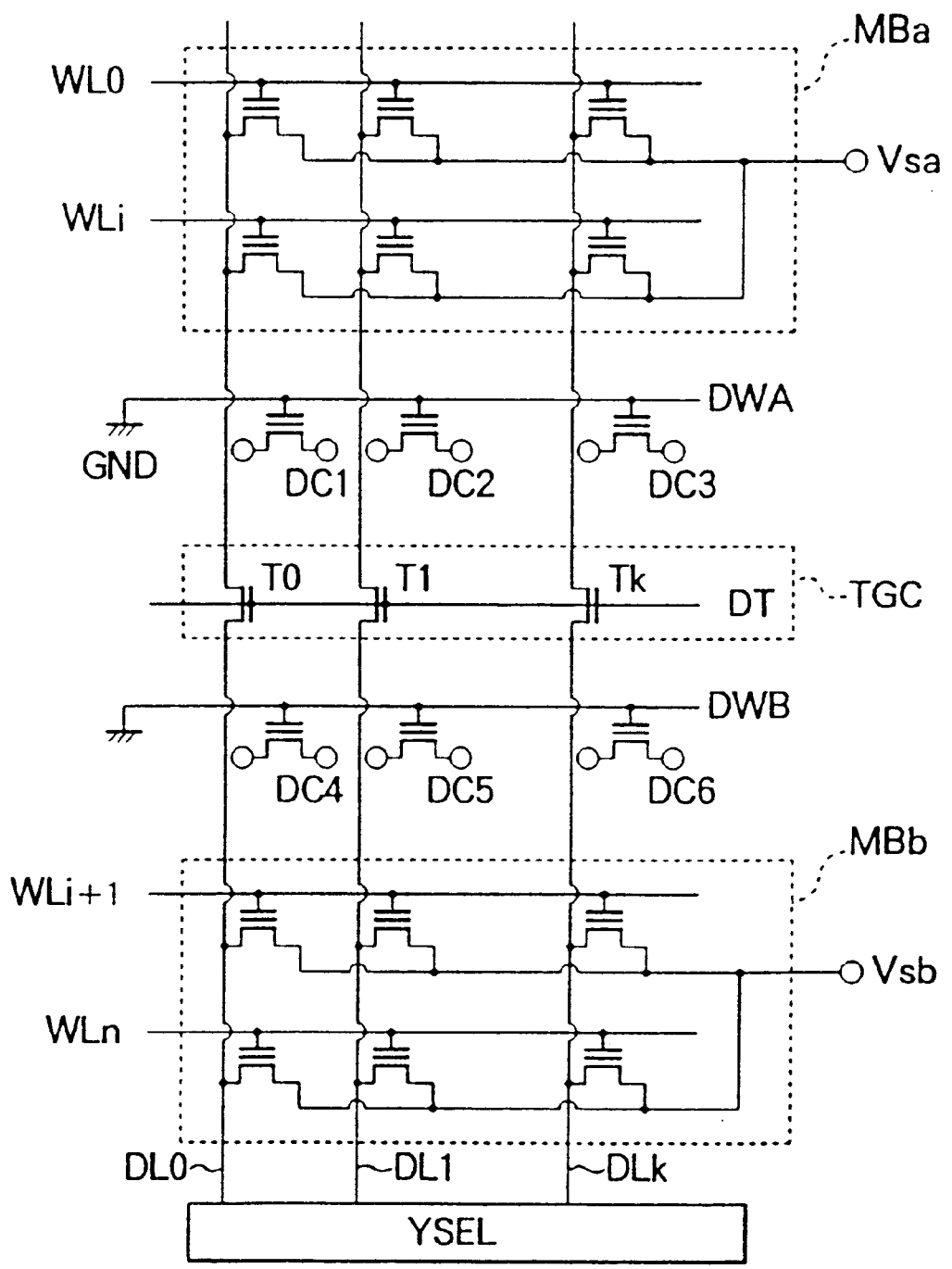
FIG. 33 is a circuit diagram showing another example wherein a dummy word line is arranged between a memory block and a transfer gate circuit.
Figure 34:
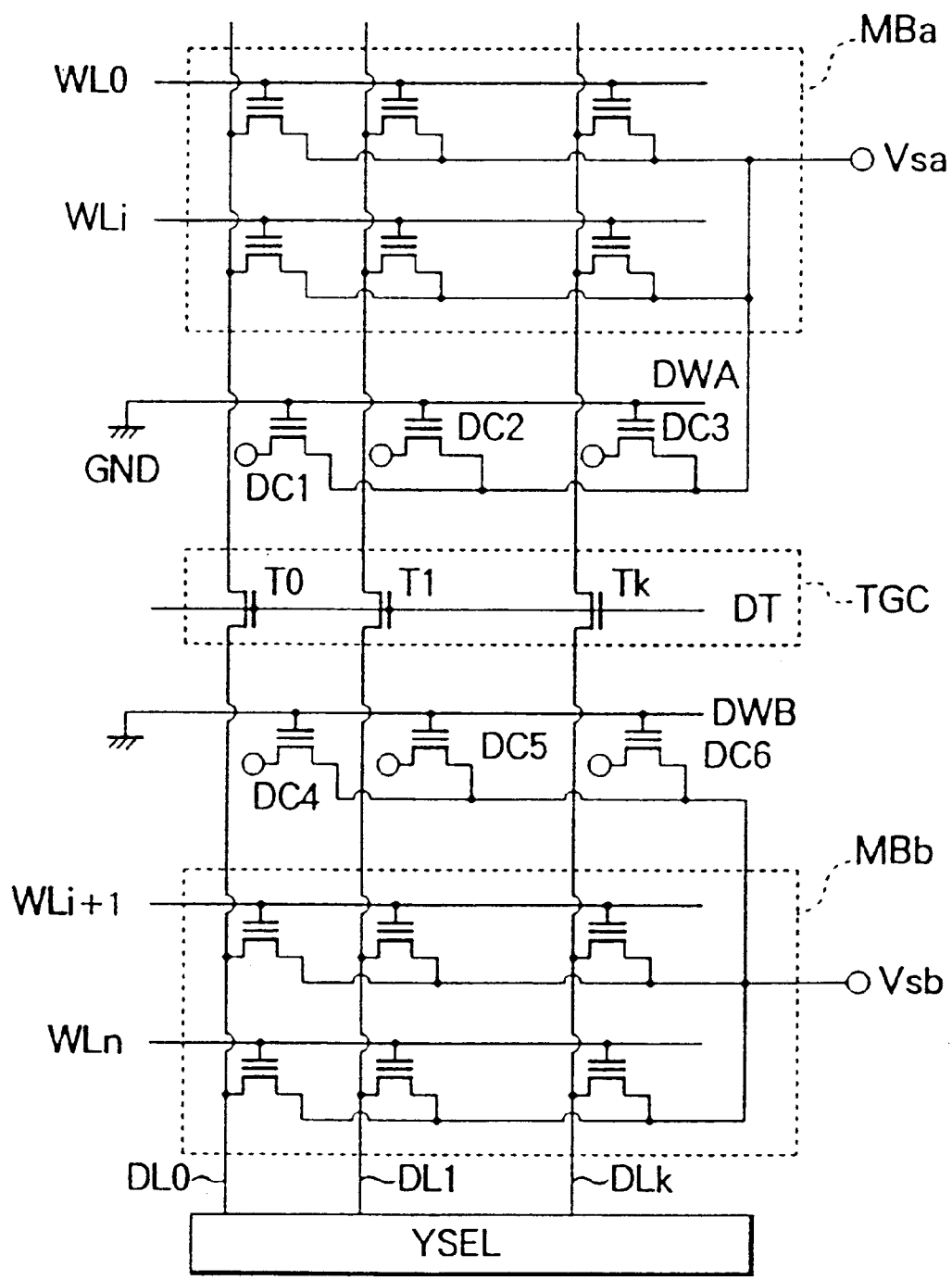
FIG. 34 is a circuit diagram showing still another example wherein a dummy word line is arranged between a memory block and a transfer gate circuit.

FIGS. 32, 33 and 34 are circuit diagrams in which a dummy word line is arranged between a memory block and a transfer gate circuit. In each of the figures, DWA designates a dummy word line on the side of a memory block MBa, and DWB a dummy word line on the side of a memory block MBb. One DWA of the dummy word lines is coupled with control gates of dummy cells DC1 to DC3 and the other DWB is coupled with control gates of dummy cells DC4 to DC6. Each of the dummy cells DC0 to DC6 is formed of the same transistor as that of a memory cell. In FIG. 32, the dummy cells DC0 to DC6 have their sources made to be floating and their drains coupled to data lines. In FIG. 34, the dummy cells DC0 to DC6 have their sources and drains which are made to be floating. In FIG. 34, the dummy cells DC0 to DC6 have their sources connected to a common source line of a corresponding memory block and their drains made to be floating. When a transfer gate circuit TGC is provided between memory blocks, a repetitive pattern of memory cell transistors and word lines is interrupted at a position of the transfer gate circuit and from the standpoint of device structure, there results an abrupt unevenness in the wafer surface. Such an unevenness leads to non-uniformity of thickness of a photoresist film formed when word lines and control gates are formed through, for example, photo-etching. This causes partial non-uniformity of dimensions of word lines and control gates and irregularity in electrical characteristics of transistors and word lines results. Under the circumstances, by arranging the dummy word lines DWA and DWB and the dummy cells DC0 to DC3 and DC4 to DC6 at respective ends of the memory blocks MBa and MBb separated by the transfer gate circuit TGC, irregularity in dimensions of word lines and control gates which occurs near the transfer gate circuit TGC can be reduced.

[18] Various Forms of Pluralization of Memory Blocks in a Unit of Word Line

Figure 35:
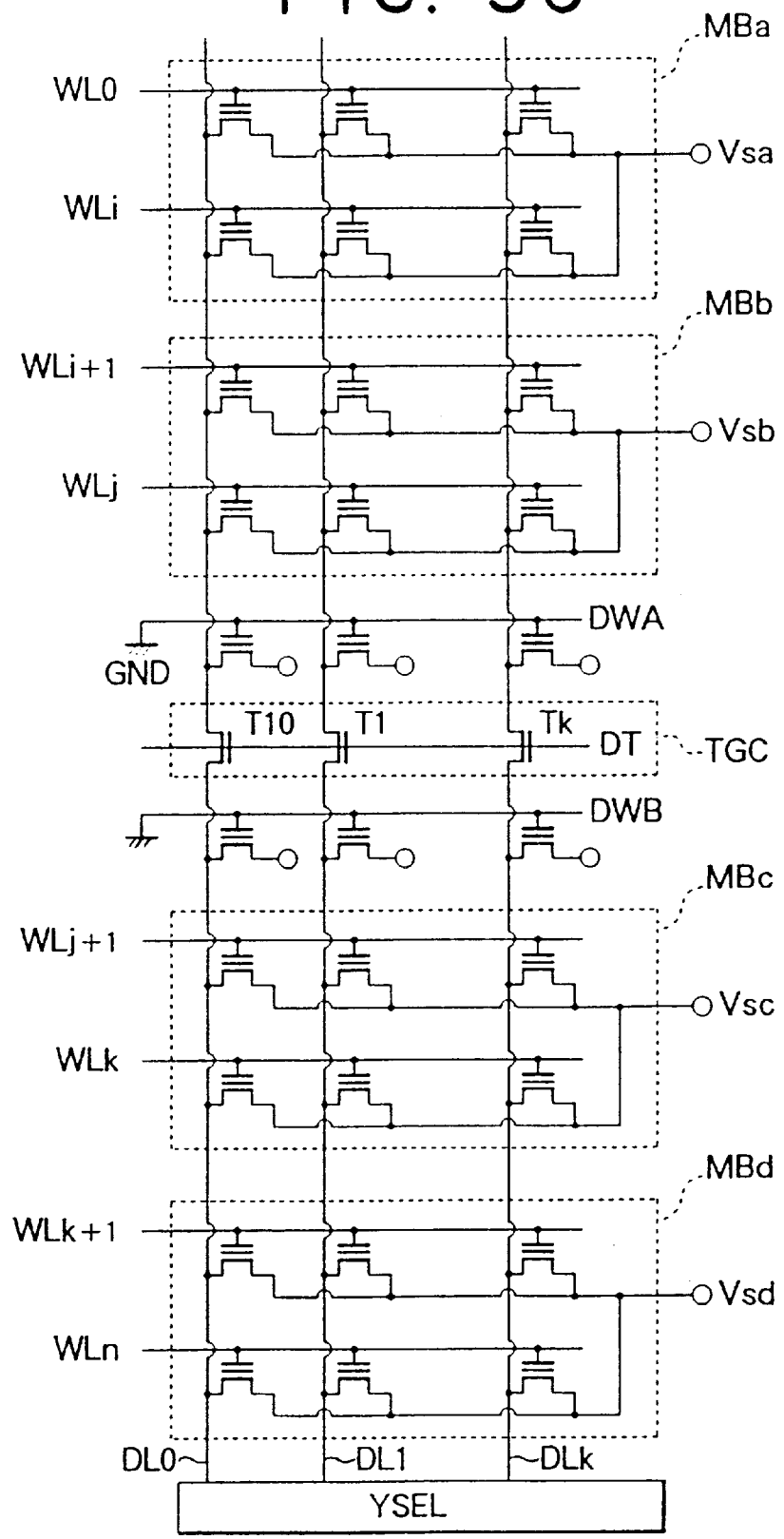
FIG. 35 is a diagram for explaining a memory array in which two memory blocks are arranged on each side of a transfer gate circuit.

As shown in FIG. 35, two memory blocks can be arranged on each side of a transfer gate circuit TGC. Preferably, in this case, memory blocks MBc and MBd on the side of a Y selection circuit YAEL are made to be large memory blocks and memory blocks MBb and MBa succeeding the transfer gate circuit TGC are made to be small memory blocks. For example, the large memory block is used for program storage and the small memory block is used for data storage.

Figure 36:
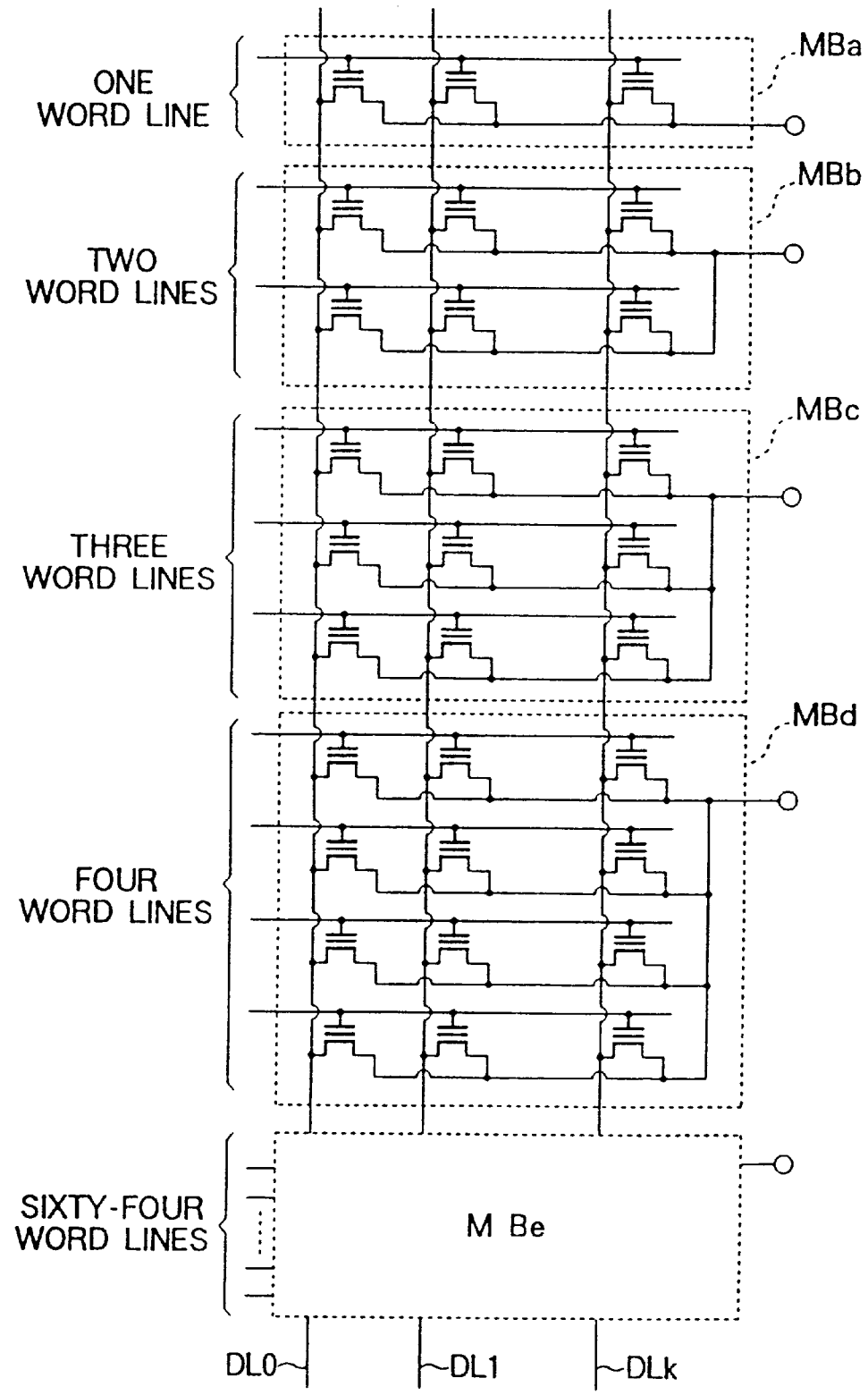
FIG. 36 is a circuit diagram showing an example of a memory array in which the number of word lines of simultaneously erasable memory blocks is increased sequentially.

As shown in FIG. 36, a simultaneously erasable, minimum memory block has a single word line and the number of word lines can be increased sequentially to two, three and four. But the number of word lines of individual, simultaneously erasable memory blocks may be determined suitably or the size of individual memory blocks may be changed suitably.

Figure 37:
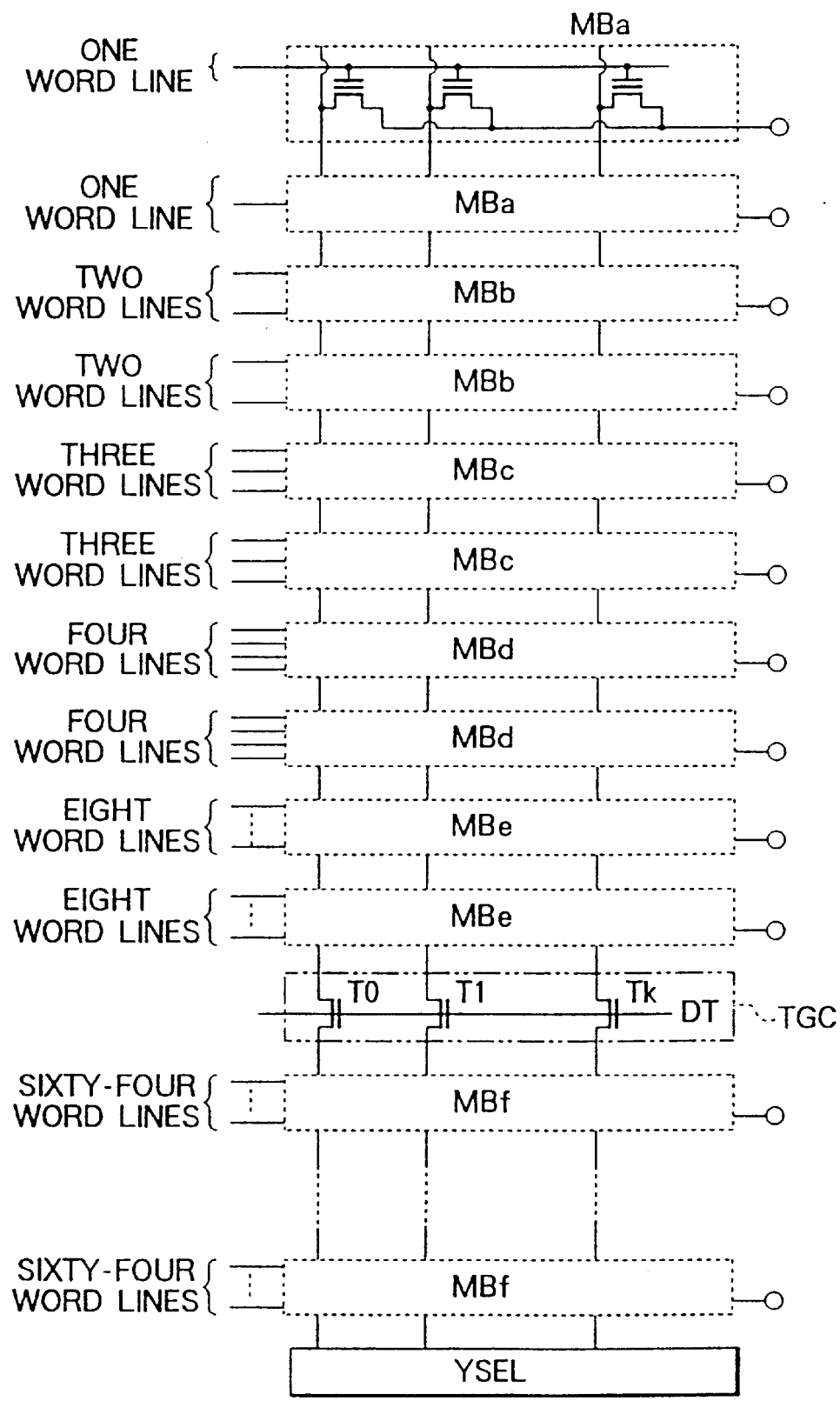
FIG. 37 is a diagram for explaining an example of a memory array in which a transfer gate circuit is arranged between a group of large memory blocks and a group of small memory blocks.

As shown in FIG. 37, when a group of relatively small memory blocks MBa to MBe respectively having one, two, three, four and eight word lines and a group of relatively large memory blocks MBf each having 64 word lines are employed, a transfer gate circuit TGC may preferably be arranged at a boundary part between the large and small memory block groups as will be inferred from the explanation of the previous item [16].

Figure 38:
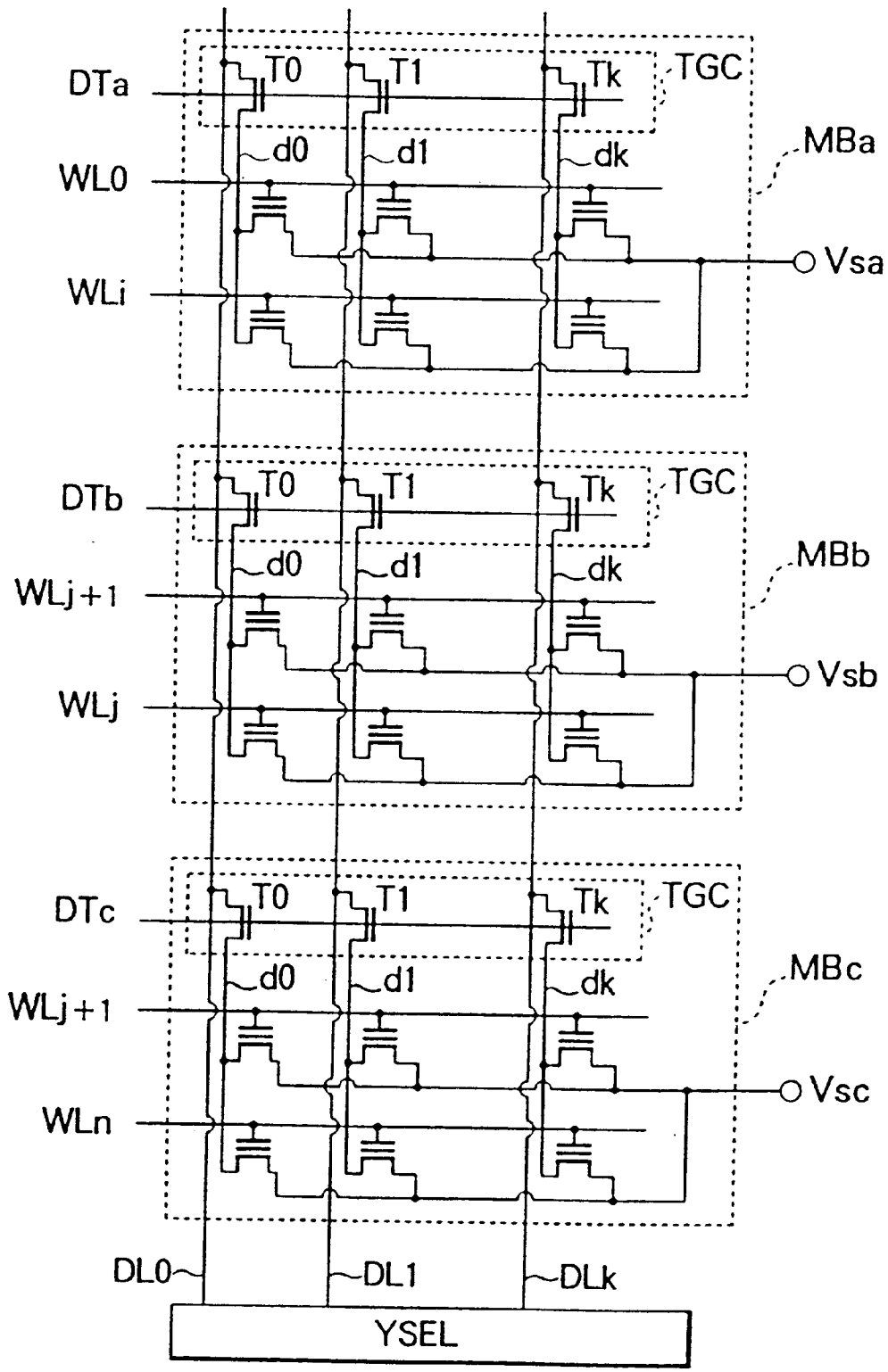
FIG. 38 is a circuit diagram showing an example of a memory array in which the data line structure is constructed of main data lines and subsidiary data lines.

As shown in FIG. 38, the data line structure is constructed of main data lines and subsidiary data lines. Main data lines DL0 to DLk extend to reach all memory blocks MBa to MBc. Subsidiary data lines d0 to dk extend only inside each memory block to connect to drains of memory cells contained in a corresponding memory block. In this case, connection of the main data lines DL0 to DLk to the subsidiary data lines d0 to dk is set up through a transfer gate circuit TGC allotted to each memory block. Such a structure can be realized easily by, for example, a two-layer aluminum wiring structure. Since in the main/subsidiary data line structure the transfer gate circuit TGC is provided in each memory block, write data line potential Vp can be applied to only a selected block for writing. Accordingly, counter measurements against data line disturbance can further be perfected.

Figure 40:
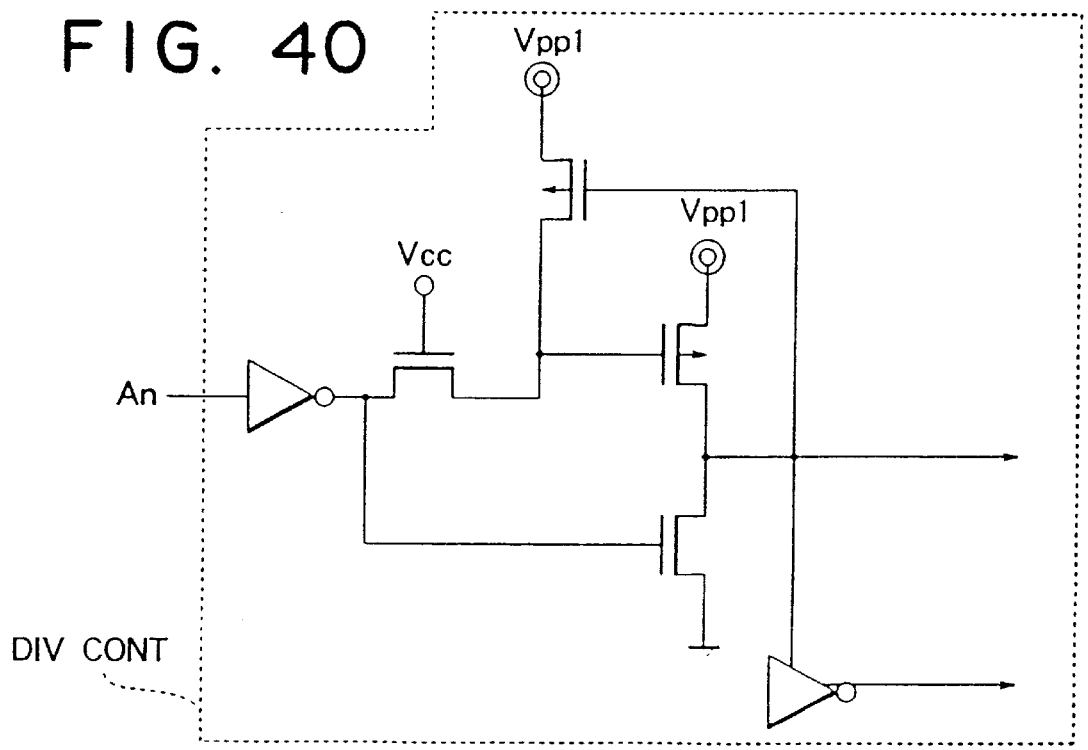
FIG. 40 is a diagram for explaining an example of a control circuit in FIG. 39.
Figure 39:
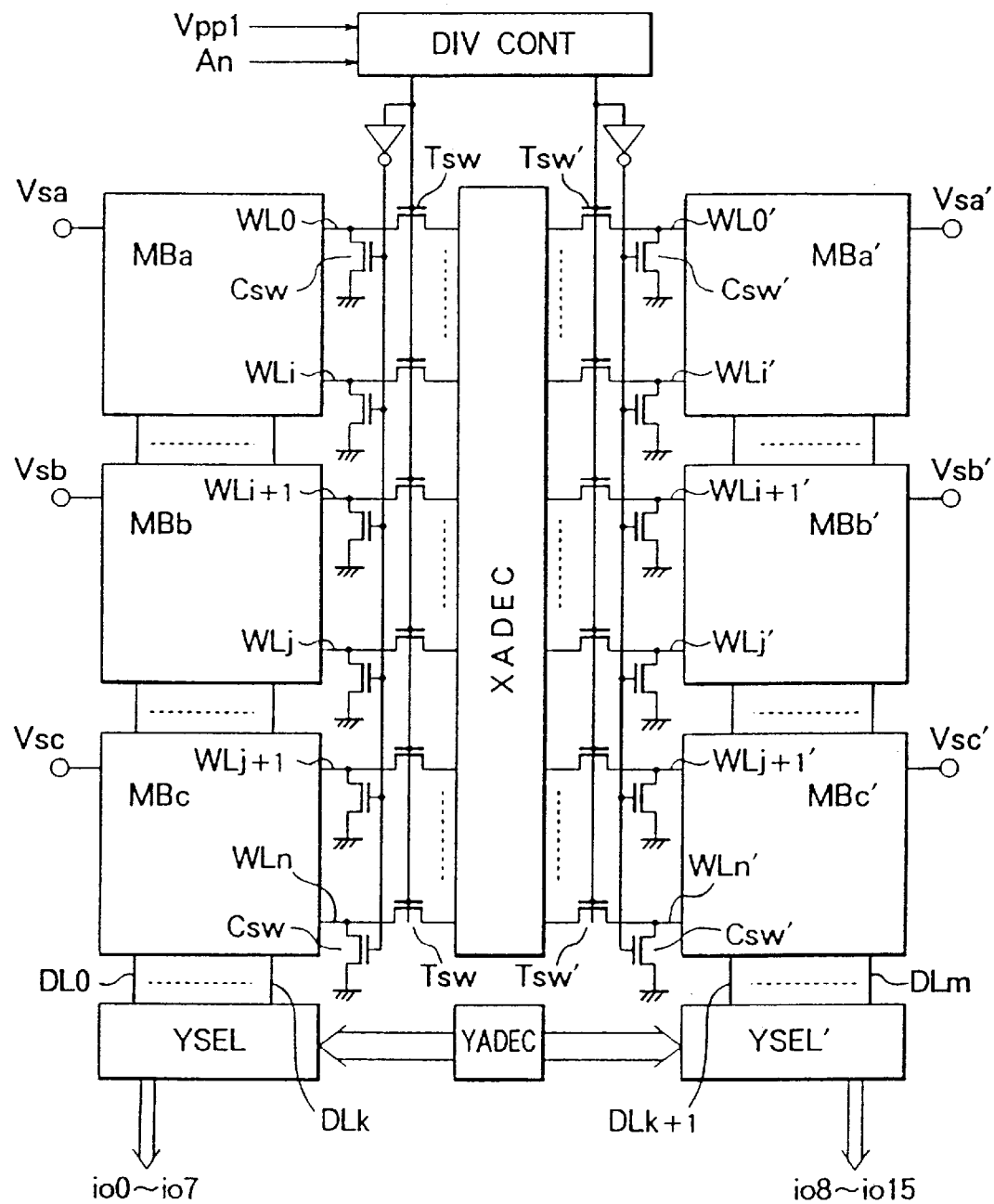
FIG. 39 is a diagram for explaining an example in which simultaneously erasable memory blocks are arranged on the left and right sides of an X address decoder.

FIG. 39 shows an embodiment in which simultaneously erasable memory blocks are arranged on the left and right sides of an X address decoder. Decode signals of X address decoder XADEC are delivered to the left and right sides thereof. Then memory blocks MBa to MBc and MBa 'to MBc' each defined in a unit of word line arranged on each side of the X address decoder XADEC are provided on the left and right sides thereof. As each memory block, any one of the previously described memory blocks can be adopted. The memory blocks on the left and right sides perform input/output of data io0 to io7 and data io8 to io15, respectively, in a unit of 8 bits through Y selection circuits YSEL and YSEL'. Transfer MOS transistors Tsw are provided between left-hand outputs of the X address decoder XADEC and word lines WL0 to WLn in one to one correspondence relationship and similarly, transfer MOS transistors Tsw' are provided between right-hand outputs of the X address decoder XADEC and word lines WL0 'to WLn' in one to one correspondence relationship. Further, the left-hand word lines are associated with discharge MOS transistors Csw and the right-hand word lines are associated with discharge MOS transistors Csw'. A control circuit DIVCONT is, responsive to a high voltage Vpp1 (=Vpp such as 12V) and the most significant address bit An, adapted to perform switching control of the left-hand transfer MOS transistors Tsw and discharge MOS transistors Csw and of the right-hand transfer MOS transistors Tsw' and discharge MOS transistors Csw'. Though not limitedly, the control circuit DIVCONT receives a high voltage Vpp1 and the most significant address bit An of an address signal and performs complementary switching control between the left-hand transfer MOS transistors Tsw and discharge MOS transistors Csw and the right-hand transfer MOS transistors Tsw' and discharge MOS transistors Csw' in accordance with a logical value of the most significant address bit An. For example, when the most significant address bit An is logical "1", the right-hand transfer MOS transistors Tsw' are rendered to be on and the left-hand transfer MOS transistors Tsw are rendered to be off, so that write data can be supplied through the right-hand Y selection circuit YSEL'. At that time, the right-hand discharge MOS transistors Csw' are rendered to be off and the left-hand discharge MOS transistors Csw are rendered to be off. When the most significant address bit An is logical "0", the left-hand transfer MOS transistors Tsw are rendered to be on and the right-hand transfer MOS transistors Tsw' are rendered to be off, so that write data is supplied through the left-hand Y selection circuit YSEL. At that time, the right-hand discharge MOS transistors Csw' are rendered to be on and the left-hand discharge MOS transistors Csw are rendered to be off. Selection operation of the left-hand and right-hand Y selection circuits YSEL and YSEL' depends on a decode output of a Y address decoder YADEC but any one of the left-hand and right-hand Y selection circuits YSEL and YSEL' may be activated by the most significant address bit An or a signal equivalent thereto or any one of the left-hand and right-hand Y selection circuits may be selected as the supply path of write data by means of a separate selection circuit not shown. A signal voltage for rendering the transfer MOS transistors Tsw and Tsw' on is set to a high voltage during write and an example of the control circuit DIVCONT for this purpose is shown in FIG. 40. A voltage Vpp1 in FIG. 40 can be generated using a power supply circuit of FIG. 51 to be described later.

As a comparableness to the configuration shown in FIG. 39, a configuration may be mentioned in which an X address decoder is arranged at one end side of word lines. In this case, the word line direction size of a memory block defined in a minimum unit of word line is doubled as compared to that in FIG. 39. In comparison with the configuration of FIG. 39, this configuration can contribute to reduction of the word line disturbance time of a selected block for writing. More particularly, with reference to FIG. 26B, in the selected block 30 for writing, there is a memory cell associated with a word line applied with high voltage Vpp and with a data line not applied with write voltage Vp. In the selected block 30 for writing, the memory cell placed in word line selection condition and data line non-selection condition suffers from a large potential difference between the control gate and floating gate, with the result that electric charge is discharged from the floating gate to the control gate and the threshold of the memory cell transistor is forced to be decreased undesirably. This phenomenon is word line disturbance and in proportion to prolongation of this state, the threshold decreases. Accordingly, like the data line disturbance, time for the word line disturbance state to continue (word line disturbance time) is desired to be short. From this viewpoint, the configuration of FIG. 39 is more advantageous than the comparative configuration in that the number of memory cells exposed to the word line disturbance state can be halved on the presumption that write is effected in a unit of 8 bits. This contributes to reduction of the word line disturbance time.

Figure 41:
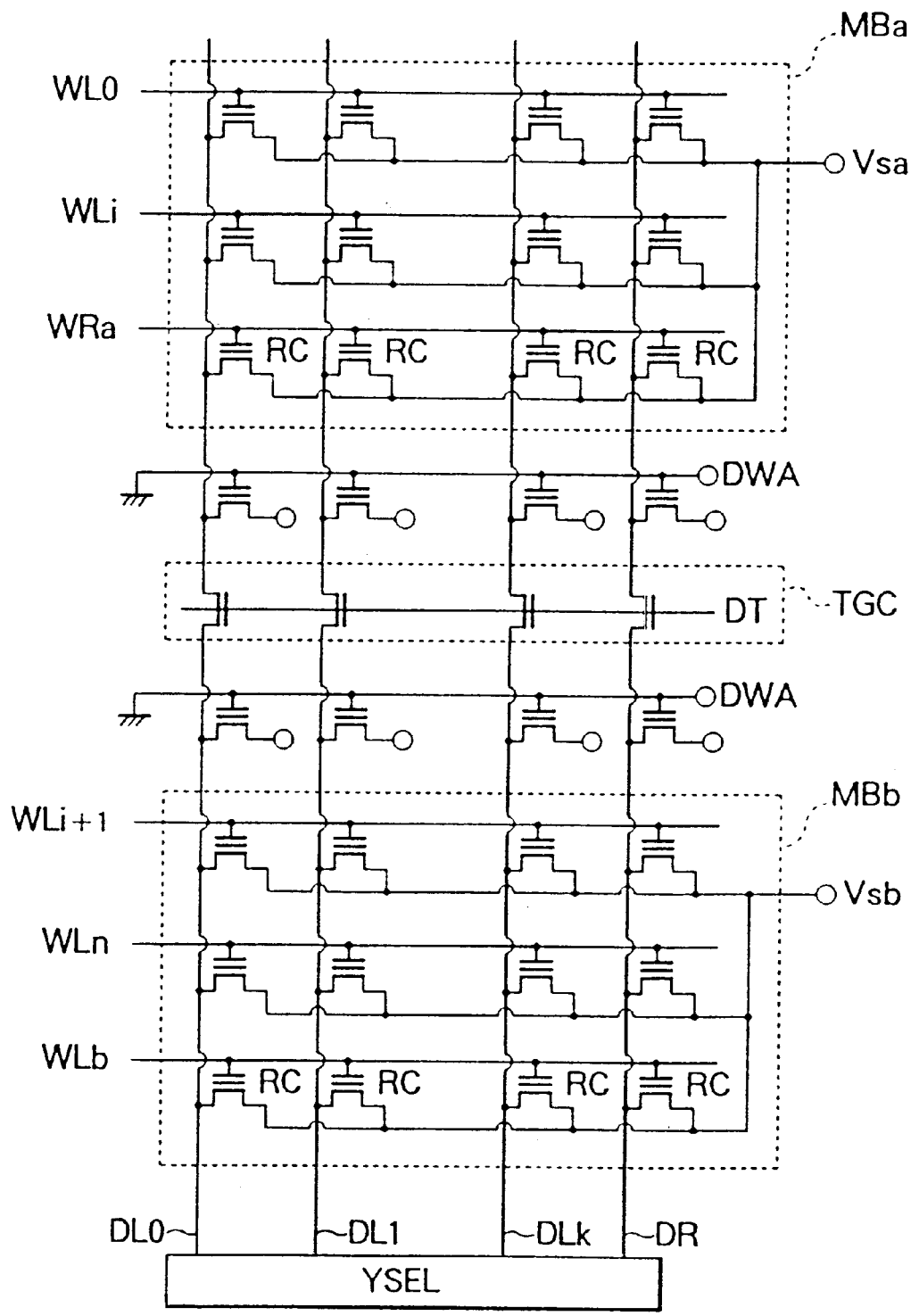
FIG. 41 is a diagram for explaining an embodiment in which redundant words are provided in a memory block.
Figure 42:
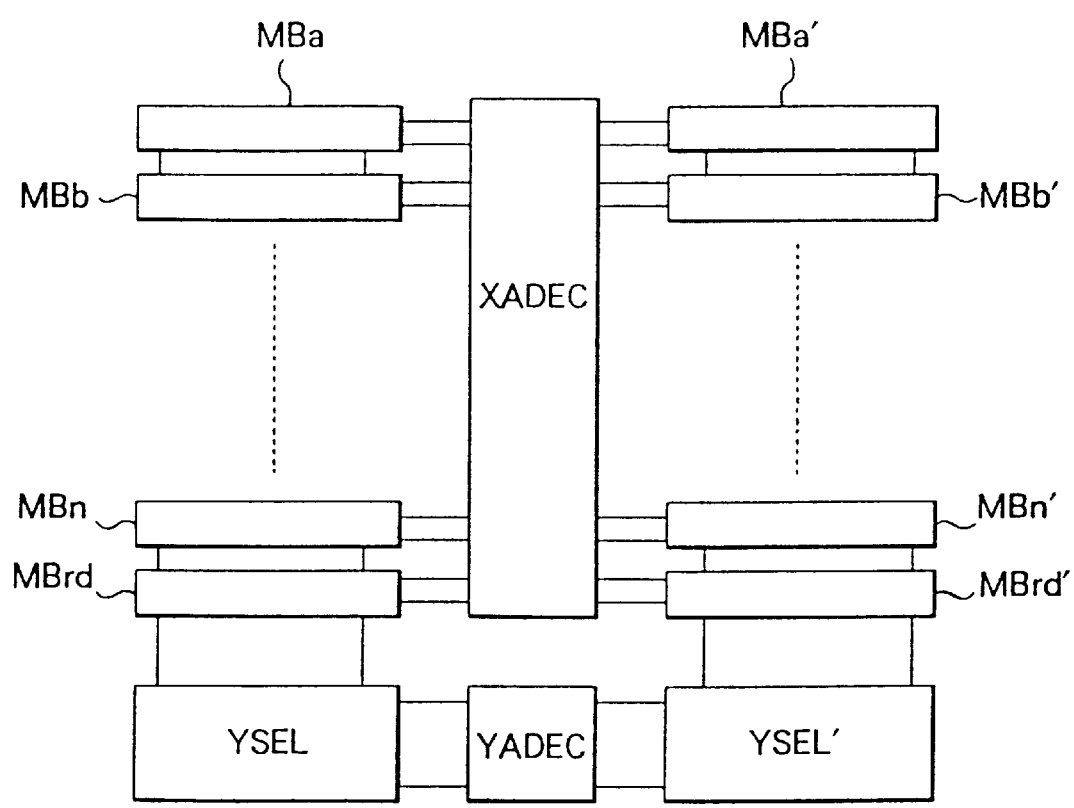
FIG. 42 is a diagram for explaining an embodiment in which memory blocks dedicated to redundancy are provided.

FIG. 41 shows an embodiment directed to the provision of redundant words in a memory block. In the figure, a redundant word line WRa, a redundant data line DR and redundant memory cells RC for relieving a defective word line are arranged in a memory block MBa and a redundant word line WRb, a redundant data line DR and redundant memory cells RC for the same purpose are arranged in a memory block MBb. With the redundant words provided in the memory blocks MBa and MBb, when a defective word is desired to be relieved, the defective word can be relieved using a redundant word in the same block as a memory block to which the defective word belongs. For example, in the event that a word in the memory block MBa is defective, the word can be relieved by a redundant word WRa in the memory block MBa of interest. Through this, even when the defective word is replaced with the redundant word, the counter measurements against data line disturbance can also be applied to the redundant word under quite the same condition. As redundant words, memory blocks MBrd and MBrd' dedicated to redundancy may be provided as shown in FIG. 42.

Figure 43:
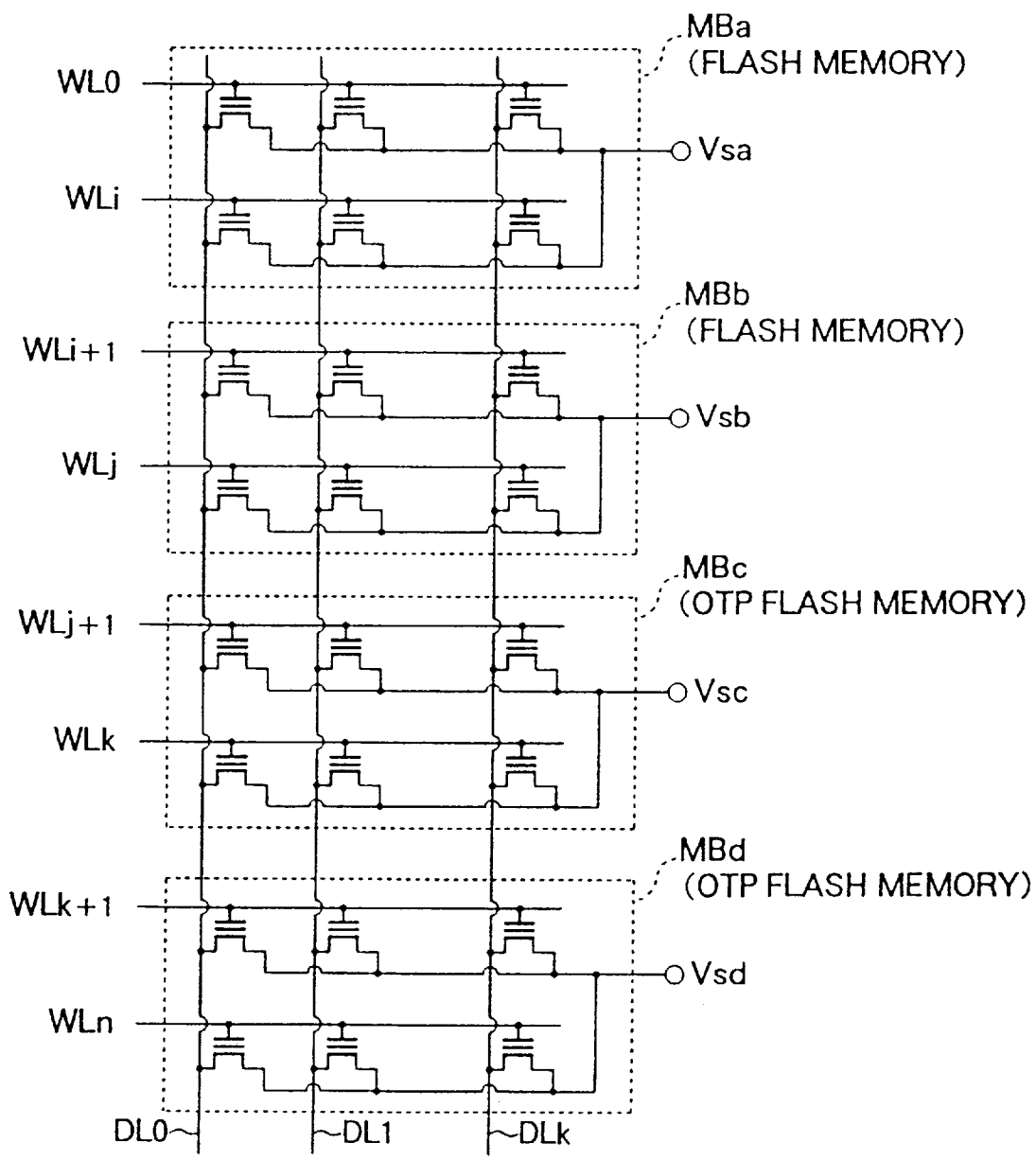
FIG. 43 is a diagram for explaining an embodiment in which some memory blocks are formed into one-time programmable areas.

FIG. 43 shows an embodiment in which some memory blocks are formed into one-time programmable areas (OTP-flash). In an area formed into a one-time programmable area, only one-time write of desired data is allowed. In the figure, memory blocks MBc and MBd are memory blocks which are formed into one-time programmable areas. Structurally, the memory blocks MBc and MBd per se which are formed into one-time programmable areas are quite the same as the other memory blocks. A specified memory block can be formed into a one-time programmable area by selectively suppressing rewrite of the memory block in question. For example, a designation bit of an erase register for designating a memory block which is scheduled to be formed into a one-time programmable area is forced to assume an unselection level by means of a nonvolatile memory device and a path for supplying a write voltage to a word line of the memory block of interest is so designed as to be breakable by means of the nonvolatile memory device. Through this, the memory block formed into a one-time programmable area and the other memory blocks can have in common an X address decoder, a Y address decoder and data lines. In this case, most conveniently, a transistor similar to a memory cell transistor of the flash memory may be utilized as the nonvolatile memory device. In a write operation, source lines Vsc and Vsd of the memory blocks formed into one-time programmable areas are applied with the data line disturbance prevention voltage Vddi to prevent a data line disturbance defect of these memory blocks. With some memory blocks formed into one-time programmable areas in this manner, occurrence of such a trouble that data once written is subsequently rewritten undesirably can be prevented. For example, the memory block formed into a one-time programmable area can be utilized as a program holding area or a data holding area which needs to be prevented from being altered.

Figure 44:
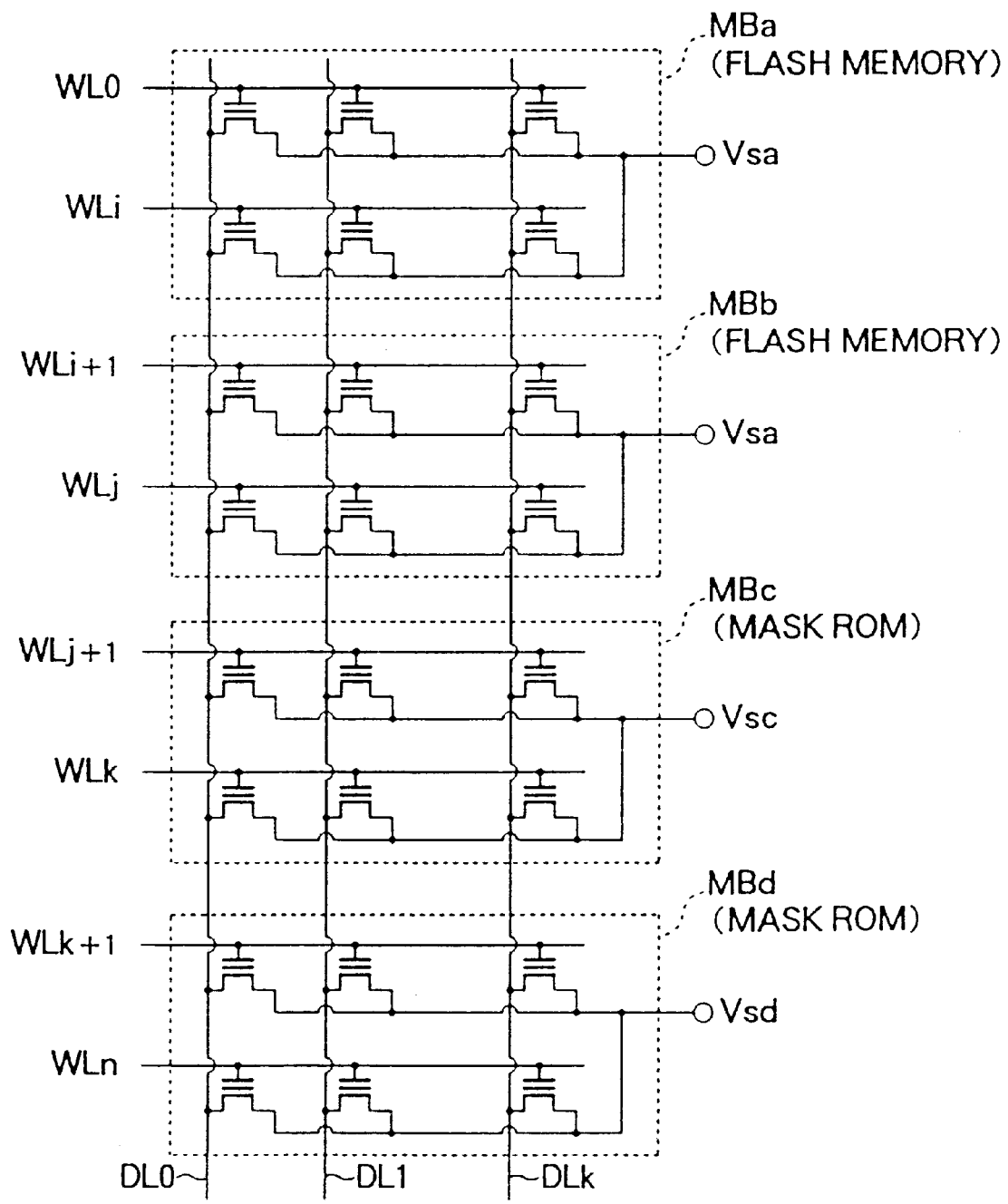
FIG. 44 is a diagram for explaining an embodiment in which some memory blocks are formed into mask ROM's.

FIG. 44 shows a configuration in which some memory blocks are formed into mask ROM's, in place of the configuration in which some memory blocks are formed into one-time programmable areas. In the figure, memory blocks MBc and MBd are areas which are formed into mask ROM's. By adopting this configuration, write of the memory blocks MBc and MBd becomes absolutely impossible. Upon write, word lines of the memory blocks MBc and MBd formed into mask ROM's are inhibited from being applied with a write high voltage and source lines Vsc and Vsd of these memory blocks are biased by a voltage such as Vddi. Upon erase, the common source lines Vsc and Vsd of the memory blocks MBc and MBd are inhibited from being applied with an erase high voltage.

[19] Layout Configuration of Memory Blocks

Figure 45:
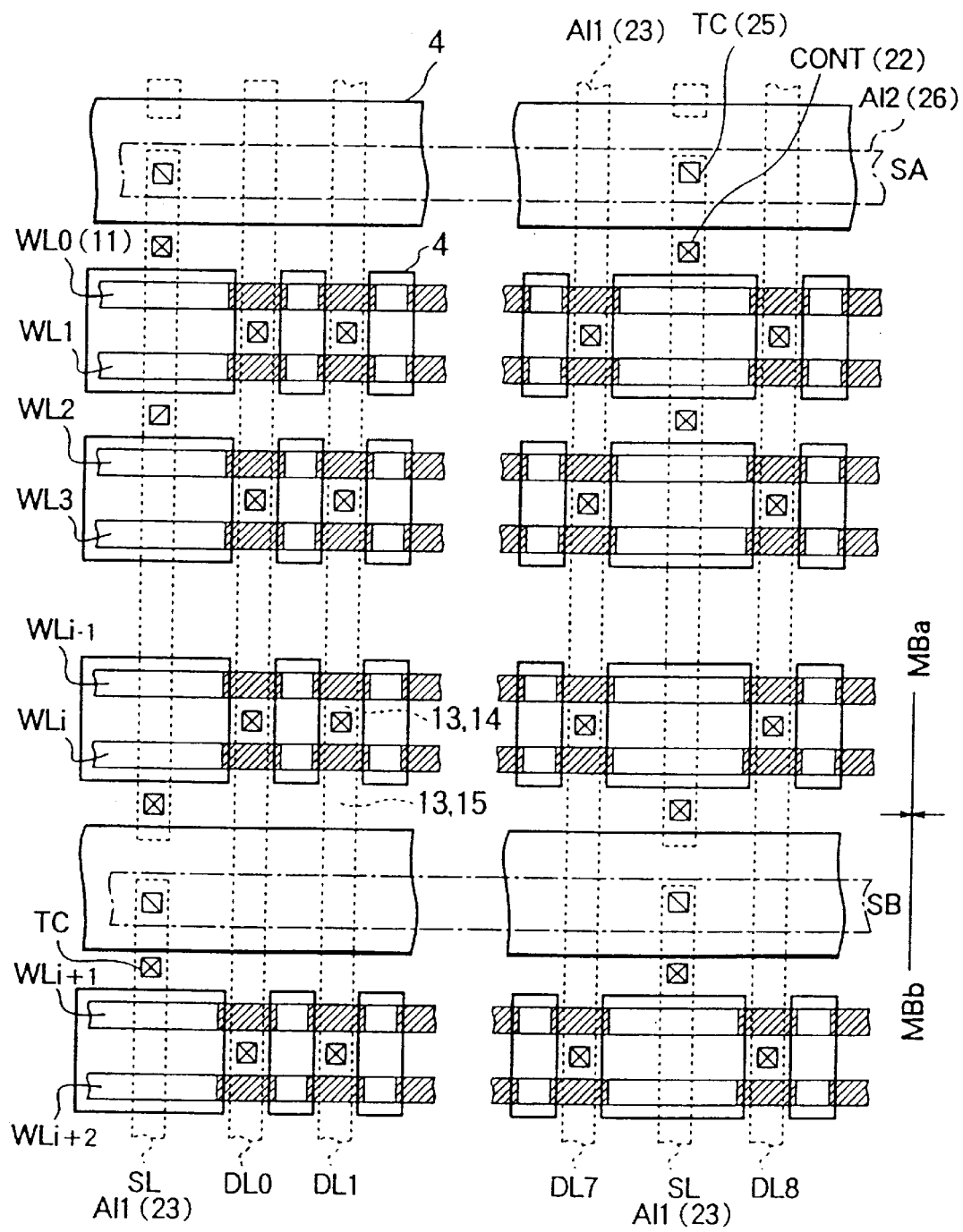
FIG. 45 is a diagram for explaining an example of a layout pattern of memory blocks.

FIG. 45 shows an example of a layout configuration of memory blocks. The layout configuration shown in the figure is an example where a transfer gate circuit TGC is not arranged between memory blocks MBa and MBb. In the figure, a memory cell includes a control gate 11 integral with a word line, a floating gate (fg) 8 formed separately from the control gate to underlie it, a drain formed of an N type semiconductor region 13 and a P type semiconductor region 14, and a source formed of the N type semiconductor region 13 and an N type semiconductor region 15. Individual memory cells are separated from each other by a thick field insulating film 4. Word lines WL0 to WLi+2 are separated from each other and formed in parallel in the lateral direction in the figure. Data lines DL0 to DL8 are formed of a first wiring layer 23 having a first aluminum layer (Al1) and are separated from each other so as to be arranged in intersectional relation with the word lines, thus extending in parallel in the longitudinal direction in the figure. The data line is connected to the drain common to an adjacent memory cell through a contact (CONT) 22. Sources of memory cells are each formed of the N type semiconductor regions 13 and 15 and are connected every 8 bits to a source line SL formed of the first wiring layer 23 through the contact 22. The source line SL is parallel to the data lines DL0 to DL8. The source line SL in each memory block is broken at the block end so as to be disconnected from the source line SL of an adjacent memory block. Contrarily to this, the data lines DL0 to DL8 extend to pass through adjacent blocks. The source line SL in one memory block connects, at the block end, to a common source line SA or SB formed of a second wiring layer (Al2) such as a second aluminum layer through a through hole (TC) 25. The common source lines SA and SB extend in parallel to the word lines to underlie the field oxide film 4. In this manner, the source line in a unit of memory block is provided separately. The common source line SA or SB may be arranged at opposite block ends or at the center of the memory block. Though not illustrated, each word line is shunted every 16 bits to the second wiring layer 26 overlying the word line to reduce a delay component of the word line.

Figure 46:
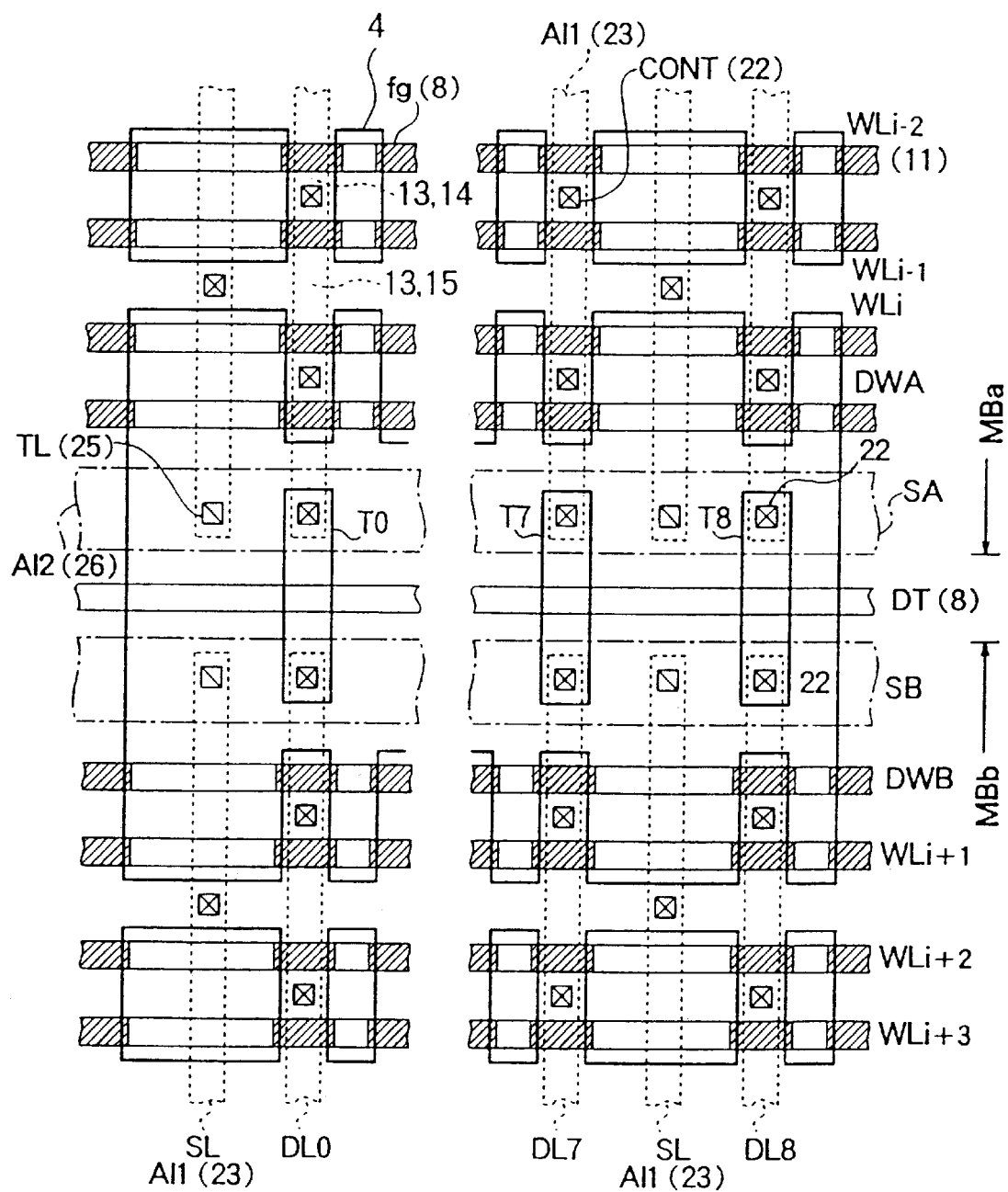
FIG. 46 is a diagram for explaining a layout pattern in which transfer gate MOS transistors are provided between memory blocks.
Figure 47:
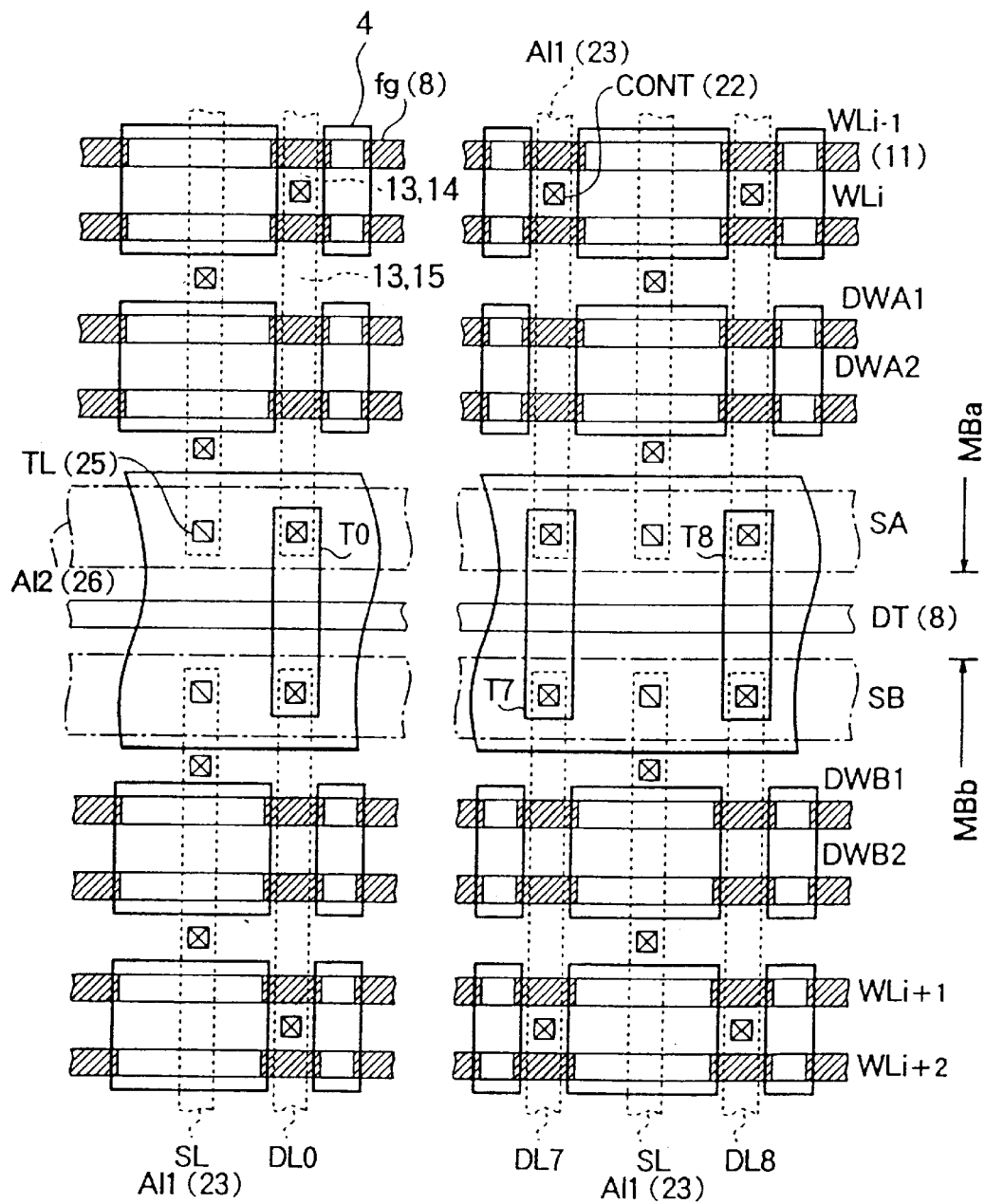
FIG. 47 is a diagram for explaining a pattern in which the drain of a dummy cell is floating in contrast to the configuration of FIG. 46.

FIG. 46 shows an example of a layout configuration in which a transfer gate circuit is provided between memory blocks. The transfer gate circuit is constructed by arranging transfer MOS transistors T0 to T8 each formed of a high breakdown voltage N channel type MOS transistor having its gate electrode in the form of a first conductive layer 8 between common source lines SA and SB of adjacent memory blocks MBa and MBb. In this case, data lines are broken at adjacent ends of the memory blocks MBa and MBb. A broken end of one of the data lines having mutually opposing broken ends is connected to the drain of each of the transfer MOS transistor T0 to T8 through a contact 22 and a broken end of the other data line is connected to the source of each of the transfer MOS transistors T0 to T7 through a contact 22. A memory cell at an end of each of the opposing memory blocks is used as a dummy cell having its source being, in this example, floating. FIG. 47 shows a configuration in which the drain of a dummy cell is floating in contrast to the configuration of FIG. 46.

Figure 48:
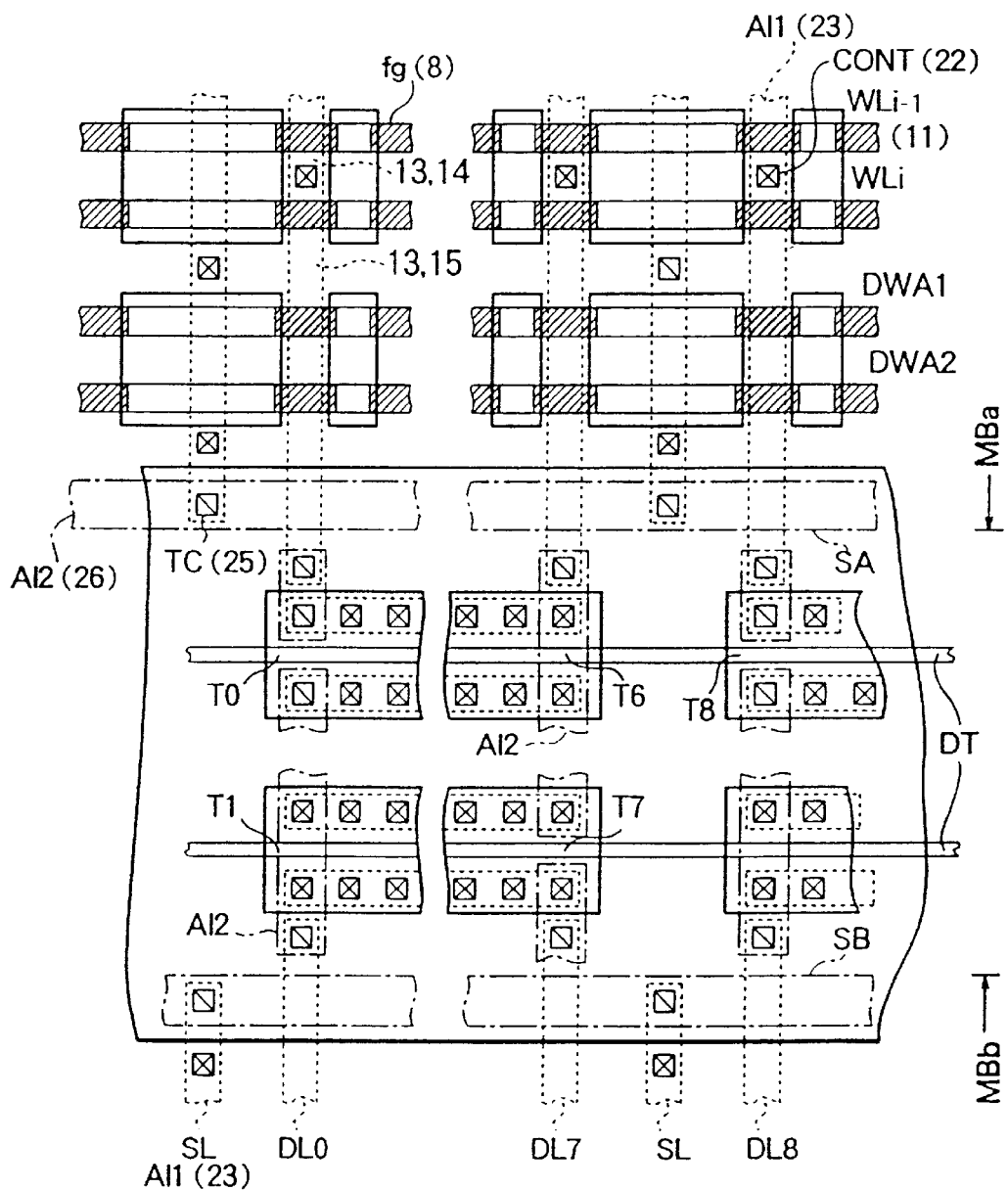
FIG. 48 is a diagram for explaining a layout pattern in which transfer MOS transistors are substantially increased in size.

FIG. 48 shows an example of a layout configuration in which transfer MOS transistors T0 to T7 are substantially increased in size. In this example, the gate width of each of the transfer MOS transistors T0 to T7 is increased to prevent a decrease in data line potential caused by each of the transfer MOS transistors T0 to T7. More specifically, in the example of FIG. 48, the transfer MOS transistors T0, T2, T4 and T6 are arranged on the side of a memory block MBa in parallel with word lines and the transfer MOS transistors T1, T3, T5 and T7 are arranged on the side of a memory block MBb in parallel with word lines. A data line DL0 extending from the side of memory block MBb passes above the transfer MOS transistor T1 so as to be coupled to the transfer MOS transistor T0 and a data line DL0 extending from the side of memory block MBa is coupled to the transfer MOS transistor T0. An adjacent data line DL1 extending from the side of memory block MBa passes above the transfer MOS transistor T0 so as to be coupled to the transfer MOS transistor T1 and a data line DL1 extending from the side of memory block MBb is coupled to the transfer MOS transistor T1. The other transfer MOS transistors are also coupled to data lines in a similar manner. The number of stacking of transfer MOS transistors is not limited to 2 as above but can equal the number of data lines between source lines SL at maximum.

Figure 49:
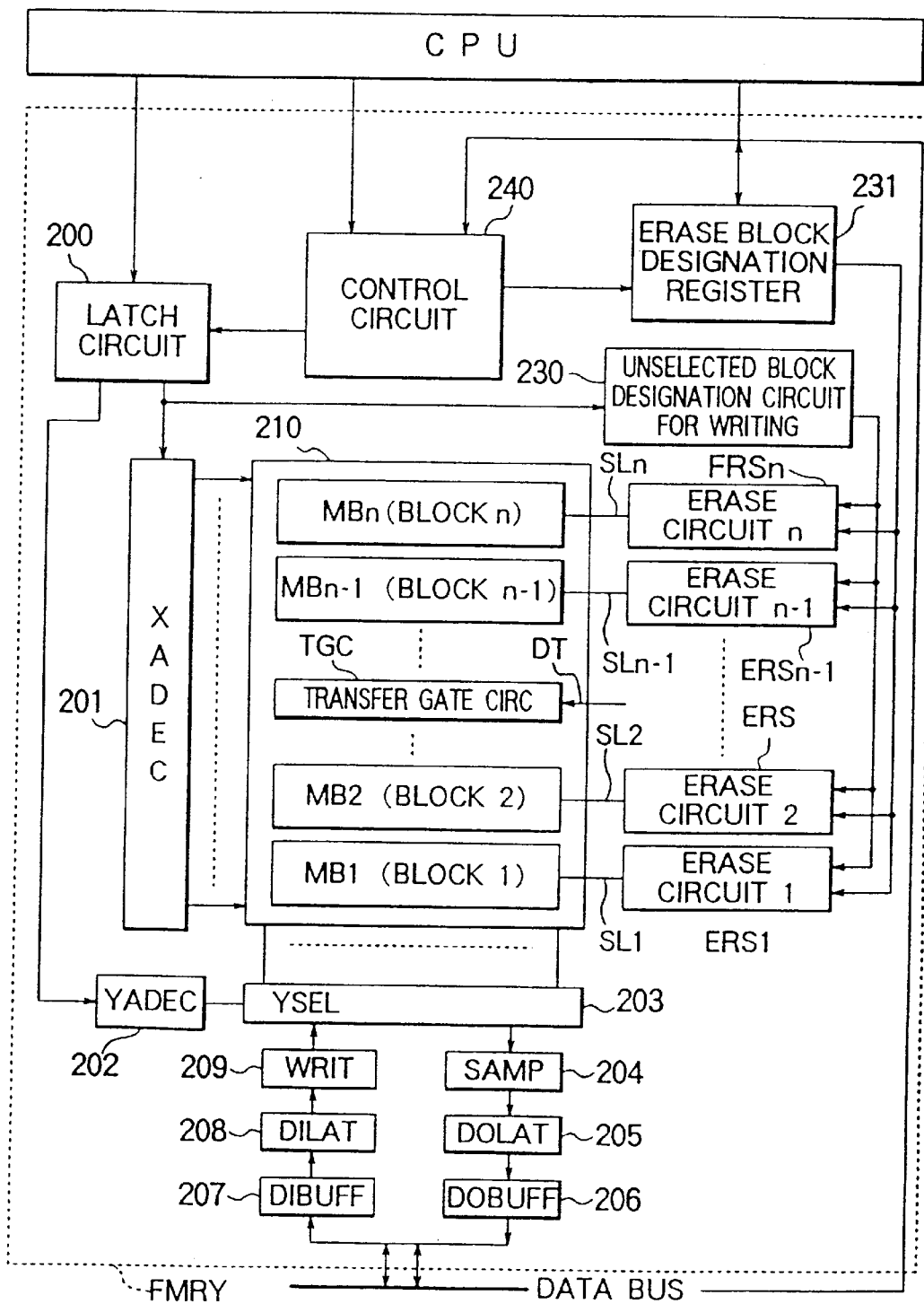
FIG. 49 is a block diagram showing an embodiment of the whole of a flash memory applied with pluralization of memory blocks in a unit of word line and countermeasures against data line disturbance.

[20] The Whole of a Flash memory Applied With Countermeasures Against Data Line Disturbance FIG. 49 is a block diagram showing an embodiment of the whole of a flash memory applied with pluralization of memory blocks in a unit of word line and countermeasures against data line disturbance. The flash memory shown in the figure is incorporated in a microcomputer. In the figure, 210 designates a memory array in which memory cells each constructed of an insulated gate field effect transistor of two-layer gate structure as previously explained with reference to, for example, FIG. 11 are arranged in matrix. In the memory array ARY, as in the case of the configuration explained in connection with FIG. 25, memory cells have control gates connected to corresponding word lines, drain regions connected to corresponding data lines and source regions connected to source lines SL1 to SLn being each common to respective memory blocks MB1 to MBn defined each in a unit of word line. The source lines SL1 to SLn of the respective memory blocks are separately connected to erase circuits ERS1 to ERSn, respectively. In the figure, n memory blocks MB1 to MBn are shown and as exemplified in FIG. 18, these memory blocks may be divided into 7 large memory blocks (large blocks) LMB0 to LMB6 each having a relatively large storage capacity and 8 small memory blocks (small blocks) SMB0 to SMB7 each having a relatively small storage capacity. The large memory block may be used as a program storing area or a large capacity data storing area. The small memory block may be used as a small capacity data storing area.

In FIG. 49, 200 designates an address buffer and address latch circuit having its input coupled to an internal address bus of a microcomputer. Denoted by 201 is an X address decoder (XADEC) for driving a word line by decoding a row address signal (X address signal) latched in the address buffer and address latch circuit 200. For example, the X address decoder 201 drives a given word line with a voltage of, for example, 5V in a data read operation and drives a given word line with a high voltage of, for example, 12V in a data write operation. In a data erase operation, all outputs of the X address decoder 201 are maintained at a low voltage level of, for example, 0V. Denoted by 202 is a Y address decoder (YADEC) for decoding a Y address signal latched in the address buffer and address latch circuit 200. Denoted by 203 is a Y selection circuit (YSEL) for selecting a data line in accordance with a data line selection signal delivered out of the Y address decoder 202. The data line is related to the Y selection circuit such that one memory mat corresponds to one I/O as described with reference to FIG. 25. Though not limitedly, the memory array is divided into 16 memory mats. In this case, each of the memory blocks MB1 to MBn extends over 16 memory mats. Denoted by 204 is a sense amplifier (SAMP) for amplifying a read signal from a data line selected by the Y selection circuit 203 in a data read operation. According to the present embodiment, the sense amplifier includes 16 amplifier circuits in correspondence to output bits of the memory mats. Denoted by 205 is a data output latch (DOLAT) for holding an output of the sense amplifier 204. Denoted by 206 is a data output buffer (DOBUFF) for delivering data held in the data output latch 205 to the outside. An output of the data output buffer 206 is coupled to a 16-bit internal data bus of the microcomputer in bit correspondence relationship. According to this example, read data is of 2 bytes at maximum. Denoted by 207 is a data input buffer (DIBUFF) for fetching write data supplied from the outside. Data fetched in from the data input buffer 207 is held in a data input latch (DILAT) 208. When the data held in the data input latch 208 is "0", a write circuit (WRIT) 209 supplies a write high voltage to a data line selected by the Y selection circuit 203. This write high voltage is supplied to the drain of a memory cell having its control gate applied with a high voltage in accordance with an X address signal, causing the memory cell of interest to be written.

Each of the erase circuits ERS1 to ERSn supplies an erase high voltage to a source line of a designated memory block to perform simultaneous erase of the memory block. Which one of the erase circuits is to be caused to effect an erase operation is controlled by a setting bit of an erase block designation register 231. The erase block designation register 231 corresponds to the registers MBREG1 and MBREG2 explained with reference to FIG. 18. As described with reference to FIG. 26, the erase circuits ERS1 to ERSn are operative upon writing to apply ground potential GND to a source line of a selected block for writing and data line disturbance prevention voltage Vddi to a source line of an unselected block for writing. This control is carried out by an unselected block designation circuit for writing 230. The unselected block designation circuit for writing 230 receives an X address signal delivered out of the address buffer and address latch circuit 200 and decodes the signal to decide a selected block for writing, designate the application of ground potential GND to an erase circuit associated with the selected block for writing and designate the application of data line disturbance prevention voltage Vddi to an erase circuit associated with an unselected block for writing.

In FIG. 49, 240 designates a control circuit for performing timing control of a data read operation and selection control of various timings and voltages for write and erase.

Figure 50:
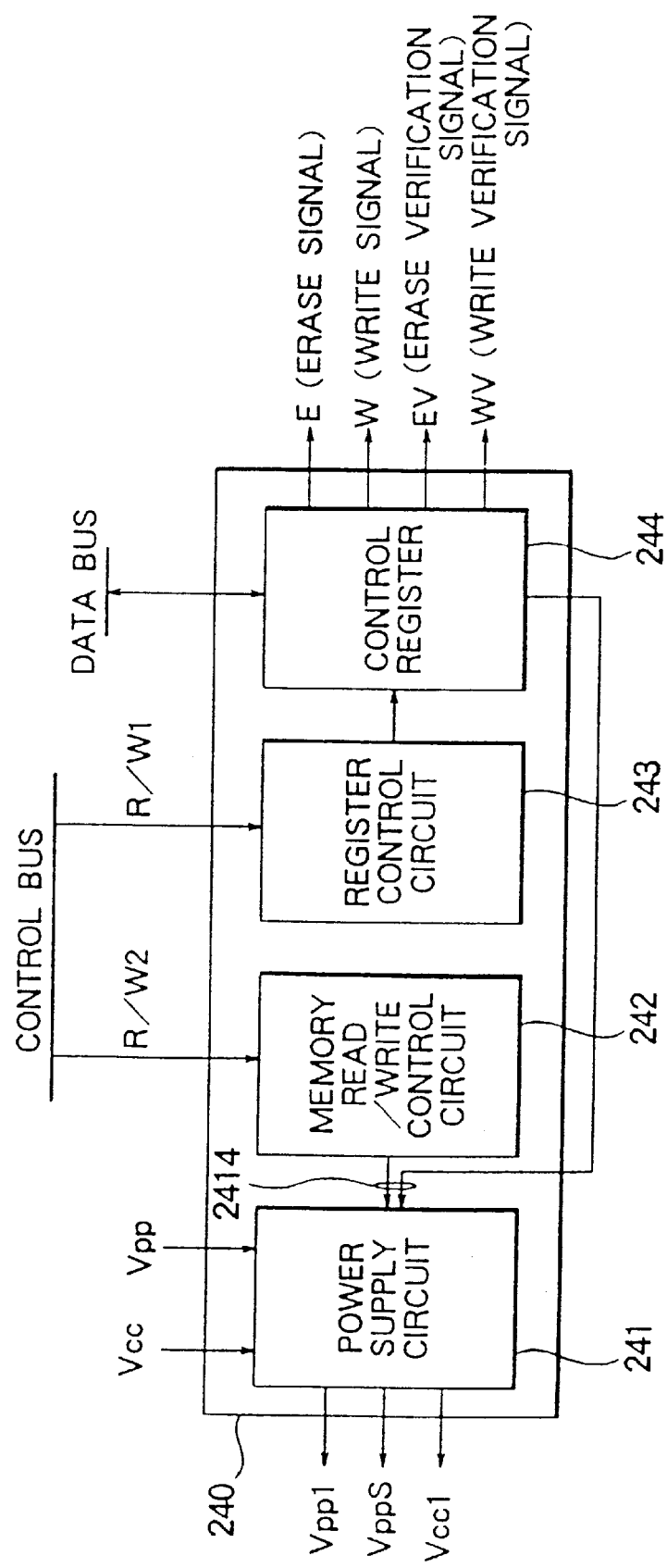
FIG. 50 is a block diagram showing details of a control circuit included in the flash memory of FIG. 49.

FIG. 50 shows an example of the control circuit 240. The control circuit 240 has a power supply circuit 241, a memory read/write control circuit 242, a register control circuit 243 and a control register 244. The control register 244 has the program/erase control register PEREG explained in connection with FIGS. 16 and 18. The control circuit FCONT shown in FIG. 16 may be considered to correspond to the control circuit 240 and the erase block designation register 231 shown in FIG. 49. An erase signal E, a write signal W, an erase verification signal EV and a write verification signal WV correspond to an E bit, a P bit, an EV bit and a PV bit of the program/erase control register PEREG. As described with reference to FIG. 18, an erase/write operation is controlled in accordance with the contents set in the program/erase control register PEREG. On the basis of a read/write signal R/W1 and the like supplied through a control bus, the register control circuit 243 controls read/write of the program/erase control register PEREG and erase block designation register 231 (MBREG1 and MBREG2) included in the control register 244. On the basis of a read/write signal R/w2 and the like supplied through the control bus, the memory read/write control circuit 242 controls operation of the data input buffer 207, data input latch circuit 208, data output buffer 206, data output latch circuit 205, address buffer and address latch circuit 200 as well as operation of the power supply circuit 241. The power supply circuit 241 receives power supply voltage Vcc such as 5V and high voltage Vpp such as 12V and forms voltages Vpp1, VppS and Vcc1 in accordance with a setting bit of the program/erase control register PEREG included in the control register 244 and an output control signal of the memory read/write control circuit 242.

Figure 51:
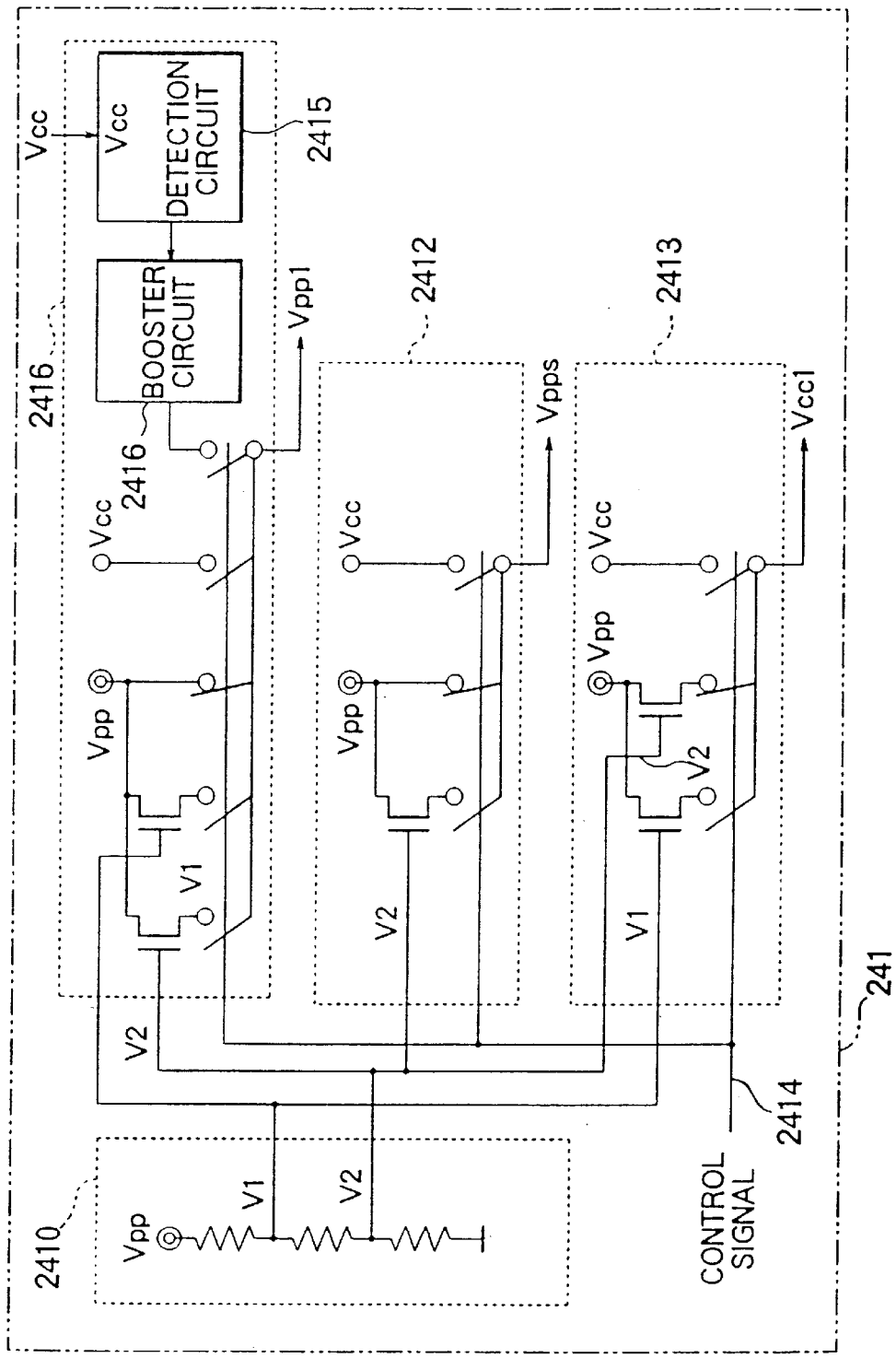
FIG. 51 is a diagram for explaining details of a power supply circuit included in the flash memory of FIG. 49.

FIG. 51 shows an example of a circuit diagram of the power supply circuit 241. The power supply circuit 241 includes a reference voltage generation circuit 2410, a decoder drive power supply circuit 2411, a source circuit drive power supply circuit 2412 and a sense amplifier drive power supply circuit 2413. In the reference voltage generation circuit 2410, a high voltage Vpp (e.g., 12V) is divided by resistors to generate reference voltages V1 (e.g., 3.5V) and V2 (e.g., 6.5V). In accordance with the operation state of the flash memory the decoder drive power supply circuit 2411 generates voltage Vpp1 for determining a drive voltage of word line. The operation state of the flash memory is transmitted to the power supply circuit 241 by means of a control signal 2414 from the control register 244 and memory read/write control circuit 242 so that an internal switch circuit may be controlled to optimize the value of voltage Vpp1 in accordance with the operation state. An example of an output waveform of voltage Vpp1 varying with the internal operation state is shown in FIG. 52. The decoder drive power supply circuit 2411 has a detection circuit 2415 for detecting or discriminating whether the power supply voltage Vcc has a higher voltage (e.g., 5V) or a lower voltage (e.g., 3V) than the threshold voltage (e.g., 4V) and a booster circuit 2416 for boosting power supply voltage Vcc when the power supply voltage Vcc is detected as being lower than the threshold voltage. A boosted voltage is utilized when a read operation is effected with the power source voltage Vcc (such as of 3V) lower than the threshold voltage. The source circuit drive power supply circuit 2412 generates voltage VppS utilized for drive of source line in accordance with the control signal 2414. The sense amplifier drive power supply circuit 2413 generates voltage Vcc1 utilized as drive voltage of the sense amplifier in accordance with the control signal 2414. Voltage waveforms of voltages VppS and Vcc1 varying with the internal state of the flash memory are depicted in FIG. 52.

Figure 53A:
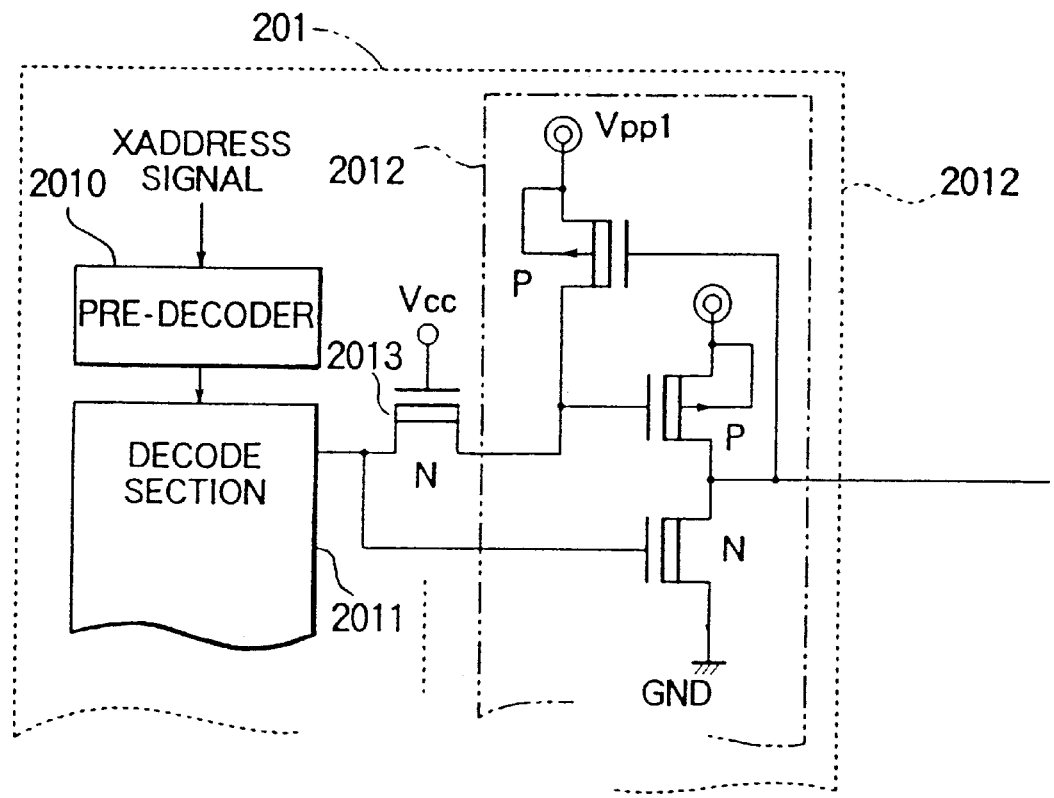
FIGS. 53A and 53B are diagrams for explaining details of an X address decoder included in the flash memory of FIG. 49.

FIG. 53A shows an example of the X address decoder 201. In the figure, the construction corresponding to one word line is typically illustrated. The X address decoder consists of a pre-decoder 2010 for receiving an X address signal, a decode section 2011 for decoding an output of the pre-decoder and a drive section 2011 for driving a word line on the basis of an output of the decode section 2011. The pre-decoder 2010 and decode section 2011 are operated with a power supply voltage Vcc such as 5V system. The drive section 2012 is constructed as a high voltage driven system which is driven by a voltage such as the voltage Vpp1. Denoted by 2013 is a high breakdown voltage N channel type MOS transistor for separating the 5V system from the high voltage system.

Figure 53B:
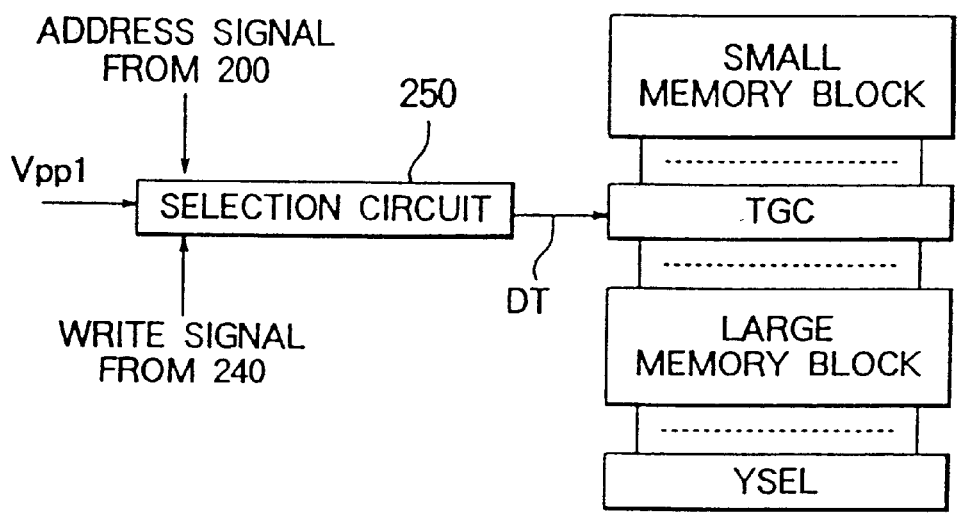

When the transfer gate circuit TGC as described with reference to FIGS. 32 to 35 is adopted, the large memory blocks LMB0 to LMB6 shown in FIG. 16 correspond to memory blocks MB1 to MB7 of FIG. 49 and the small memory blocks SMB0 to SMB7 correspond to memory blocks MB8 to MBn of FIG. 49. In FIG. 49, the transfer gate circuit TGC is arranged between the memory blocks MB7 and MB8, though not illustrated particularly. FIG. 53B shows an example of a selection circuit 250 for generating a switching signal DT of the transfer gate circuit TGC. The selection circuit 250 receives the voltage Vpp1 from the power supply circuit 241, address signal from the address buffer 20B and write signal from the control circuit 240 to cut off the transfer gate circuit TGC upon write of the large memory blocks. In particular, the signal DT is set to 0V corresponding to ground potential upon write of the large memory block but in the other case, set to voltage Vpp1, though not limitedly.

Figure 54:
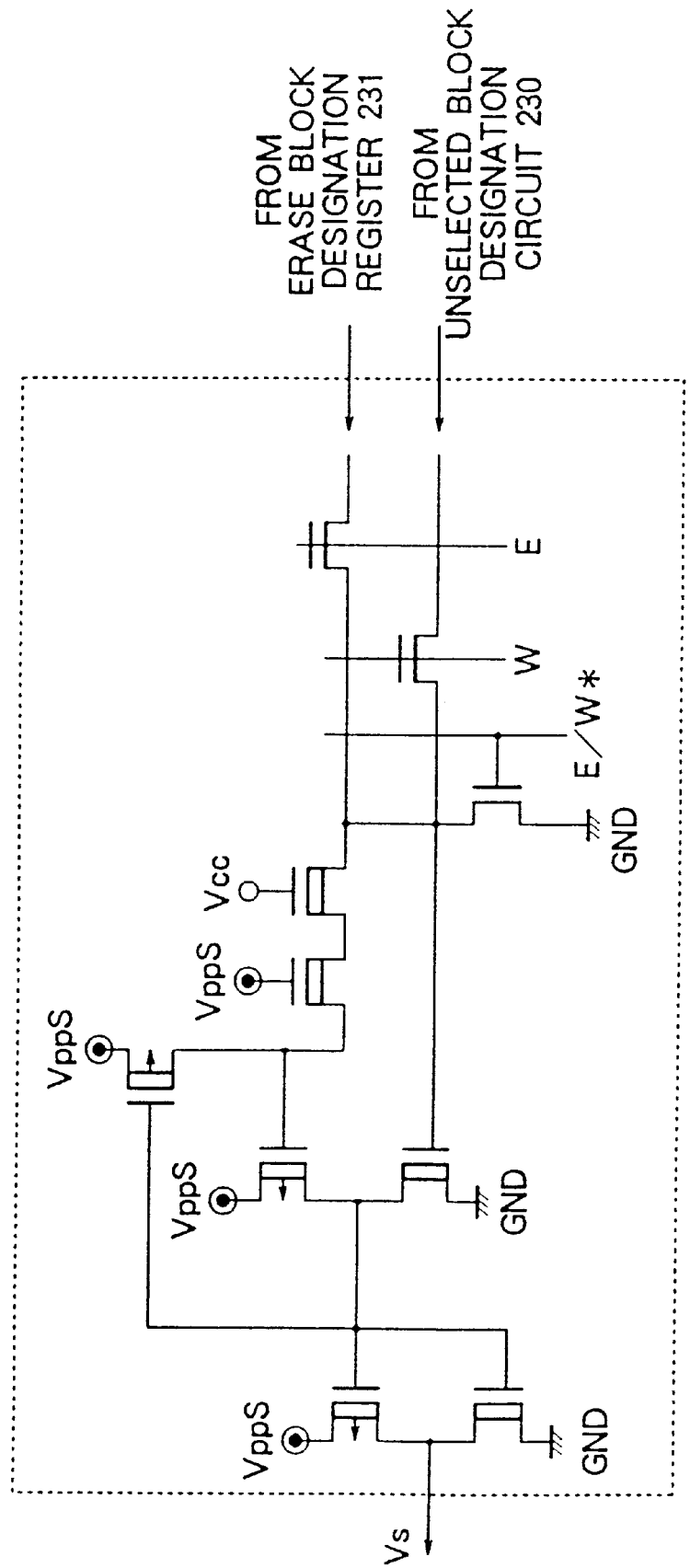
FIG. 54 is a diagram for explaining details of an example of an erase circuit included in the flash memory of FIG. 49.
Figure 55:
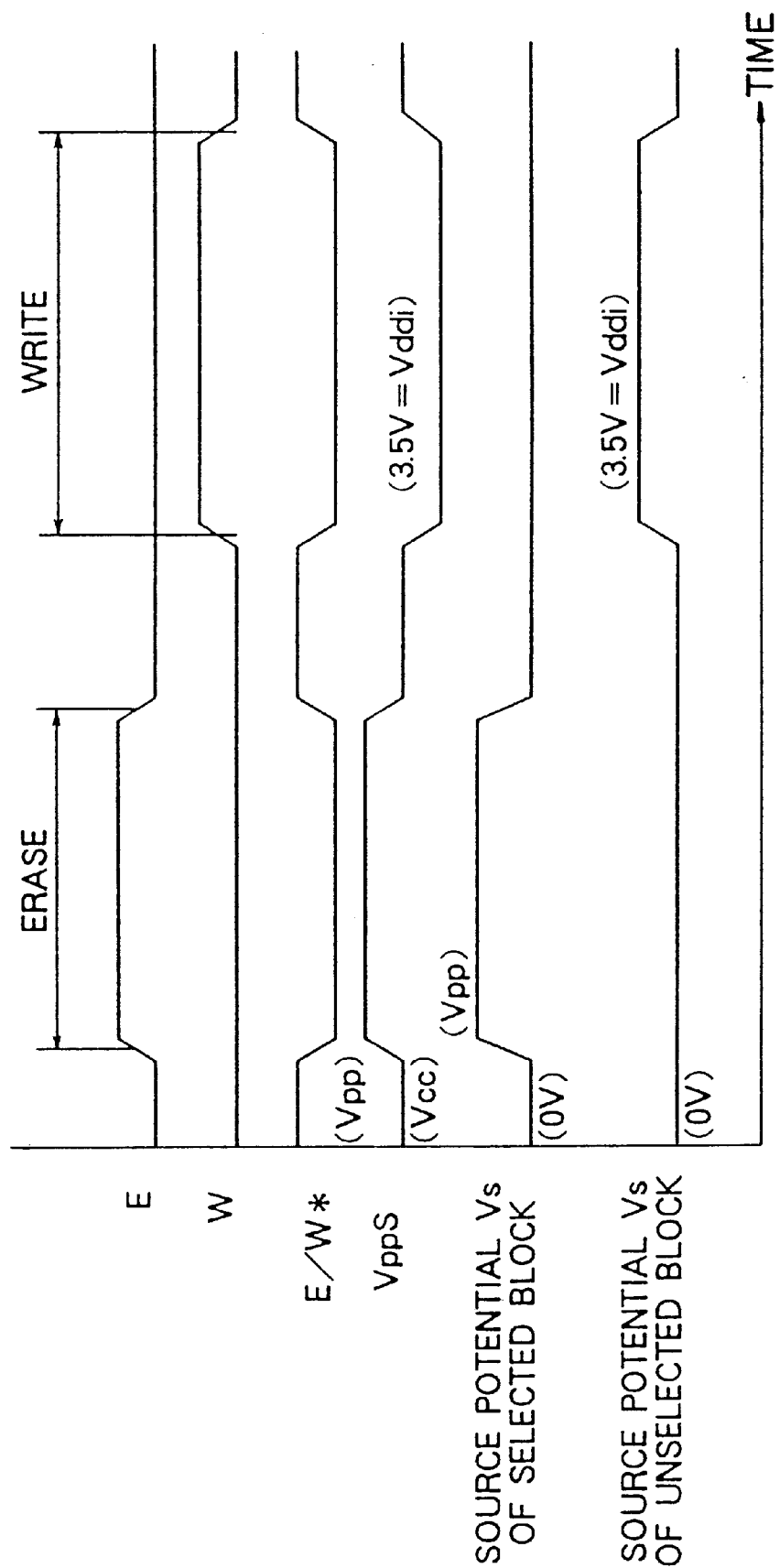
FIG. 55 is an operational timing chart of the erase circuit of FIG. 54.

FIG. 54 shows an example of the erase circuit and FIG. 55 shows its operational timing chart. Supplied to each of the erase circuits ERS1 to ERSn is operating voltage represented by the voltage VppS and power supply voltage Vdd. Signal E/W* shown in the figure is a signal which is maintained at 0 level upon write or erase. When a bit supplied from the erase block designation register to the erase circuit of FIG. 54 is "1" level (erase designating level), erase signal E from the control circuit 240 is also rendered to be "1" level and supply voltage Vs to a source line is set to the voltage VppS. Voltage Vpps upon erase is set to Vpp as described with reference to FIG. 52. Through this, in a selected block for simultaneous erasing, simultaneous erase of memory cells can be done. When a control signal supplied from the upon-write unselected block designation circuit to the erase circuit of FIG. 54 is "1" level (level for designating an unselected block) for writing, write signal W from the control circuit 240 is also rendered to be "1" level and supply voltage Vs to the source line is set to the voltage VppS. Voltage VppS upon write is maintained at data line disturbance prevention voltage Vddi such as 3.5V. Through this, data line disturbance can be prevented in the unselected block for writing.

Figure 56:
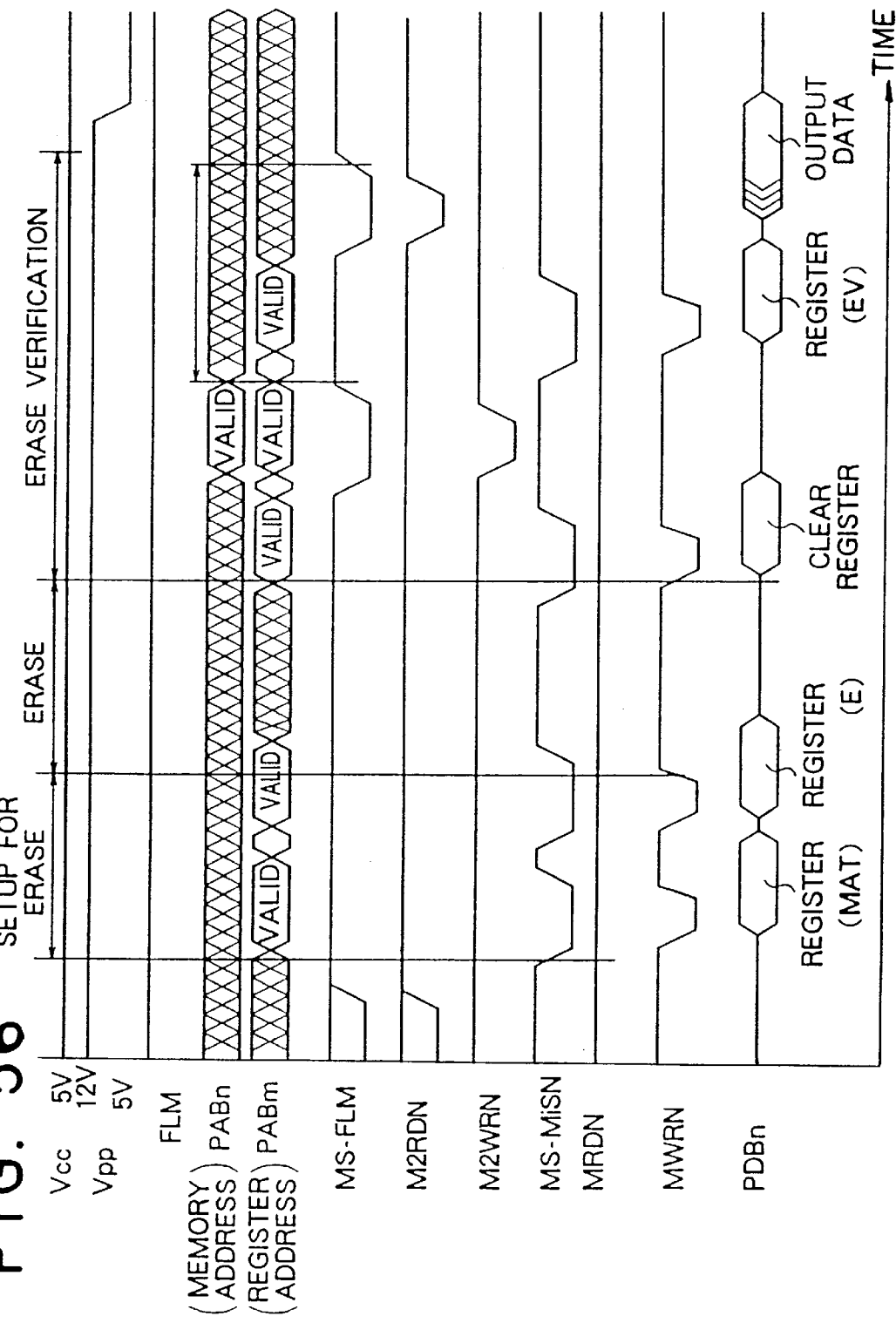
FIG. 56 is a timing chart of a series of operations related to erase in the flash memory shown in FIG. 49.
Figure 57:
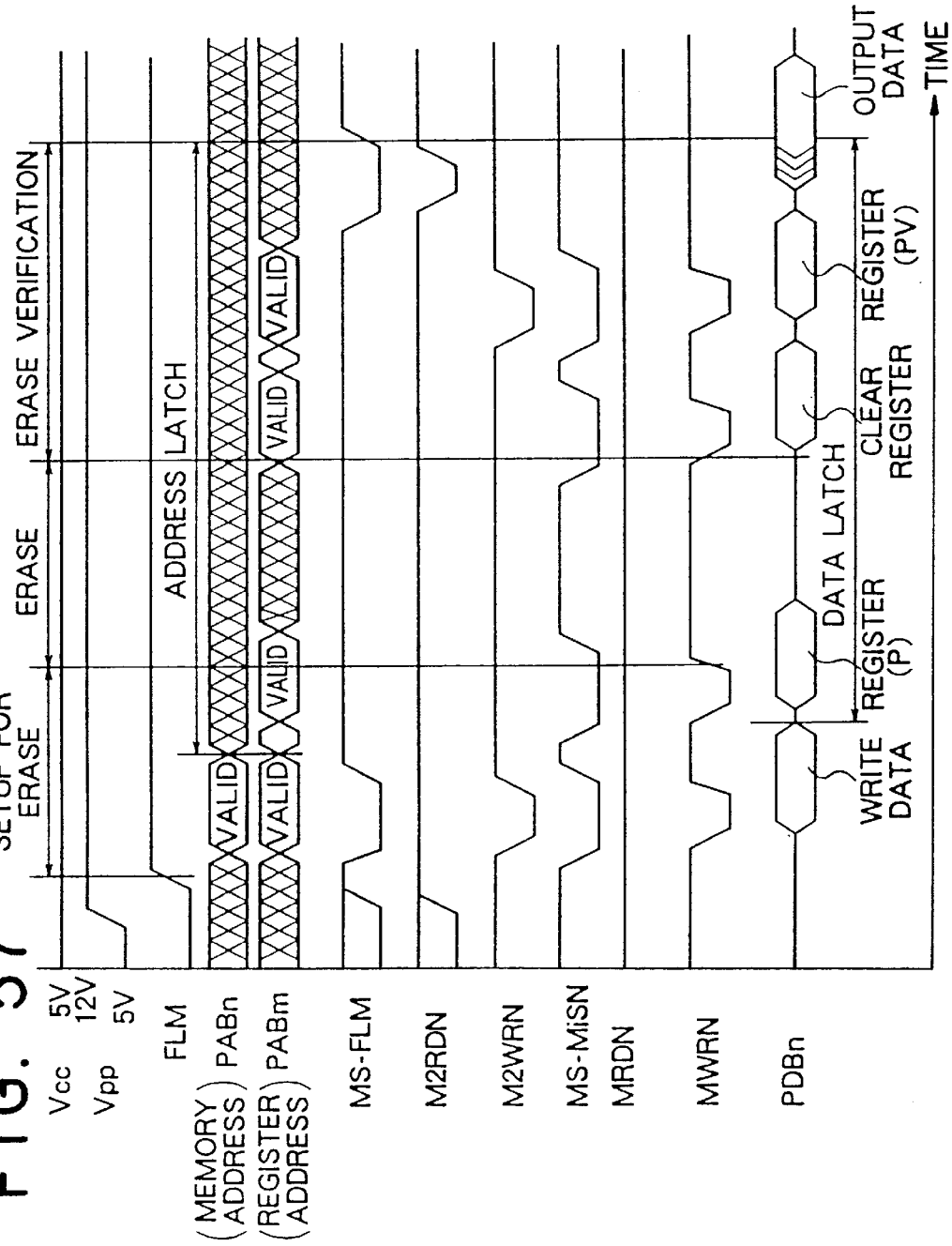
FIG. 57 is a timing chart of a series of operations related to write in the flash memory shown in FIG. 49.

FIG. 56 shows a timing chart of a series of operations related to erase in the flash memory shown in FIG. 49 and FIG. 57 shows a timing chart of a series of operations related to write in the flash memory shown in FIG. 49. Prior to giving a description of each timing chart, control signals shown in these figures will first be described. Part of the contents of the description given in connection with FIG. 16 will be repeated herein because this is considered to be necessary for facilitating understanding. Control signal FLM is a signal for designating the operation mode of the flash memory FMRY, whereby its "0" designates the first operation mode and its "1" designates the second operation mode. This signal FLM is formed on the basis of, for example, the mode signals MD0 to MD2. Control signal MS-MiSN is a selection signal of the flash memory FMRY, whereby its "0" designates selection and its "1" designates unselection. Control signal MS-MISN is a selection signal of internal registers such as the program/erase control register PEREG and erase block designation registers MBREG1 and MBREG2. Which one of the registers is to be selected is determined by an address signal PABm. Denoted by M2RDN is a memory read strobe signal, by M2WRN is a memory write strobe signal, by MRDN is a read signal of registers built in the flash memory and MWRN is a write signal of registers built in the flash memory. The memory write strobe signal M2WRN is deemed as a strobe signal for writing data to be written in a memory cell into the data input latch DILAT. Actual write to the memory cell is started by setting a P bit of the program/erase control register PEREG.

A series of operations related to erase are mainly sorted into a setup erase, an erase and an erase verify as shown in FIG. 56. The setup erase consists of an operation of writing data for designation of a memory block to be erased simultaneously into the erase block designation register and an operation of writing a bit (flag) of logic "1" into an E bit of the program/erase control register PEREG. The erase is an operation of erasing a memory block simultaneously and is started by setting "1" in the E bit. The specific processing procedure of an erase operation is the same as the contents explained in connection with FIG. 22. The erase verify is started by clearing the E bit so that verify may be carried out sequentially in a unit of byte, beginning with a head address, in accordance with the contents explained in connection with FIG. 22.

As shown in FIG. 57, a series of operations related to write are mainly sorted into a setup program, a program and a program verify. The setup program consists of an operation of writing data to be written into the data input latch circuit, an operation of storing a memory address to be written to the address buffer and address latch circuit and an operation of writing a bit (flag) of logic "1" to a P bit of the program/erase control register PEREG. The program is an operation of writing a memory cell designated by a latched address in accordance with data written in the data input latch circuit. A specific processing procedure of a write operation is the same as the contents explained in connection with FIG. 22. The program verify is started by clearing the P bit so that verify may be carried out sequentially in a unit of byte, beginning with a head address, in accordance with the contents explained in connection with FIG. 22.

Figure 58:
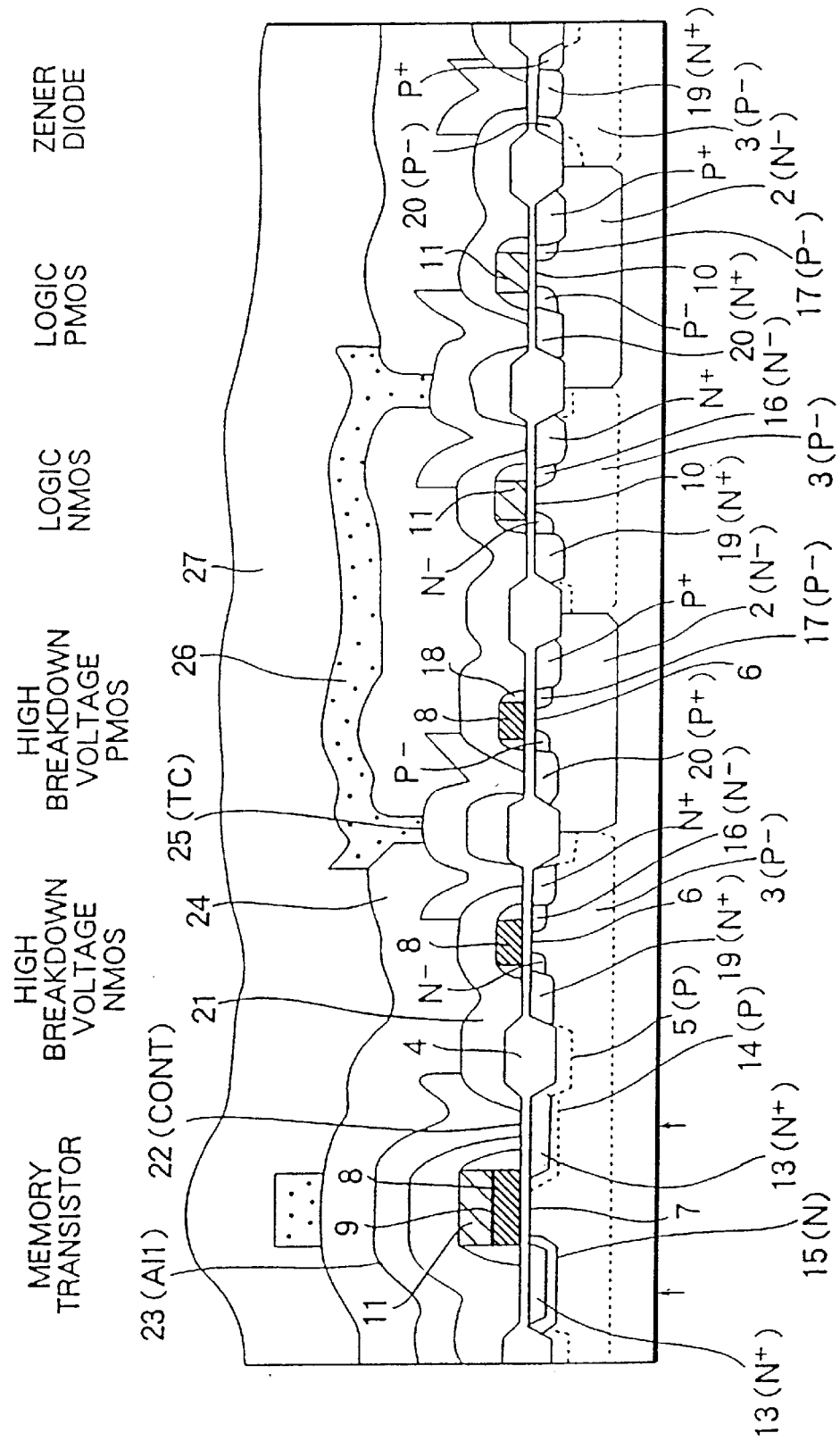
FIGS. 58A to 58I are longitudinal sectional views of a device at various stages of the production processes of various transistors for constituting the flash memory or the microcomputer incorporating the same.

Operation timings shown in FIGS. 57 and 58 are essentially the same for any of the first and second operation modes and techniques described in the foregoing items [3] and [4] can be adopted. When rewrite is conducted by means of the general purpose PROM writer, part of processings can be put under the charge of the CPU built in the microcomputer and other logics by utilizing a rewrite support control program precedently prepared in the mask ROM built in the microcomputer. The flash memory shown in FIG. 49 can obviously be applied to the microcomputer MCU explained in connection with FIGS. 1 to 4 or may be constructed as a unitary flash memory chip.

[21] A Method for Production of a Flash Memory

FIGS. 58A to 58I show longitudinal sectional views of a device in the production processes of various transistors for constituting the flash memory or the microcomputer incorporating the same. Illustrated in each figure are six kinds of transistors which are, as viewed from the left in turn in each figure, a memory cell transistor of the flash memory, high breakdown voltage NMOS and PMOS used for write and erase of the flash memory, logic system NMOS and PMOS for formation of a peripheral logic such as CPU and a Zener diode used for generation of a reference voltage upon write/erase read of the flash memory.

(A) Process shown in FIG. 58A (1) N type wells 2 and P type wells 3 are formed in a major surface of a P type semiconductor substrate 1 through known techniques.

(B) Process shown in FIG. 58B (1) P type channel stopper layers 5 are formed through substantially the same process as that of thick field insulating films 4 through known techniques.

(2) Then first gate insulating films 6 of the high breakdown voltage NMOS (N channel type MOS transistor) and PMOS (P channel type MOS transistor) are formed. The gate insulating film 6 is so formed as to have a thickness of 30 to 50 nm by a thermal oxidization method conducted at a temperature of 850 to 950° C.

(C) Process shown in FIG. 58C (1) The first gate insulating film 6 is removed at an area for formation of the flash memory by using a mask such as photoresist to expose the surface of the P type semiconductor substrate 1.

(2) Mask materials such as photoresist are removed.

(D) Process shown in FIG. 58D (1) Insulating films of about 10 nm are formed (not shown) by a thermal oxidization method conducted at a temperature of 800 to 850° C.

(2) Then the insulating films described in (1) are removed through wet etching. Through this, contaminants which are deposited on or which intrude into the exposed surface portion of P type semiconductor substrate 1 at the area for flash memory formation when removing the mask such as photoresist in (1) of the above (C) can be removed.

(3) A tunnel insulating film 7 of the flash memory is newly formed. The tunnel insulating film 7 is so formed as to have a thickness of 8 to 12 nm by a thermal oxidization method conducted at a temperature of 800 to 850° C. At that time, the first gate insulating films 6 go through processes of (1) to (3) of the aforementioned (D) to have a film thickness of 20 to 40 nm.

(4) Subsequently, first conductive layers 8 are formed which serve as a floating gate electrode of the flash memory and gate electrodes of the high breakdown voltage NMOS and PMOS. The first conductive layer 8 is formed by diffusing phosphorus, through thermal diffusion, in polycrystalline silicon deposited to a film thickness of about 200 nm at a temperature of about 640° to provide a sheet resistance $\rho s=60$ to $100\ \Omega/\square$. In order to reduce irregularity in erase of the flash memory, the grain size of polycrystalline silicon needs to be small and therefore the thermal diffusion is conducted at a temperature of 900° C. or less to provide a grain size of 0.1 $\mu$m or less.

(E) Process shown in FIG. 58E (1) An inter-layer insulating film 9 is formed between a floating gate electrode and a control gate electrode of the flash memory. The inter-layer insulating film 9 is a laminated film of a silicon oxide film and a silicon nitride film, the laminated film consisting of, as viewed from the first conductive layer 8 side, a two-layer film of silicon oxide film and silicon nitride film or a four-layer film of silicon oxide film, silicon nitride film, silicon oxide film and silicon nitride film. Here, the silicon oxide film overlying the first conductive layer 8 is formed to have a film thickness of 10 to 20 nm through thermal diffusion conducted at a temperature of 850 to 950°. The silicon nitride film overlying the silicon oxide film is formed to have a film thickness of 20 to 30 nm through CVD process. In the case of the four-layer film, the silicon oxide film on the silicon nitride film are formed to have a film thickness of 2 to 5 nm by a thermal oxidization method conducted at a temperature of 900 to 950°. The silicon nitride film overlying the silicon oxide film of 2 to 5 nm is formed to have a thickness of 10 to 15 nm through CVD process. Either of the two-layer film and four-layer film is so formed as to have a total thickness of 20 to 30 nm in terms of silicon oxide film.

(2) The inter-layer insulating films 9 at areas for formation of the logic system NMOS and PMOS as well as the Zener diode are removed using a mask such as photoresist.

(3) The mask such as photoresist is removed.

(4) The first gate insulating films 6 at areas for formation of the logic system NMOS and PMOS as well as the Zener diode are removed through wet etching using the uppermost silicon nitride film of the inter-layer insulating film 9 as a mask, thus exposing the surface of the P type semiconductor substrate 1.

(F) Process shown in FIG. 58F

(1) Contaminants deposited on or intruding into the exposed portion of surface are removed through similar techniques in (1) and (2) of the above (D). At that time, an insulating film of 10 to 20 nm is formed by a thermal oxidization method conducted at 800 to 850° C.

(2) Then, second gate insulating films 10 serving as gate insulating films of the logic system NMOS and PMOS are formed. The second gate insulating film 10 is formed to have a thickness of 10 to 20 nm in wet atmosphere by a thermal oxidization method conducted at 800 to 850° C.

(3) Subsequently, second conductive layers 11 are formed which serve as a control gate electrode of the flash memory and gate electrodes of the logic system NMOS and PMOS. The second conductive layer has a laminated structure of polycrystalline silicon film, high melting point metal silicide film and silicon oxide film which are laminated one after another in this order from the bottom. Used as the polycrystalline silicon film is a film having a sheet resistance $\rho s=60$ to 100 $\Omega/\square$ formed by diffusing, through thermal diffusion at 900° C. or less, phosphorous in polycrystalline silicon of a film thickness of 100 to 200 nm deposited at about 640° C. The high melting point metal silicide film is a WSix film (x=2.5 to 3.0) formed through CVD process or sputtering process to have a film thickness of 100 to 150 nm and a sheet resistance $\rho s=2$ to 15 $\Omega/\square$ after heat treatment. The silicon oxide film is formed through CVD process to have a thickness of 100 to 150 nm. This silicon oxide film is a protective film for the polycrystalline silicon film and high melting point metal silicide film serving as an actual control gate electrode or a gate electrode and protects high melting point metal from damage such as ion implantation or dry etching.

(4) The control gate electrode 11, inter-layer insulating film 9 and floating gate electrode 8 of the flash memory are formed in self-align fashion through dry etching using a mask such as photoresist.

(5) The tunnel insulating film 7 suffering from damage through dry etching in the above (4) is removed through wet etching using the first and second conductive layers 8 and 11 as a mask to expose the surface of P type semiconductor substrate 1 at regions for formation of source and drain of the flash memory.

(6) Then an insulating film 12 is formed over the entire surface. The insulating film 12 is a protective film which is a silicon oxide film formed to have a thickness of 10 to 20 nm through CVD process.

(7) An N type semiconductor region 13 and a P type semiconductor layer 14 are formed at source and drain regions of the flash memory by using the second conductive layer 11 as a mask. Here, the N type semiconductor region 13 is formed by injecting arsenic by about $1\times10^{15}$ cm$^{-2}$ at 50 to 80 keV accelerating energy through ion implantation process. The P type semiconductor layer 14 is formed by injecting boron by $1\times10^{13}$ to $1\times10^{14}$ cm$^{-2}$ at 20 to 60 kev accelerating energy through ion implantation process.

(G) Process shown in FIG. 58G

(1) Gate electrodes of the logic system NMOS and PMOS are formed through dry etching using a mask such as photoresist. During the etching, the flash memory region, which is covered with the mask, is not etched. The second conductive layers 11 at areas unnecessary for formation of the high breakdown voltage NMOS and PMOS and at the area for formation of the Zener diode are removed.

(2) After the mask such as photoresist is removed, the high melting point metal silicide of the second conductive layer 11 is rendered to have a low resistance (sheet resistance $\rho s=2$ to 15 $\Omega/\square$) through a heat treatment at about 900 to 950° C.

(3) Subsequently, an N type semiconductor region 15 is formed at the source region of the flash memory by using a mask such as photoresist. The N type semiconductor region is formed by injecting phosphorous by about $5\times10$ cm$^{-2}$ at 50 to 80 kev accelerating energy through ion implantation.

(4) Then, the N type semiconductor region 15 is thermally diffused through a heat treatment conducted at about 950° C. for about 30 minutes to 2 hours to cover the source region of the P type semiconductor layer 14. Thus, the drain region has a two-layer structure of the N type semiconductor region 13 and the P type semiconductor layer 14 for improving threshold control and write efficiency. The source region has a two-layer structure of the N type semiconductor region 13 based on arsenic and the N type semiconductor region 15 based on phosphorous for improving source breakdown voltage upon erase. When sector erase is used for erasing wherein a control gate electrode (word line) 11 of the flash memory is applied with a negative bias relative to the P type semiconductor substrate 1 and erase is effected over the entire channel region under the floating gate electrode 8, the formation of the N type semiconductor region 15 on the side of source is unneeded.

(5) An N type semiconductor region 16 is formed by injecting phosphorous by 2 to $4\times10^{13}$ cm$^{-2}$ at 50 kev accelerating energy through ion implantation process using a mask such as photoresist.

(6) A P type semiconductor region 17 is formed over the entire surface by injecting boron by 1 to $2\times10^{13}$ cm$^{-2}$ through ion implantation process. Boron is also injected into the NMOS region but this region has high concentration of phosphorous and therefore is allowed to substantially act as an N type semiconductor.

(H) Process shown in FIG. 58H

(1) After a silicon oxide film is formed over the entire surface through CVD process, a side wall 18 is formed through dry etching.

(2) Through ion implantation process using a mask such as photoresist, an N type semiconductor region is formed by injecting arsenic by 1 to $5\times10^{15}$ cm$^{-2}$ at 60 kev accelerating energy and a P type semiconductor region 20 is formed by injecting boron by 1 to $2\times10^{15}$ cm$^{-2}$ at 15 kev accelerating energy. A Zener diode is formed of the N type semiconductor region 19 and P type semiconductor region 20, having a Zener voltage of 3 to 4V.

(I) Process shown in FIG. 58I

(1) An insulating film 21 is formed. The insulating film 21 is formed of a silicon oxide film of about 150 nm film thickness and a BPSG film of 400 to 500 nm film thickness which are prepared through CVD process.

(2) After a contact hole 22 is formed, a first wiring layer 23 is formed. The first wiring layer 23 is formed of a laminated film of high melting point metal silicide and aluminum. The first wiring layer 23 is also used as a data line and a source line of the flash memory.

(3) An insulating film 24 is formed on the first wiring layer 23. The insulating film 24 is a laminated film of a silicon oxide film/spin-on-glass film prepared through plasma CVD process and a silicon oxide film prepared through plasma CVD process.

(4) After a through hole 25 is formed, a second wiring layer 26 is formed. The second wiring layer 26 has the same film structure as the first wiring layer 23. The second wiring layer 26 is used for shunting the second conductive layers 11 serving as word lines of the flash memory.

(5) A final passivation film 27 is formed to end in completion. The final passivation film 27 is a laminated film of a silicon oxide film prepared through CVD process or plasma CVD process and a silicon nitride film prepared through plasma CVD process.

[22] A Semiconductor Substrate/well Structure Meeting Sector Erase

Technical consideration to be paid to erasing the flash memory is voltage conditions as shown in FIG. 59. If, in the case of employment of sector erase (the control electrode is applied with a negative bias relative to the semiconductor substrate), a circuit for generation of the negative bias is complicated, the control gate electrode=GND and the substrate=positive bias are set up to thereby perform substantial negative bias erase. In this case, a portion of substrate at an area for formation of the flash memory needs to be separated. A semiconductor substrate/well structure for this purpose will be described with reference to FIGS. 60 to 62.

(A) Structure shown in FIG. 60

N type wells 2 and P type wells 3 are formed in a major surface of an N type semiconductor substrate 101 to accomplish separation. To this end, as shown in FIG. 67, the N type semiconductor substrate 101 is used in place of the P type semiconductor substrate 1.

Figure 62:
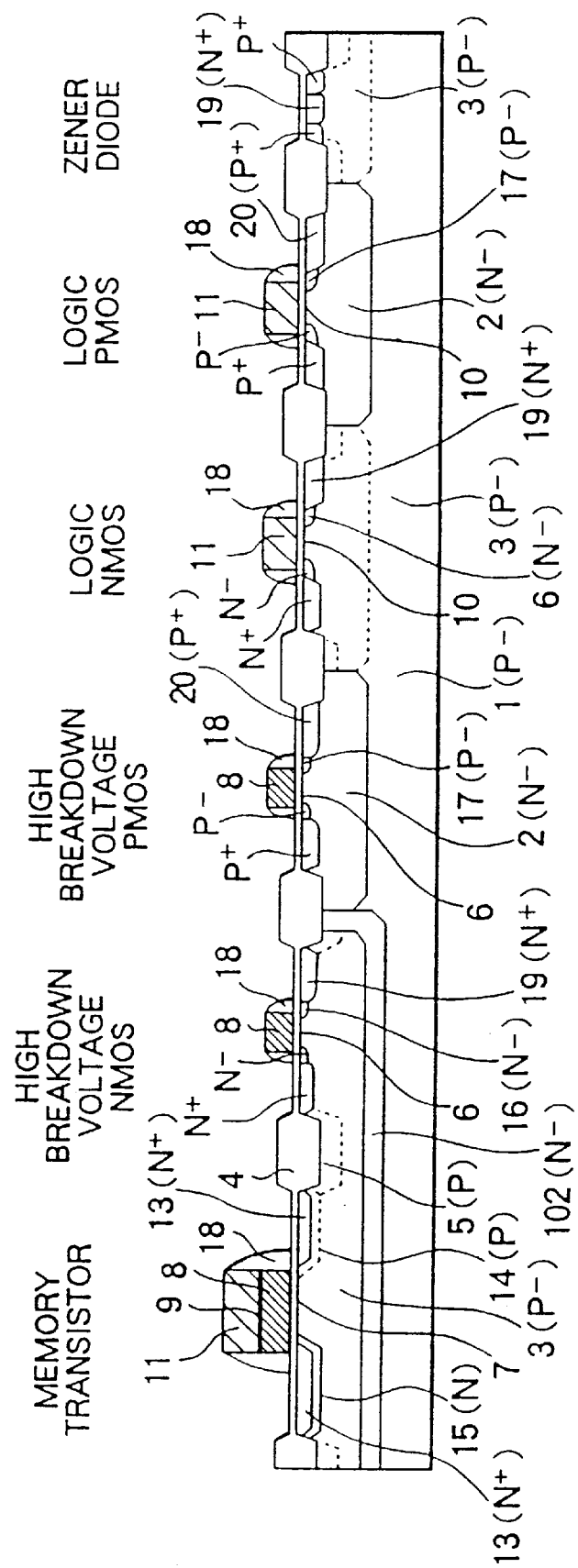
FIG. 62 is a longitudinal sectional view for explaining still another semiconductor substrate/well structure corresponding to sector erase.

(B) Structure shown in FIG. 62

A double well structure (P type well 3/N type well 2/P type semiconductor substrate 1) is used for separation. In this case, (1) An N type well 2 is formed in a major surface of the P type semiconductor substrate 1. At that time, an N type well 2 is also formed at an area for formation of the flash memory and besides, (2) The P type well 3 is made to be more shallow than the N type well 2.

(C) Structure shown in FIG. 62

A double well structure (P type well 3/N type well 102/P type semiconductor substrate 1) is used for separation. In this case, (1) A deep N type well 102 is formed in a major surface of a P type semiconductor substrate 1 at an area for formation of the flash memory, and (2) The production is subsequently carried out in the same manner as in the case of FIG. 60.

The following operation and effect can be brought about by the foregoing embodiments.

(1) When information is initially written in the flash memory FMRY built in the microcomputer MCU before the microcomputer MCU is mounted on a given system, the information can be written efficiently under the control of an external write device such as PROM writer PRW by designating the second operation mode. Also, by designating the first operation mode to the microcomputer MCU, information stored in the flash memory FMRY can be rewritten with the microcomputer MCU mounted on the system. At that time, the rewrite time can be reduced by the simultaneous erase function.

(2) By providing a plurality of memory blocks (LMB, SMB) having mutually different storage capacities, each as a simultaneously erasable unit, in the flash memory FMRY, programs, data tables and control data, for example, can be held in each memory block in accordance its storage capacity. More particularly, data of a relatively large amount of information can be written in a memory block having a relatively large storage capacity and data of a relatively small amount of information can be written in a memory block having a relatively small storage capacity. In other words, a memory block of a storage capacity meeting an amount of information to be stored can be utilized. Accordingly, such inconvenience in that a memory, although sufficing for a program, cannot be easily used as a data area because of an excessively large erase unit can be prevented. Further, even when a given memory block is erased simultaneously for rewrite of part of information held in the flash memory, such wastefulness that information is erased together with a group of information which need not substantially be rewritten and thereafter the information group is again written can be prevented as far as possible.

(3) Of the plurality of memory blocks, a memory block having a storage capacity which is set to be smaller than that of a built-in RAM can be provided so that the built-in RAM may be used as a working area or a data buffer area for rewrite of that memory block.

(4) When in the above (3) the flash memory is rewritten with the microcomputer mounted, information in the memory block to be rewritten is transferred to the built-in RAM, only partial information to be rewritten is received from the outside and rewritten on the RAM and then rewrite of the flash memory is carried out, thereby ensuring that information held internally in advance of rewrite and not required to be rewritten need not be transferred additionally from the outside and wastefulness of information transfer for partial rewrite of the memory block can be eliminated.

(5) In the flash memory, the simultaneous erase time is not so short even for a small memory block and consequently the flash memory per se cannot be rewritten on real time base in synchronism with a control operation by the microcomputer MCU. But by utilizing the built-in RAM as a working area or a data buffer area for rewrite of a memory block, the same data as that rewritten on real time base can eventually be obtained in the memory block.

(6) By incorporating in the flash memory FMRY a register MBREG in which information for designating a memory block to be erased simultaneously is held rewritably, a memory block to be erased simultaneously can be designated internally and externally of the microcomputer MCU (built-in central processing unit, external PROM writer) with ease in accordance with the same procedure.

(7) Thanks to the aforementioned operation and effect, ease of use of the flash memory FMRY built in the microcomputer MCU can be improved.

(8) As shown in FIG. 24, one bit of input/output data corresponds to one memory mat. By employing this one memory mat per one I/O structure, a common data line CD can be separated at each memory mat and need not extend over a long distance which passes through all of the memory mats, so that parasitic capacitance associated with the common data line can be reduced to contribute to speed-up of access and a low voltage operation.

(9) By defining memory blocks each in a unit of word line, the minimum memory block in the whole of memory array ARY has a storage capacity corresponding to that of one word line. This holds true regardless of the number of parallel input/output bits of the flash memory. Accordingly, by defining memory blocks each in a unit of word line, the storage capacity of the minimum memory block can be made to be small more easily and especially, in the case of a memory which is built in a microcomputer and in which input/output of data is effected in a unit of byte or word, the minimum size of memory block can be reduced drastically. Through this, ease of use of the flash memory built in the microcomputer can further be improved, thus contributing to improvement in efficiency of rewrite of small scale data in a unit of memory block.

(10) As shown in FIG. 26, when voltage Vddi such as 3.5V is applied to the source of a memory cell in an unselected block for writing to raise potential on the side of source, data line disturbance which decreases the threshold of a memory cell transistor can be prevented.

(11) For prevention of the data line disturbance, it is effective to minimize the data line disturbance time. In this case, the data line disturbance time affecting a small memory block owing to write concomitant with rewrite of a memory block of a large memory capacity is relatively longer as compared to the converse case. By taking advantage of this fact, with respect to the intervening transfer gate circuit TGC, memory blocks MBb on the side of the Y selection circuit YSEL are formed of large memory blocks having relatively large storage capacities and memory blocks MBa on the opposite side are formed of small memory blocks having relatively small storage capacities. Through this, the data line disturbance time affecting memory cells of a memory block MBb owing to write of a memory block MBa can be far more decreased in the case where the memory blocks MBa are small memory blocks and the memory blocks MBb are large memory blocks than in the case where the memory blocks MBa are otherwise large memory blocks and the memory blocks MBb are otherwise small memory blocks. In this manner, prevention of erroneous operations due to data line disturbance can further be perfected.

(12) By arranging dummy word lines DWA and DWB and dummy cells DC0 to DC6 at opposing ends of memory blocks which are separated by the transfer gate circuit TGC, irregularity in dimensions of word lines and control gates near the transfer gate circuit TGC can be reduced.

The invention achieved by the present inventors has been described specifically on the basis of embodiments but the present invention is not limited thereto and may obviously be changed in various ways without departing from the gist of the invention.

Figure 23:
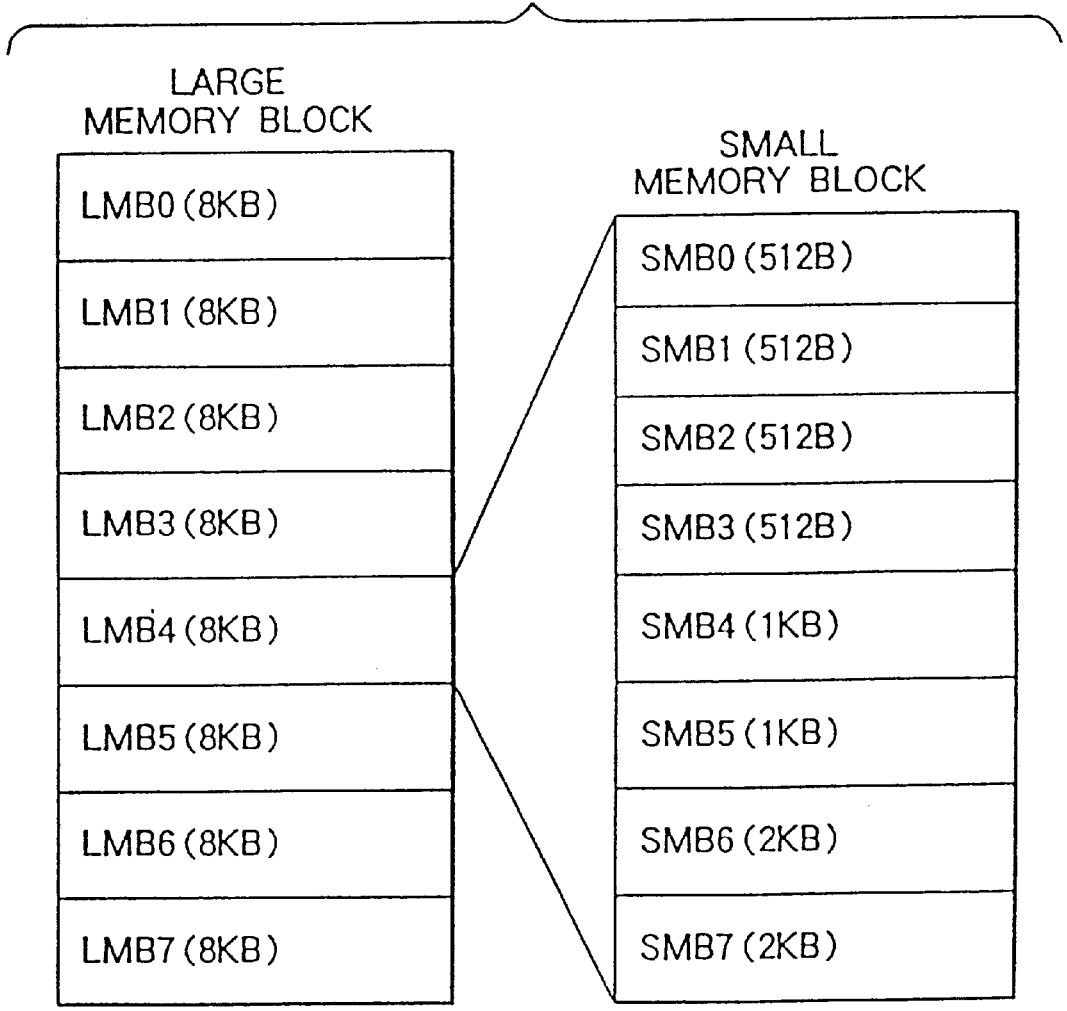
FIG. 23 is a diagram for explaining another example of division into memory blocks.

For example, the peripheral circuits incorporated in the microcomputer are not limited to those in the forgoing embodiments but may be changed suitably. Memory cell transistors of the flash memory are not limited to MOS transistors of stacked gate structure in the foregoing embodiments and memory cell transistors of FLOTOX type using a tunnel phenomenon also in a write operation can also be used. In the foregoing embodiments, controlling of both of erase and write of the flash memory is realized by way of software means as shown in FIGS. 22 and 23 but the invention is not limited thereto and for example, simultaneous erase requiring relatively much time may be controlled by dedicated hardware built in the flash memory. For example, the dedicated hardware includes control logic for controlling setting and clear of E bit and EV bit and for performing verify of the erase state. The incorporation of the control logic for simultaneous erase into the flash memory can, on the one hand, improve ease of use by the user in that software load concerning simultaneous erase can be mitigated but on the other hand increases the area of the control logic. As for the contents of items [1] to [7], in addition to a memory block in which the unit of simultaneous erase is effected in a unit of common source line, a memory block may be used in which the word line is used as a common line in erase. Which one of the memory blocks is to be selected can be determined by taking into consideration circumstances of what polarity of erase voltage is used or which one of the number of memory cells connected to a single word line and the number of memory cells connected to a single data line is smaller when the storage capacity of simultaneous erase unit is to be minimized. The size of memory block is not limited to the fixed size in the foregoing embodiments. For example, the size can be varied in accordance with setting of the control register or designation by the mode signal. For example, when simultaneous erase voltage is applied to a word line defined as a minimum unit, the operation of the driver for driving the word line with the erase voltage can be selected in accordance with the setting of the control register or the designation by the mode signal. Further, as for the division of memory blocks, the whole may be divided into a plurality of large blocks LMB0 to LMB7 and each large block may be divided into a plurality of small blocks SMB0 to SMB7 as shown in FIG. 24, whereby simultaneous erase can be done in a unit of large block or in a unit of small block. In a memory cell transistor of the flash memory, its source and drain are relatively defined in accordance with voltages applied thereto.

The present invention can be applied widely to a flash memory in which write can be done by effecting simultaneous erase in a unit of at least memory block and to a microcomputer conditioned by comprising, on a single semiconductor chip, a central processing unit and a flash memory which is electrically rewritable.

We claim:

1. A semiconductor integrated circuit device on a semiconductor substrate, comprising:

a processing unit;

an address bus coupled to said processing unit;

a data bus coupled to said processing unit;

an electrically erasable and programmable nonvolatile memory coupled to said address bus and to said data bus, the nonvolatile memory including memory blocks each operating as a simultaneously erasable unit of data stored therein, each memory block including memory cells each having a floating gate; and a control register having bits to provide for information designating a memory block to be erased;

wherein said processing unit provides an address for selecting the control register and information to be set to the bits to said address bus and to said data bus, respectively, so that data stored in said memory block, which is designated by the information in the bits, is erased in an erasing operation.

2. A semiconductor integrated circuit device according to claim 1, wherein each memory cell comprises:

a first region and a second region which are formed in said semiconductor substrate and are apart from each other, a gate insulating film on a region of said semiconductor substrate between said first region and said second region, said floating gate over said gate insulating film, and a control gate over said floating gate.

3. A semiconductor integrated circuit device according to claim 2,
wherein the nonvolatile memory further includes:
word lines coupled to said memory cells so that said control gate of one memory cell is electrically coupled to one word line,
data lines coupled to said memory cells so that said first region of one memory cell is electrically coupled to one data line, and
source lines coupled to said memory cells so that said second region of one memory cell is electrically coupled to one source line.

4. A semiconductor integrated circuit device according to claim 1, further comprising:
an erase circuit providing an erase voltage for the erasing operation,
wherein said erase circuit provides the erase voltage to the memory block which is designated by the information in the bits.

5. A semiconductor integrated circuit device on semiconductor substrate, comprising:
a memory array including memory blocks each comprising nonvolatile memory cells, each memory block being a simultaneously erasable unit of data stored in the memory cells within that memory block;
an erase circuit which provides an erase voltage for an erase operation;
a first register having a bit for information indicating a memory block to be selected for the erase operation;
a processing unit;
an address bus coupled to said processing unit; and
a data bus coupled to said processing unit,
wherein said processing unit provides on said address bus an address signal for selecting the register and provides on said data bus information to be set to the bit, and
wherein said erase circuit provides said erase voltage to the memory block selected for the erase operation by the bit.

6. A semiconductor integrated circuit device according to claim 5,
wherein each memory cell comprises:
a first region and a second region which are formed in said semiconductor substrate and are apart from each other,
a gate insulating film on a region of said semiconductor substrate between said first region and said second region,
a floating gate over said gate insulating film, and
a control gate over said floating gate.

7. A semiconductor integrated circuit device according to claim 6,
wherein each memory block further includes:
a word line coupled to the control gate of each memory cell,
data lines coupled to the first regions of the memory cells so that said first region of one memory cell is coupled to one data line, and
a source line coupled to said second region of each memory cell.

8. A semiconductor integrated circuit device according to claim 7,
wherein said erase circuit provides said erase voltage to said source line in the erase operation.

9. A semiconductor integrated circuit device according to claim 6,
wherein each memory block further includes:
word lines coupled to the control gates of the memory cells so that the control gate of one memory cell is coupled to one word line,
a data line coupled to said first region of each memory cell, and
a source line coupled to said second region of each memory cell.

10. A semiconductor integrated circuit device according to claim 9,
wherein said erase circuit provides said erase voltage to said source line in the erase operation.

11. A semiconductor integrated circuit device according to claim 5, further comprising:
a control circuit coupled to said address bus, to said data bus, to said erase circuit and to said memory array and including said first register.

12. A semiconductor integrated circuit device according to claim 11,
wherein said control circuit further includes a second register having a control bit having a state indicating the erase operation, and
wherein said processing unit provides on said address bus an address signal for selecting said second register and provides on said data bus data to be set into said control bit.

13. A semiconductor integrated circuit device according to claim 5,
wherein said first register further includes a control bit having a state indicating the erase operation,
wherein said processing unit provides on said address bus an address signal for selecting said register and provides on said data bus data to be set into said control bit.

14. A semiconductor integrated circuit device according to claim 13,
wherein said processing unit sets the control bit after the bit in said first register has been set.

* * * * *